US012581796B2

(12) United States Patent
Seo et al.

(10) Patent No.: US 12,581,796 B2
(45) Date of Patent: Mar. 17, 2026

(54) LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Satoshi Seo, Kanagawa (JP); Tsunenori Suzuki, Kanagawa (JP); Nobuharu Ohsawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 547 days.

(21) Appl. No.: 17/559,054

(22) Filed: Dec. 22, 2021

(65) Prior Publication Data

US 2022/0209162 A1 Jun. 30, 2022

(30) Foreign Application Priority Data

Dec. 29, 2020 (JP) ................................ 2020-219886
Nov. 19, 2021 (JP) ................................ 2021-188595

(51) Int. Cl.
*H10K 50/17* (2023.01)
*H10K 50/13* (2023.01)
(Continued)

(52) U.S. Cl.
CPC ......... *H10K 50/171* (2023.02); *H10K 50/131* (2023.02); *H10K 50/16* (2023.02);
(Continued)

(58) Field of Classification Search
CPC .... H10K 50/171; H10K 50/131; H10K 50/16; H10K 50/17; H10K 59/80521; H10K 59/12; H10K 2102/341; H10K 50/13
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 108539028 A 9/2018
CN 110828683 A 2/2020
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Syed I Gheyas
(74) *Attorney, Agent, or Firm* — Fish & Richardson P.C.

(57) ABSTRACT

A novel light-emitting device that is highly convenient, useful, or reliable is provided. The light-emitting device includes a second electrode over a first electrode with an EL layer therebetween. The EL layer includes at least a light-emitting layer, an electron-transport layer, and an electron-injection layer. The electron-transport layer is positioned over the light-emitting layer. An insulating layer is in contact with side surfaces of the light-emitting layer and the electron-transport layer. The electron-injection layer is positioned over the electron-transport layer. The electron-injection layer is in contact with the electron-transport layer and the insulating layer.

24 Claims, 44 Drawing Sheets

(51) Int. Cl.
*H10K 50/16* (2023.01)
*H10K 59/80* (2023.01)
*H10K 59/12* (2023.01)

(52) U.S. Cl.
CPC ....... *H10K 50/17* (2023.02); *H10K 59/80521* (2023.02); *H10K 59/12* (2023.02)

(56) References Cited

U.S. PATENT DOCUMENTS

| | | | | |
|---|---|---|---|---|
| 8,877,532 | B2 | 11/2014 | Hiroki. et al. | |
| 8,975,811 | B2 | 3/2015 | Yoon | |
| 8,993,127 | B2 | 3/2015 | Osaka et al. | |
| 9,564,597 | B2 | 2/2017 | Osaka et al. | |
| 9,755,162 | B2 | 9/2017 | Jiao | |
| 10,153,449 | B2 | 12/2018 | Seo et al. | |
| 11,404,656 | B2 | 8/2022 | Ohsawa et al. | |
| 11,678,550 | B2 | 6/2023 | Kato | |
| 11,889,739 | B2 | 1/2024 | Wei et al. | |
| 12,096,671 | B2 | 9/2024 | Kato | |
| 2002/0072139 | A1 | 6/2002 | Kashiwabara | |
| 2007/0123133 | A1* | 5/2007 | Winters | H10K 71/70 445/24 |
| 2007/0129545 | A1* | 6/2007 | Inoue | H05B 33/14 428/917 |
| 2011/0108817 | A1 | 5/2011 | Nishi. et al. | |
| 2011/0148290 | A1 | 6/2011 | Oota | |
| 2012/0252149 | A1 | 10/2012 | Hiroki et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0057143 | A1 | 3/2013 | Sugimoto et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0254474 | A1* | 9/2016 | Zou | H10K 50/115 257/40 |
| 2016/0315133 | A1 | 10/2016 | Sato | |
| 2016/0351833 | A1 | 12/2016 | Hosoumi et al. | |
| 2017/0141167 | A1 | 5/2017 | Naganuma | |
| 2017/0256754 | A1 | 9/2017 | Defranco et al. | |
| 2017/0317316 | A1* | 11/2017 | Yang | H10K 85/636 |
| 2018/0190908 | A1 | 7/2018 | Ke et al. | |
| 2019/0115553 | A1 | 4/2019 | Seo et al. | |
| 2020/0203662 | A1 | 6/2020 | Mollard et al. | |
| 2020/0321541 | A1 | 10/2020 | Hosoumi et al. | |
| 2021/0408217 | A1* | 12/2021 | Miao | H10K 50/171 |
| 2022/0407027 | A1 | 12/2022 | Ohsawa et al. | |
| 2025/0008802 | A1 | 1/2025 | Kato. | |

FOREIGN PATENT DOCUMENTS

| | | | |
|---|---|---|---|
| EP | 2428512 | A | 3/2012 |
| EP | 3001473 | A | 3/2016 |
| JP | 2000-036385 | A | 2/2000 |
| JP | 2003-059663 | A | 2/2003 |
| JP | 2003-100457 | A | 4/2003 |
| JP | 2004-171951 | A | 6/2004 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2012-216501 | A | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-082239 | A | 5/2016 |
| JP | 2016-518729 | | 6/2016 |
| JP | 2016-197494 | A | 11/2016 |
| JP | 2016-225619 | A | 12/2016 |
| JP | 2018-181916 | A | 11/2018 |
| JP | 2019-179696 | A | 10/2019 |
| JP | 2020-043181 | A | 3/2020 |
| JP | 2020-160305 | A | 10/2020 |
| KR | 2014-0139864 | A | 12/2014 |
| TW | 201627298 | | 8/2016 |
| WO | WO-2012/011471 | | 1/2012 |
| WO | WO-2019/123190 | | 6/2019 |
| WO | WO-2020/004086 | | 1/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Taiwanese Office Action (Application No. 110148713) Dated Sep. 10, 2025.

* cited by examiner

LIGHT-EMITTING DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to a light-emitting device, a light-emitting apparatus, an electronic device, and a lighting device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

A method for manufacturing an organic EL display in which a light-emitting layer can be formed without using a fine metal mask is known. An example is a method for manufacturing an organic EL display (Patent Document 1) having a step of forming a first light-emitting layer as a continuous film across a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film across a display region by deposition of a second luminescent organic material that contains a mixture of a host material and a dopant material but differs from the first luminescent organic material, over the first light-emitting layer; and a step of forming a counter electrode over the second light-emitting layer.

REFERENCE

[Patent Document 1] Japanese Published Patent Application No. 2012-160473

SUMMARY OF THE INVENTION

An object of one embodiment of the present invention is to provide a novel light-emitting device that is highly convenient, useful, or reliable. Another object of one embodiment of the present invention is to provide a novel light-emitting apparatus that is highly convenient, useful, or reliable. Another object of one embodiment of the present invention is to provide a novel electronic device that is highly convenient, useful, or reliable. Another object of one embodiment of the present invention is to provide a novel lighting device that is highly convenient, useful, or reliable.

Note that the description of these objects does not preclude the existence of other objects. In one embodiment of the present invention, there is no need to achieve all these objects. Other objects will be apparent from and can be derived from the description of the specification, the drawings, the claims, and the like.

One embodiment of the present invention is a light-emitting device including a second electrode over a first electrode with an EL layer therebetween. The EL layer includes at least a light-emitting layer, an electron-transport layer, and an electron-injection layer. The electron-transport layer is over the light-emitting layer. An insulating layer is in contact with side surfaces of the light-emitting layer and the electron-transport layer. The electron-injection layer is over the electron-transport layer. The electron-injection layer is in contact with the electron-transport layer and the insulating layer.

Another embodiment of the present invention is a light-emitting device including a second electrode over a first electrode with an EL layer therebetween. The EL layer includes at least a hole-injection layer, a light-emitting layer, an electron-transport layer, and an electron-injection layer. The hole-injection layer is over the first electrode. The light-emitting layer is over the hole-injection layer. The electron-transport layer is over the light-emitting layer. An insulating layer is in contact with side surfaces of the hole-injection layer, the light-emitting layer, and the electron-transport layer. The electron-injection layer is over the electron-transport layer. The electron-injection layer is in contact with the electron-transport layer and the insulating layer.

In the light-emitting device having one of the above structures, the electron-injection layer may contain a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

Another embodiment of the present invention is a light-emitting apparatus including the light-emitting device having any of the above structures, and at least one of a transistor and a substrate.

Another embodiment of the present invention is a light-emitting apparatus including a first light-emitting device and a second light-emitting device adjacent to each other. The first light-emitting device includes a second electrode over a first electrode with a first EL layer therebetween. The first EL layer includes at least a first light-emitting layer, a first electron-transport layer, and an electron-injection layer. The first electron-transport layer is over the first light-emitting layer. A first insulating layer is in contact with side surfaces of the first light-emitting layer and the first electron-transport layer. The electron-injection layer is over the first electron-transport layer. The second light-emitting device includes the second electrode over a third electrode with a second EL layer therebetween. The second EL layer includes at least a second light-emitting layer, a second electron-transport layer, and the electron-injection layer. The second electron-transport layer is over the second light-emitting layer. A second insulating layer is in contact with side surfaces of the second light-emitting layer and the second electron-transport layer. The electron-injection layer is over the first electron-transport layer and the second electron-transport layer. The electron-injection layer is in contact with the first electron-transport layer, the second electron-transport layer, the first insulating layer, and the second insulating layer.

Another embodiment of the present invention is a light-emitting apparatus including a first light-emitting device and a second light-emitting device adjacent to each other. The first light-emitting device includes a second electrode over a first electrode with a first EL layer therebetween. The first EL layer includes at least a first hole-injection layer, a first light-emitting layer, a first electron-transport layer, and an electron-injection layer. The first hole-injection layer is over the first electrode. The first light-emitting layer is over the first hole-injection layer. The first electron-transport layer is over the first light-emitting layer. A first insulating layer is in contact with side surfaces of the first hole-injection layer, the first light-emitting layer, and the first electron-transport layer. The electron-injection layer is over the first electron-transport layer. The second light-emitting device includes the second electrode over a third electrode with a second EL layer therebetween. The second EL layer includes at least a second hole-injection layer, a second light-emitting layer, a second electron-transport layer, and the electron-injection layer. The second hole-injection layer is over the third electrode. The second light-emitting layer is over the second hole-injection layer. The second electron-transport layer is over the second light-emitting layer. A second insulating layer is in contact with side surfaces of the second hole-injection layer, the second light-emitting layer, and the second electron-transport layer. The electron-injection layer is over the first electron-transport layer and the second electron-transport layer. The electron-injection layer is in contact with the first electron-transport layer, the second electron-transport layer, the first insulating layer, and the second insulating layer.

In the light-emitting apparatus having one of the above structures, the second electrode may be positioned on the side surfaces of the first light-emitting layer and the second light-emitting layer with the electron-injection layer therebetween.

In the light-emitting apparatus having any of the above structures, the second electrode may be positioned on the side surfaces of the first electron-transport layer, the second electron-transport layer, the first light-emitting layer, and the second light-emitting layer with the electron-injection layer therebetween.

In the light-emitting apparatus having any of the above structures, the electron-injection layer may contain a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

One embodiment of the present invention is an electronic device including the light-emitting apparatus having any of the above structures and at least one of a sensor, an operation button, a speaker, and a microphone.

One embodiment of the present invention is a lighting device including the light-emitting apparatus having any of the above structures and a housing.

Although the block diagram in drawings attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; actually, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

In this specification, one of a first electrode and a second electrode of a transistor refers to a source electrode and the other refers to a drain electrode.

With one embodiment of the present invention, a novel light-emitting device that is highly convenient, useful, or reliable can be provided. With one embodiment of the present invention, a novel light-emitting apparatus that is highly convenient, useful, or reliable can be provided. With one embodiment of the present invention, a novel electronic device that is highly convenient, useful, or reliable can be provided. With one embodiment of the present invention, a novel lighting device that is highly convenient, useful, or reliable can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
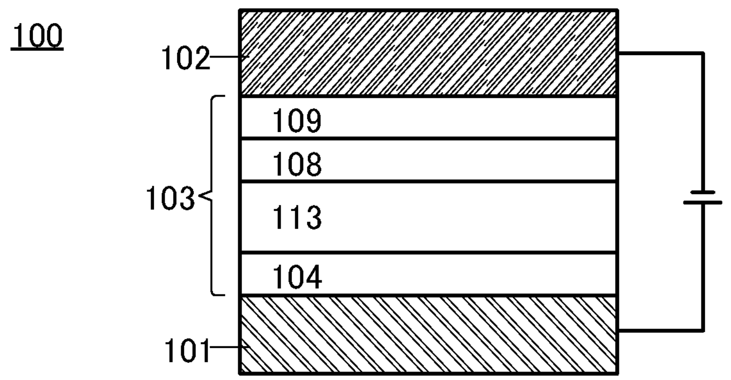
FIGS. 1A to 1C each illustrate a structure of a light-emitting device of an embodiment.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, structures of a light-emitting device and a display panel of one embodiment of the present invention will be described with reference to FIGS. 1A to 1C and FIGS. 2A to 2E.

Figure 1B:
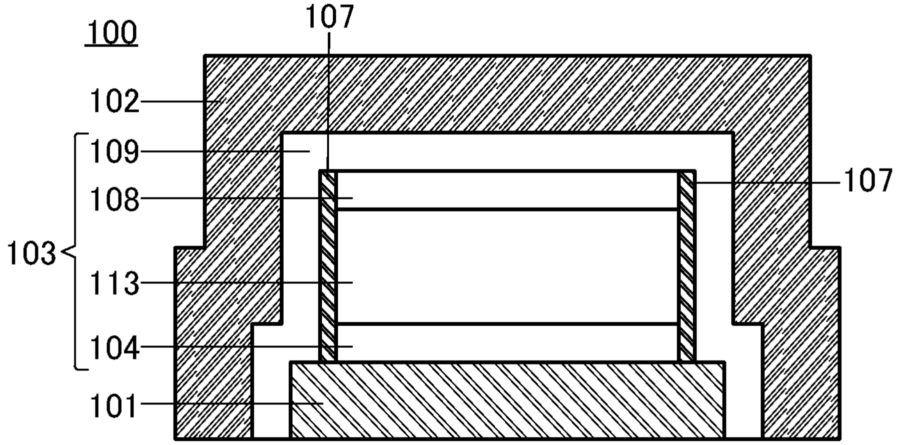
Figure 1C:
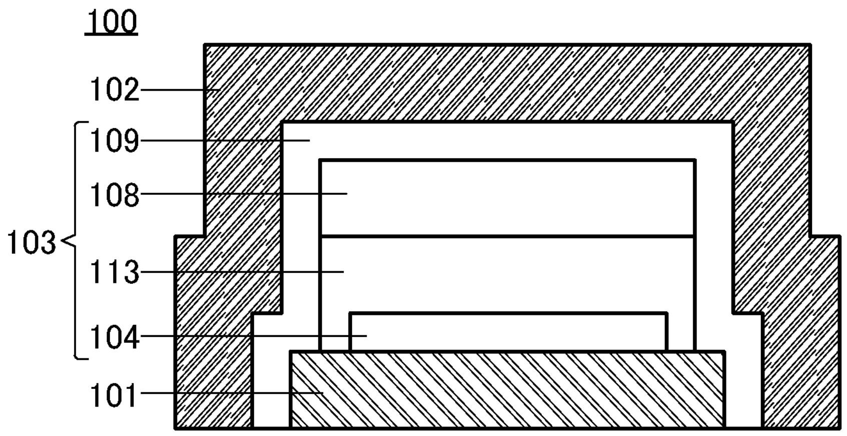

FIGS. 1A to 1C are cross-sectional views of a light-emitting device 100 of one embodiment of the present invention.

As illustrated in FIGS. TA to 1C, the light-emitting device 100 includes a first electrode 101, a second electrode 102, and an EL layer 103. The first electrode 101 includes a region overlapped by the second electrode 102, and the EL layer 103 includes a region sandwiched between the first electrode 101 and the second electrode 102. The EL layer 103 has a structure in which a hole-injection/transport layer 104, a light-emitting layer 113, an electron-transport layer 108, and an electron-injection layer 109 are stacked in this order, over the first electrode 101.

The electron-injection layer 109 is a layer for increasing the efficiency of electron injection from the second electrode 102 and is preferably formed using a material whose value of the LUMO level has a small difference (0.5 eV or less) from the work function of a material used for the second electrode 102. Thus, the electron-injection layer 109 can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide ($LiO_x$), or cesium carbonate. A rare earth metal compound like erbium fluoride ($ErF_3$) can also be used. Electride may be used for the electron-injection layer 109. Examples of the electride include a substance in which electrons are added at high concentration to calcium oxide-aluminum oxide.

A composite material in which an organic compound and an electron donor (donor) are mixed may be used for the electron-injection layer 109. Such a composite material is excellent in an electron-injection property and an electron-transport property because electrons are generated in the organic compound by the electron donor. The organic compound here is preferably a material excellent in transporting the generated electrons; specifically, for example, electron-transport materials used for an electron-transport layer described later (e.g., a metal complex and a heteroaromatic compound) can be used. As the electron donor, a substance showing an electron-donating property with respect to the organic compound is used. Specifically, an alkali metal, an alkaline earth metal, and a rare earth metal are preferable, and examples include lithium, cesium, magnesium, calcium, erbium, and ytterbium. In addition, an alkali metal oxide and an alkaline earth metal oxide are preferable, and examples include lithium oxide, calcium oxide, and barium oxide. Alternatively, a Lewis base such as magnesium oxide can be used. Further alternatively, an organic compound such as tetrathiafulvalene (abbreviation: TTF) can be used.

Alternatively, the electron-injection layer 109 may be formed using a composite material in which an organic compound and a metal are mixed. The organic compound used here preferably has a lowest unoccupied molecular orbital (LUMO) level higher than or equal to −3.6 eV and lower than or equal to −2.3 eV. Moreover, a material having an unshared electron pair is preferable.

Therefore, the above organic compound is preferably a material having an unshared electron pair, such as a heterocyclic compound having a pyridine skeleton, a diazine skeleton (e.g., a pyrimidine skeleton or a pyrazine skeleton), or a triazine skeleton. A heterocyclic compound having a pyridine skeleton, a heterocyclic compound having a diazine skeleton, and a heterocyclic compound having a triazine skeleton will be described in detail later in this embodiment.

As a metal used for the composite material in which an organic compound and a metal are mixed, a transition metal that belongs to Group 5, Group 7, Group 9, or Group 11 or a material that belongs to Group 13 in the periodic table is preferably used, and examples include Ag, Cu, Al, and In. Here, the organic compound forms a singly occupied molecular orbital (SOMO) with the metal.

The electron-injection layer 109 may have a stacked-layer structure. The stacked-layer structure may consist of a plurality of layers whose materials are partly different from each other or a plurality of layers formed using different materials.

Materials that can be used for the electron-injection layer 109 will be described in detail later in this embodiment.

Materials that can be used for the first electrode 101, the second electrode 102, the hole-injection/transport layer 104, the light-emitting layer 113, and the electron-transport layer 108 will be described in detail later in this embodiment. The electron-transport layer 108 may have a stacked-layer structure and may include a hole-blocking layer for blocking holes that move from the first electrode 101 side to the second electrode 102 side through the light-emitting layer 113. As a material of the hole-injection/transport layer 104, materials for a hole-injection layer and a hole-transport layer that will be described later in this embodiment can be used. Note that the hole-injection/transport layer 104 may be formed using a single layer or a plurality of layers. Alternatively, a hole-injection layer and a hole-transport layer may be formed separately. Further alternatively, only one of a hole-injection layer and a hole-transport layer may be provided instead of the hole-injection/transport layer 104.

The electron-injection layer 109, which is part of the EL layer 103, may have a different shape from the other layers (the hole-injection/transport layer 104, the light-emitting layer 113, and the electron-transport layer 108) in the EL layer 103. In general, to make some layer in the EL layer have a different shape from the other layers, the other layers might be exposed to the air or the like in the manufacturing process, which might decrease the reliability and luminance of a light-emitting device. However, when the shape of the electron-injection layer 109 is made different from those of the other layers, there occurs a possibility of exposure to the air or the like in the manufacturing process only after the electron-transport layer 108 is formed on the top surface of the light-emitting layer 113; thus, the hole-injection/transport layer 104 and the light-emitting layer 113 can be prevented from being exposed to the air or the like, and a decrease in the reliability and luminance of the light-emitting device 100 can be suppressed. Accordingly, in the light-emitting device 100, the electron-injection layer 109 can have a different shape from the other layers (the hole-injection/transport layer 104, the light-emitting layer 113, and the electron-transport layer 108) in the EL layer 103.

In the case where the electron-transport layer 108 includes a plurality of layers, a decrease in the reliability and luminance of the light-emitting device 100 can sometimes be suppressed even if there occurs a possibility of exposure to the air or the like after formation of some layer(s) in the electron-transport layer 108 and before formation of the other layer(s) in the electron-transport layer 108.

FIGS. 1B and 1C illustrate examples of the light-emitting device 100 in which the electron-injection layer 109 has a different shape from the other layers (the hole-injection/transport layer 104, the light-emitting layer 113, and the electron-transport layer 108) in the EL layer 103.

As illustrated in FIG. 1B, the electron-injection layer 109 and the second electrode 102 can have different shapes from the hole-injection/transport layer 104, the light-emitting layer 113, and the electron-transport layer 108. The electron-injection layer 109 and the second electrode 102 can be layers shared by a plurality of light-emitting devices; hence, the manufacturing process of the light-emitting device 100 can be simplified and the throughput can be improved.

As illustrated in FIG. 1B, the light-emitting device 100 may include an insulating layer 107. The insulating layer 107 is in contact with part of the first electrode 101, the side surface of the hole-injection/transport layer 104, the side surface of the light-emitting layer 113, and the side surface of the electron-transport layer 108. The electron-injection layer 109 is positioned on the side surface of the first electrode 101, the side surface of the hole-injection/transport layer 104, the side surface of the light-emitting layer 113, and the side surface of the electron-transport layer 108 with the insulating layer 107 therebetween, and is in contact with the top surface of the electron-transport layer 108 without the insulating layer 107 therebetween. The second electrode 102 is positioned on the side surface of the hole-injection/transport layer 104, the side surface of the light-emitting layer 113, and the side surface of the electron-transport layer 108 with the insulating layer 107 and the electron-injection layer 109 therebetween, is positioned on the side surface of the first electrode 101 with the electron-injection layer 109 therebetween, and is positioned on the top surface of the electron-transport layer 108 with the electron-injection layer 109 therebetween. It can also be said that the insulating layer 107 is positioned between the side surface of the light-emitting layer 113 and the electron-injection layer 109.

The second electrode 102 is positioned on the side surface of the first electrode 101, the side surface of the hole-injection/transport layer 104, the side surface of the light-emitting layer 113, and the side surface of the electron-transport layer 108 with the insulating layer 107 and the electron-injection layer 109 therebetween, thereby preventing electrical continuity between the second electrode 102 and the hole-injection/transport layer 104 and electrical continuity between the second electrode 102 and the first electrode 101.

Although the insulating layer 107 is not a necessity to obtain the above-described effect, the structure including the insulating layer 107 is preferable because it makes it possible to cover the side surface (or an end portion) of the hole-injection/transport layer 104, the side surface of the light-emitting layer 113, and the side surface of the electron-transport layer 108.

Moreover, the structure including the insulating layer 107 is preferable because it makes it possible to further prevent electrical continuity between the second electrode 102 and the hole-injection/transport layer 104 and electrical continuity between the second electrode 102 and the first electrode 101.

Consequently, the light-emitting device 100 can employ a variety of structures. For example, when a plurality of light-emitting devices 100 are arranged, the electron-injection layers 109 can be connected to each other and the second electrodes 102 can be connected to each other in the adjacent light-emitting devices 100.

Materials that can be used for the insulating layer 107 will be described later in an embodiment below.

As illustrated in FIG. 1C, the hole-injection/transport layer 104 may be surrounded by the light-emitting layer 113 in such a manner that the hole-injection/transport layer 104 (or only a hole-injection layer) is patterned first and then the light-emitting layer 113 and the electron-transport layer 108 are stacked in this order. In that case, the light-emitting layer 113 is in contact with the top surface and side surface of the hole-injection/transport layer 104; thus, the electron-injection layer 109 is not in contact with the side surface of the hole-injection/transport layer 104 and is in contact with the side surface of the first electrode 101, the side surface of the light-emitting layer 113, and the side surface of the electron-transport layer 108. The second electrode 102 is positioned on the side surface of the light-emitting layer 113 and the side surface and top surface of the electron-transport layer 108 with the electron-injection layer 109 therebetween.

The end portion of the hole-injection/transport layer 104 is surrounded by the light-emitting layer 113, whereby electrical continuity between the second electrode 102 and the hole-injection/transport layer 104 can be prevented without providing the insulating layer 107.

Note that one embodiment of the present invention is not limited to the structures in FIGS. 1B and 1C. For example, when an insulating layer or the like is provided between adjacent light-emitting devices so that the second electrode 102 and the electron-injection layer 109 are formed over the insulating layer, the second electrode 102 and the electron-injection layer 109 are sometimes not positioned on part or all of the side surface of the first electrode 101, the side surface of the hole-injection/transport layer 104, the side surface of the light-emitting layer 113, and the side surface of the electron-transport layer 108.

Note that the structure of the light-emitting device of one embodiment of the present invention is not limited to the structures illustrated in FIGS. TA to 1C. Basic structures of the light-emitting device will be described with reference to FIGS. 2A to 2E.

<<Basic Structure of Light-Emitting Device>>

Figure 2A:
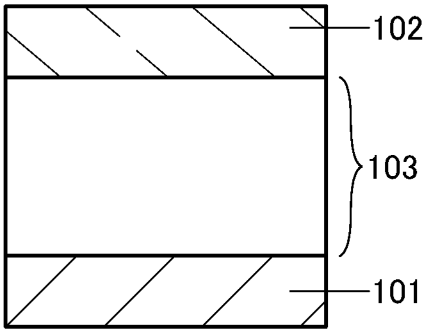
FIGS. 2A to 2E each illustrate a structure of a light-emitting device of an embodiment.

Basic structures of the light-emitting device are described. FIG. 2A illustrates a light-emitting device including, between a pair of electrodes, an EL layer including a light-emitting layer. Specifically, the EL layer 103 is positioned between the first electrode 101 and the second electrode 102.

Figure 2B:
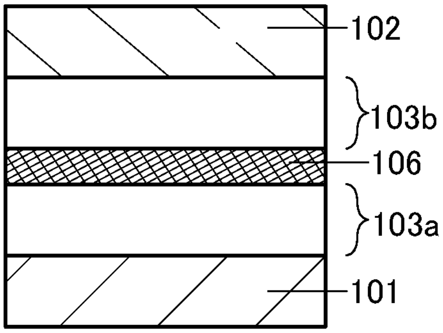

FIG. 2B illustrates a light-emitting device that has a stacked-layer structure (tandem structure) in which a plurality of EL layers (two EL layers 103*a* and 103*b* in FIG. 2B) are provided between a pair of electrodes and a charge-generation layer 106 is provided between the EL layers. A light-emitting device having a tandem structure enables fabrication of a light-emitting apparatus with a small current stress and high reliability.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when voltage is applied in FIG. 2B such that the potential of the first electrode 101 is higher than that of the second electrode 102, the charge-generation layer 106 injects electrons into the EL layer 103*a* and injects holes into the EL layer 103*b*.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 2C:
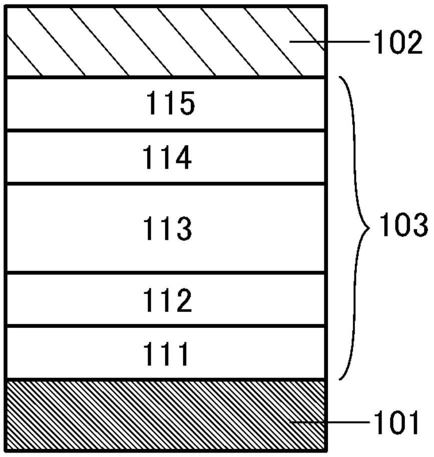

FIG. 2C illustrates a stacked-layer structure of the EL layer 103 in the light-emitting device of one embodiment of the present invention. In this case, the first electrode 101 is regarded as functioning as an anode and the second electrode 102 is regarded as functioning as a cathode. The EL layer 103 has a structure in which a hole-injection layer 111, a hole-transport layer 112, the light-emitting layer 113, an electron-transport layer 114, and an electron-injection layer 115 are stacked in this order over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can sometimes achieve higher reliability than a single-layer structure. In the case where a plurality of EL layers are provided as in the tandem structure illustrated in FIG. 2B, the layers in each EL layer are sequentially stacked from the anode side as described above. When the first electrode 101 is the cathode and the second electrode 102 is the anode, the stacking order of the layers in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a light-emitting substance and a plurality of substances, so that fluorescence or phosphorescence of a desired emission color can be obtained. The light-emitting layer 113 may have a stacked-layer structure having different emission colors. In that case, light-emitting substances and other substances are different between the stacked light-emitting layers. Alternatively, the plurality of EL layers (103*a* and 103*b*) in FIG. 2B may exhibit their respective emission colors. Also in that case, the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a transflective electrode in FIG. 2C. Thus, light from the light-emitting layer 113 in the EL layer 103 can be resonated between the electrodes and light obtained through the second electrode 102 can be intensified.

Note that when the first electrode 101 of the light-emitting device is a reflective electrode having a stacked structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is λ, the optical path length between the first electrode 101 and the second electrode 102 (the product of the thickness and the refractive index) is preferably adjusted to be mλ/2 (m is a natural number of 1 or more) or close to mλ/2.

To amplify desired light (wavelength: λ) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be (2m'+1)λ/4 (m' is a natural number of 1 or more) or close to (2m'+1)λ/4. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102.

Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 2D:
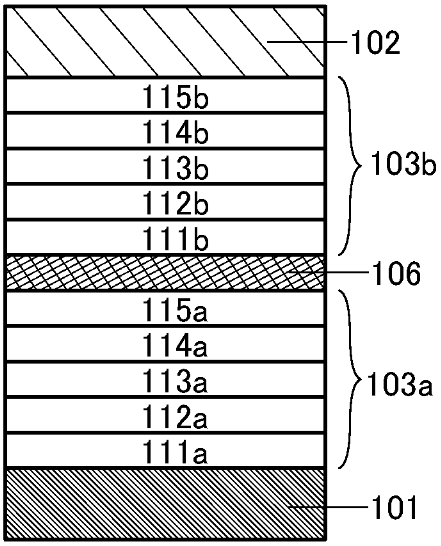

The light-emitting device illustrated in FIG. 2D is a light-emitting device having a tandem structure. Owing to a microcavity structure of the light-emitting device, light (monochromatic light) with different wavelengths from the EL layers (103*a* and 103*b*) can be extracted. Thus, separate coloring for obtaining a plurality of emission colors (e.g., R, G, and B) is not necessary. Therefore, high definition can be easily achieved. A combination with coloring layers (color filters) is also possible. Furthermore, the emission intensity of light with a specific wavelength in the front direction can be increased, whereby power consumption can be reduced.

Figure 2E:
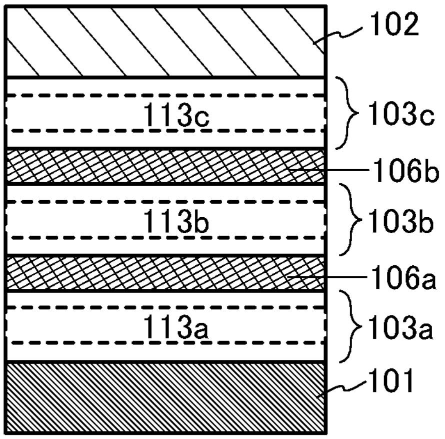

The light-emitting device illustrated in FIG. 2E is an example of the light-emitting device having the tandem structure illustrated in FIG. 2B, and includes three EL layers (103*a*, 103*b*, and 103*c*) stacked with charge-generation layers (106*a* and 106*b*) positioned therebetween, as illustrated in FIG. 2E. The three EL layers (103*a*, 103*b*, and 103*c*) include respective light-emitting layers (113*a*, 113*b*, and 113*c*), and the emission colors of the light-emitting layers can be selected freely. For example, the light-emitting layer 113*a* can emit blue light, the light-emitting layer 113*b* can emit one or more of red light, green light, and yellow light, and the light-emitting layer 113*c* can emit blue light. Alternatively, the light-emitting layer 113*a* can emit red light, the light-emitting layer 113*b* can emit one or more of blue light, green light, and yellow light, and the light-emitting layer 113*c* can emit red light.

In the light-emitting device of one embodiment of the present invention, at least one of the first electrode 101 and the second electrode 102 is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

<<Specific Structure of Light-Emitting Device>>

Next, a specific structure of the light-emitting device of one embodiment of the present invention will be described with reference to FIGS. 2A to 2E. Here, the description is made using FIG. 2D showing the tandem structure. Note that the structure of the EL layer applies also to the light-emitting devices having a single structure in FIGS. 2A and 2C. When the light-emitting device in FIG. 2D has a microcavity structure, the first electrode 101 is formed as a reflective electrode and the second electrode 102 is formed as a transflective electrode. Thus, a single-layer structure or a stacked-layer structure can be formed using one or more kinds of desired electrode materials. Note that the second electrode 102 is formed after formation of the EL layer 103*b*, with the use of a material selected as described above.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 2D, when the first electrode 101 is the anode, a hole-injection layer 111*a* and a hole-transport layer 112*a* of the EL layer 103*a* are sequentially stacked over the first electrode 101 by a vacuum evaporation method. After the EL layer 103*a* and the charge-generation layer 106 are formed, a hole-injection layer 111*b* and a hole-transport layer 112*b* of the EL layer 103*b* are sequentially stacked over the charge-generation layer 106 in a similar manner.

<Hole-Injection Layer>

The hole-injection layers (111, 111*a*, and 111*b*) inject holes from the first electrode 101 serving as the anode and the charge-generation layers (106, 106*a*, and 106*b*) to the EL layers (103, 103*a*, and 103*b*) and contain one or both of an organic acceptor material and a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material are 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to a fused aromatic ring having a plurality of heteroatoms, such as HAT-CN, is particularly preferred because it has a high acceptor property and stable film quality against heat. Besides, a [3]radialene derivative having an electron-withdrawing group (particularly a cyano group or a halogen group such as a fluoro group), which has a very high electron-accepting property, is preferred; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 in the periodic table (e.g., a transition metal oxide such as molybdenum oxide, vanadium oxide, ruthenium oxide, tungsten oxide, or manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples are phthalocyanine-based compounds such as phthalocyanine (abbreviation: $H_2Pc$) and copper phthalocyanine (abbreviation: CuPc).

Other examples are aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis{4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCAT), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples are high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl) methacrylamide] (abbreviation: PTPDMA), and poly[N,N-bis(4-butylphenyl)-N,N-bis(phenyl)benzidine] (abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

As the material having a high hole-injection property, a composite material containing a hole-transport material and the above-described organic acceptor material (electron-accepting material) can be used. In that case, the organic acceptor material extracts electrons from a hole-transport material, so that holes are generated in the hole-injection layer 111 and the holes are injected into the light-emitting layer 113 through the hole-transport layer 112. Note that the hole-injection layer 111 may be formed to have a single-layer structure using a composite material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that other substances can also be used as long as the substances have a hole-transport property higher than an electron-transport property.

As the hole-transport material, materials having a high hole-transport property, such as a π-electron rich heteroaromatic compound (e.g., a carbazole derivative, a furan derivative, or a thiophene derivative) and an aromatic amine (a compound having an aromatic amine skeleton), are preferable.

Examples of the carbazole derivative (a compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: PNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (a compound having a furan skeleton) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (a compound having a thiophene skeleton) include 1,3,5-tri(dibenzothiophen-4-yl)benzene (abbreviation: DBT3P-II), 2,8-diphenyl-4-[4-(9-phenyl-9H-fluoren-9-yl)phenyl] dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis [N-(1-naphthyl)-N-phenylamino]biphenyl (abbreviation: NPB or α-NPD), N,N'-bis(3-methylphenyl)-N,N-diphenyl-[1,1'-biphenyl]-4,4'-diamine (abbreviation: TPD), 4,4'-bis [N-(spiro-9,9'-bifluoren-2-yl)-N-phenylamino]biphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[V-phenyl-N-(9,9-dimethyl-9H-fluoren-2-yl) amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4', 4"-tris[N-(3-methylphenyl)-N-phenylamino]triphenylamine (abbreviation: m-MTDATA), N,N'-di(p-tolyl)-N,N-diphenyl-p-phenylenediamine (abbreviation: DTDPPA), 4,4'-bis [N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo [b]naphtho[1,2-d]furan-8-amine (abbreviation: BnfABP), N,N-bis(4-biphenyl)-6-phenylbenzo[b]naphtho[1,2-d] furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo [b]naphtho[1,2-d]furan-6-amine (abbreviation: BBABnf (6)), N,N-bis(4-biphenyl)benzo[b]naphtho[1,2-d]furan-8-amine (abbreviation: BBABnf(8)), N,N-bis(4-biphenyl) benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl) phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAββNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)-triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBi(3NB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis (9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide](abbreviation: PTPDMA), and poly[N,N'-bis(4-butylphenyl)-N,N'-bis (phenyl)benzidine](abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrode 101 by the hole-injection layers (111, 111*a*, and 111*b*), to the light-emitting layers (113, 113*a*, 113*b*, and 113*c*). Note that the hole-transport layers (112, 112*a*, and 112*b*) contain a hole-transport material. Thus, the hole-transport layers (112, 112*a*, and 112*b*) can be formed using a hole-transport material that can be used for the hole-injection layers (111, 111*a*, and 111*b*).

Note that in the light-emitting device of one embodiment of the present invention, the organic compound used for the hole-transport layers (112, 112*a*, and 112*b*) can also be used for the light-emitting layers (113, 113*a*, 113*b*, and 113*c*). The use of the same organic compound for the hole-transport layers (112, 112*a*, and 112*b*) and the light-emitting layers (113, 113*a*, 113*b*, and 113*c*) is preferable, in which case holes can be efficiently transported from the hole-transport layers (112, 112*a*, and 112*b*) to the light-emitting layers (113, 113*a*, 113*b*, and 113*c*).

<Light-Emitting Layer>

The light-emitting layers (113, 113*a*, 113*b*, and 113*c*) contain a light-emitting substance. Note that as a light-emitting substance that can be used in the light-emitting layers (113, 113*a*, 113*b*, and 113*c*), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, a stacked-layer structure in which one light-emitting layer contains two or more kinds of light-emitting substances may be employed.

The light-emitting layers (113, 113*a*, 113*b*, and 113*c*) may each contain one or more kinds of organic compounds (e.g., a host material) in addition to a light-emitting substance (guest material).

In the case where a plurality of host materials are used in the light-emitting layers (113, 113*a*, 113*b*, and 113*c*), a second host material that is additionally used is preferably a substance having a larger energy gap than a known guest material and a first host material. Preferably, the lowest singlet excitation energy level (S1 level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by two kinds of host materials. To form an exciplex efficiently, it is particularly preferable to combine a compound that easily accepts holes (hole-transport material) and a compound that easily accepts electrons (electron-transport material). With the above structure, high efficiency, low voltage, and a long lifetime can be achieved at the same time.

As an organic compound used as the host material (including the first host material and the second host material), organic compounds such as the hole-transport materials usable in the hole-transport layers (112, 112*a*, and 112*b*) and electron-transport materials usable in electron-transport layers (114, 114*a*, and 114*b*) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. As an example of a combination of two or more kinds of organic compounds forming an exciplex, it is preferable that one of the two or more kinds of organic compounds have a π-electron deficient heteroaromatic ring and the other have a π-electron rich heteroaromatic ring. A phosphorescent substance such as an iridium-, rhodium-, or platinum-based organometallic complex or a metal complex may be used as one component of the combination for forming an exciplex.

There is no particular limitation on the light-emitting substances that can be used for the light-emitting layers (113, 113*a*, 113*b*, and 113*c*), and a light-emitting substance that converts singlet excitation energy into light in the visible light range or a light-emitting substance that converts triplet excitation energy into light in the visible light range can be used.

<<Light-Emitting Substance that Converts Singlet Excitation Energy into Light>>

The following substances that exhibit fluorescence (fluorescent substances) can be given as examples of the light-emitting substance that converts singlet excitation energy into light and can be used in the light-emitting layers (113, 113*a*, 113*b*, and 113*c*): a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-diphenyl-N,N-bis[4-(9-phenyl-9H-fluoren-9-yl)phenyl]pyrene-1,6-diamine (abbreviation: 1,6FLPAPrn), N,N-bis(dibenzofuran-2-yl)-N,N-diphenylpyrene-1,6-diamine (abbreviation: 1,6FrAPrn), N,N-bis(dibenzothiophen-2-yl)-N,N-diphenylpyrene-1,6-diamine (abbreviation: 1,6ThAPrn), N,N-(pyrene-1,6-diyl)bis[(N-phenylbenzo[b]naphtho[1,2-d]furan)-6-amine] (abbreviation: 1,6BnfAPrn), N,N-(pyrene-1,6-diyl)bis[(N-phenylbenzo[b]naphtho[1,2-d]furan)-8-amine](abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N',N'-triphenyl-1,4-phenylenediamine (abbreviation: 2DPAPPA).

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'- diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[if]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 1,6BnfAPm-03, 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPm, 1,6mMemFLPAPm, and 1,6BnfAPm-03 can be used, for example.

<<Light-Emitting Substance that Converts Triplet Excitation Energy into Light>>

Examples of the light-emitting substance that converts triplet excitation energy into light and can be used in the light-emitting layer 113 include substances that exhibit phosphorescence (phosphorescent materials) and thermally activated delayed fluorescent (TADF) materials that exhibit thermally activated delayed fluorescence.

A phosphorescent substance is a compound that exhibits phosphorescence but does not exhibit fluorescence at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is particularly preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength at greater than or equal to 450 nm and less than or equal to 570 nm, the following substances can be given.

Examples include organometallic complexes having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-TH-1,2,4-triazolato]iridium(III) (abbreviation: [Ir(Mptz1-mp)$_3$]) and tris(1-methyl-5-phenyl-3-propyl-TH-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), and bis[2-(4',6'-difluorophenyl)pyridinato-N,$C^{2'}$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength at greater than or equal to 495 nm and less than or equal to 590 nm, the following substances can be given.

Examples of the phosphorescent substance include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κ$N^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), bis[2-(2-pyridinyl-N)phenyl-κC][2-(4-phenyl-2-pyridinyl-κN)phenyl-κC]iridium(III) (abbreviation: [Ir(ppy)$_2$(4dppy)]), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,$C^{2'}$)iridium(III) acetylacetonate (abbreviation: [Ir(dpo)$_2$(acac)]), bis{2-[4'-(perfluorophenyl)

phenyl]pyridinato-N,$C^{2'}$}iridium(III) acetylacetonate (abbreviation: $[Ir(p\text{-}PF\text{-}ph)_2(acac)]$), and bis(2-phenylbenzothiazolato-N,$C^{2'}$)iridium(III) acetylacetonate (abbreviation: $[Ir(bt)_2(acac)]$); and a rare earth metal complex such as tris(acetylacetonato)(monophenanthroline)terbium(III) (abbreviation: $[Tb(acac)_3(Phen)]$).

<<Phosphorescent substance (from 570 nm to 750 nm, yellow or red)>>

As examples of a phosphorescent substance which emits yellow or red light and whose emission spectrum has a peak wavelength at greater than or equal to 570 nm and less than or equal to 750 nm, the following substances can be given.

Examples include organometallic complexes having a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and (dipivaloylmethanato)bis[4,6-di(naphthalen-1-yl)pyrimidinato]iridium(III) (abbreviation: $[Ir(dlnpm)_2(dpm)]$); organometallic complexes having a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), bis{4,6-dimethyl-2-[3-(3,5-dimethylphenyl)-5-phenyl-2-pyrazinyl-N]phenyl-κC}(2,6-dimethyl-3,5-heptanedionato-$\kappa^2$O,O')iridium(III) (abbreviation: $[Ir(dmdppr\text{-}P)_2(dibm)]$), bis{4,6-dimethyl-2-[5-(4-cyano-2,6-dimethylphenyl)-3-(3,5-dimethylphenyl)-2-pyrazinyl-N]phenyl-κC}(2,2,6,6-tetramethyl-3,5-heptanedionato-$\kappa^2$O,O')iridium(III) (abbreviation: $[Ir(dmdppr\text{-}dmCP)_2(dpm)]$), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-$\kappa^2$O,O')iridium(III) (abbreviation: $[Ir(dmdppr\text{-}dmp)_2(dpm)]$), (acetylacetonato)bis[2-methyl-3-phenylquinoxalinato-N,$C^{2'}$]iridium(III) (abbreviation: $[Ir(mpq)_2(acac)]$), (acetylacetonato)bis(2,3-diphenylquinoxalinato-N,$C^{2'}$)iridium(III) (abbreviation: $[Ir(dpq)_2(acac)]$), and (acetylacetonato)bis[2,3-bis(4-fluorophenyl)quinoxalinato]iridium(III) (abbreviation: $[Ir(Fdpq)_2(acac)]$); organometallic complexes having a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), and bis[4,6-dimethyl-2-(2-quinolinyl-κN)phenyl-κC](2,4-pentanedionato-$\kappa^2$O,O')iridium(III) (abbreviation: $[Ir(dmpqn)_2(acac)]$); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$).

<<Tadf Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently exhibits light (fluorescence) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having the same spectrum as normal fluorescence and an extremely long lifetime. The lifetime is $1\times10^{-6}$ seconds or longer, preferably $1\times10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

[Chemical Formula 1]

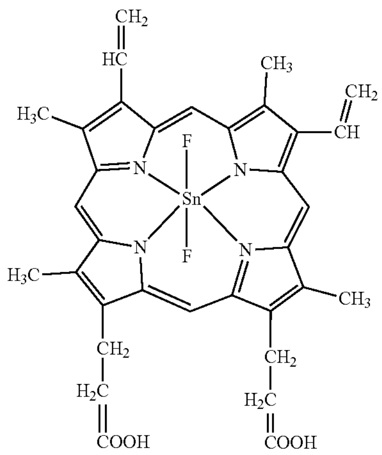

$SnF_2$(Proto IX)

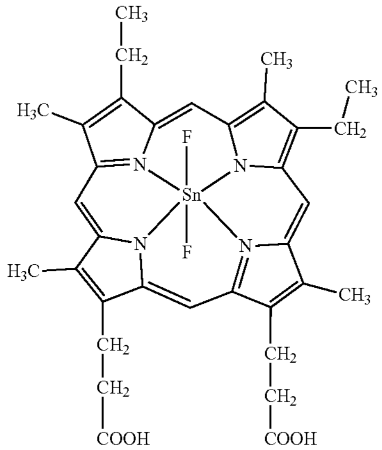

$SnF_2$(Meso IX)

-continued

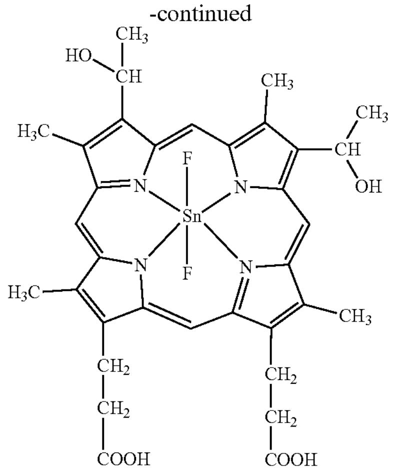

$SnF_2$(Hemato IX)

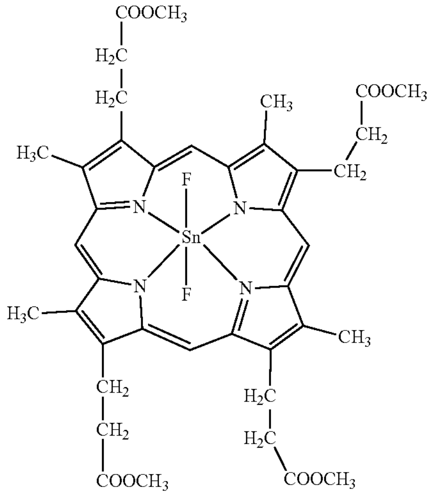

$SnF_2$(Copro III-4Me)

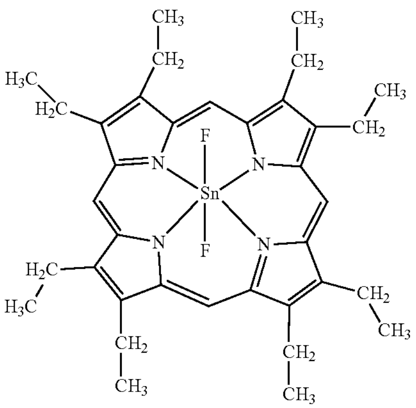

$SnF_2$(OEP)

-continued

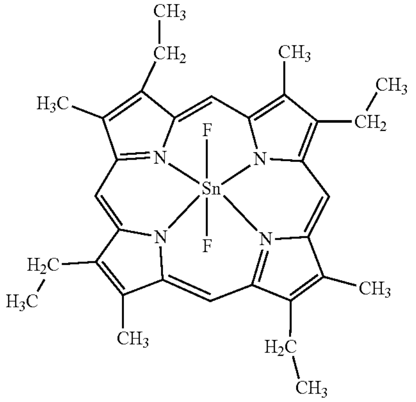

$SnF_2$(Etio I)

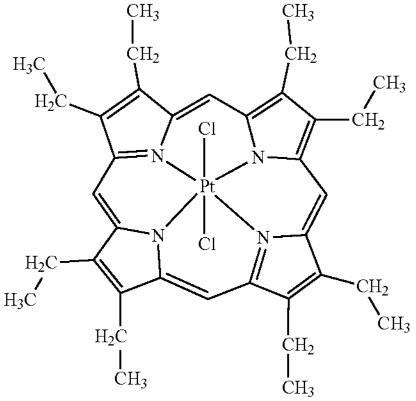

$PtCl_2OEP$

Alternatively, a heterocyclic compound having a 7-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

[Chemical Formula 2]
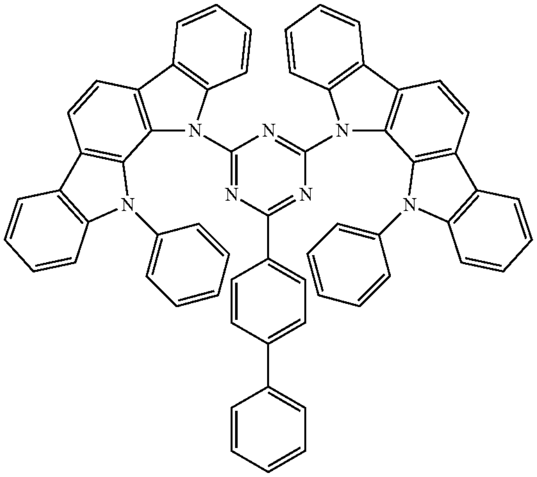
PIC-TRZ
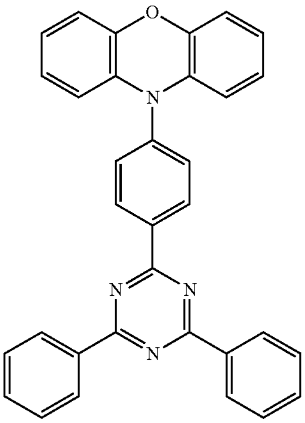
PXZ-TRZ
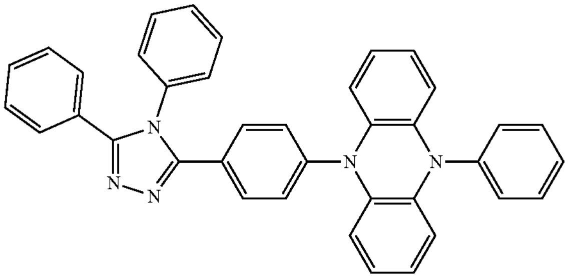
PPZ-3TPT
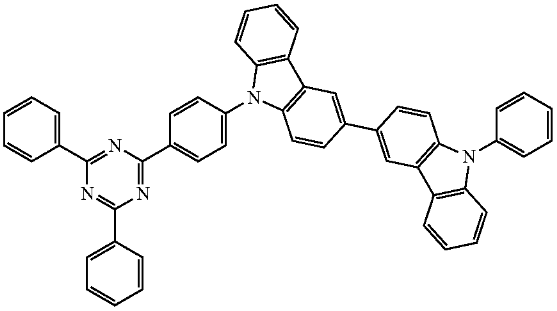
PCCzPTzn
-continued
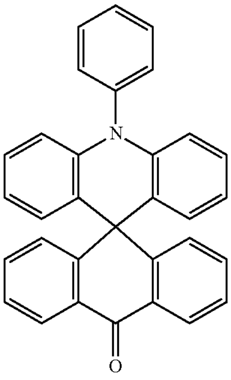
ACRSA
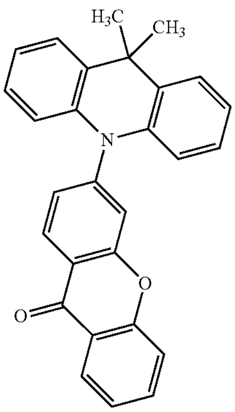
ACRXTN
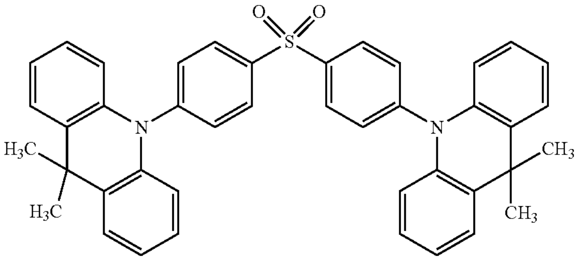
DMAC-DPS
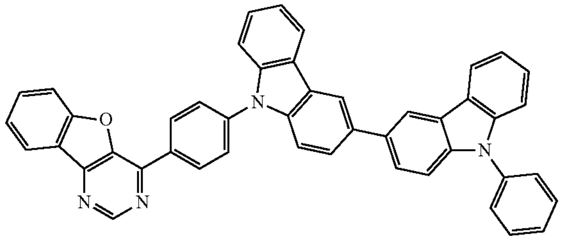
4PCCzPBfpm -continued

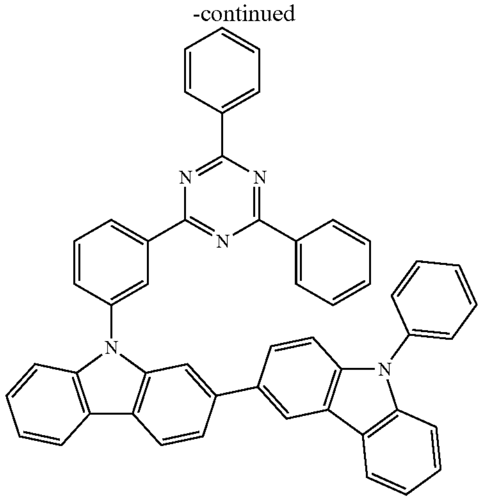

mPCCzPTzn-02

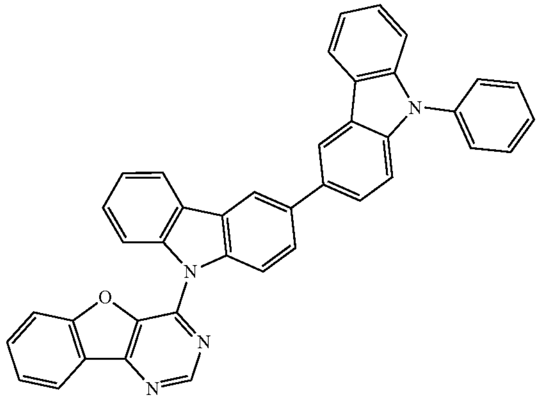

4PCCzBfpm

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than the light-emitting substance (guest material) are used.

<<Host Material for Fluorescence>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state, or an organic compound having a high fluorescence quantum yield. Therefore, the hole-transport material (described above) and the electron-transport material (described below) shown in this embodiment, for example, can be used as long as they are organic compounds that satisfy such a condition.

In terms of a preferred combination with the light-emitting substance (fluorescent substance), examples of the organic compound (host material), some of which overlap the above specific examples, are fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescence>>

In the case where the light-emitting substance used in the light-emitting layers (113, 113*a*, 113*b*, and 113*c*) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In terms of a preferred combination with the light-emitting substance (phosphorescent substance), examples of the organic compound (the host material and the assist material), some of which overlap the above specific examples, are an aromatic amine, a carbazole derivative, a dibenzothiophene derivative, a dibenzofuran derivative, zinc- and aluminum-based metal complexes, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Such derivatives are preferable as the host material.

Among the above, specific examples of metal complexes that are organic compounds having a high electron-transport property (electron-transport materials) include zinc- and aluminum-based metal complexes, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato) aluminum(III) (abbreviation: BAlq), and bis(8-quinolinolato)zinc(II) (abbreviation: Znq), and metal complexes having a quinoline skeleton or a benzoquinoline skeleton. Such metal complexes are preferable as the host material.

Other examples of preferred host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the phenanthroline derivative, and the like, which are organic compounds having a high electron-transport property (electron-transport materials), include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2,2-(1,3-phenylene)bis[9-phenyl-1,10-phenanthroline] (abbreviation: mPPhen2P), 2-[3-(dibenzothiophen-4-yl) phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl) phenyl]dibenzo[f,h]quinoxaline (abbreviation: 7mDBTPDBq-II), and 6-[3-(dibenzothiophen-4-yl)phenyl] dibenzo[f,h]quinoxaline (abbreviation: 6mDBTPDBq-II). Such derivatives are preferable as the host material.

Among the above, specific examples of a heterocyclic compound having a diazine skeleton, a heterocyclic compound having a triazine skeleton, and a heterocyclic compound having a pyridine skeleton, which are organic compounds having a high electron-transport property (electron-transport materials), include 4,6-bis[3-(phenanthren-9-yl) phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl] pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB). Such heterocyclic compounds are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Furthermore, for example, 9-phenyl-9'-(4-phenyl-2-quinazolinyl)-3,3'-bi-9H-carbazole (abbreviation: PCCzQz) having bipolar properties, which is an organic compound having a high hole-transport property and a high electron-transport property, can be used as the host material.

<Electron-Transport Layer>

The electron-transport layers (114, 114*a*, and 114*b*) transport the electrons, which are injected from the second electrode 102 and the charge-generation layers (106, 106*a*, and 106*b*) by electron-injection layers (115, 115*a*, and 115*b*) described later, to the light-emitting layers (113, 113*a*, 113*b*, and 113*c*). Note that the electron-transport layers (114, 114*a*, and 114*b*) contain an electron-transport material. It is preferable that the electron-transport material used in the electron-transport layers (114, 114*a*, and 114*b*) be a substance having an electron mobility higher than or equal to $1\times10^{-6}$ $cm^2/Vs$ in the case where the square root of the electric field strength [V/cm] is 600. Note that any other substance can also be used as long as the substance transports electrons more easily than it transports holes. The electron-transport layers (114, 114*a*, and 114*b*) function even with a single-layer structure; however, when the electron-transport layer has a stacked-layer structure including two or more layers as needed, the device characteristics can be improved.

<<Electron-Transport Material>>

Examples of the electron-transport material that can be used for the electron-transport layers (114, 114*a*, and 114*b*) include materials having a high electron-transport property (electron-transport materials), such as an organic compound having a structure where an aromatic ring is fused to a furan ring of a furodiazine skeleton, a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound (e.g., a nitrogen-containing heteroaromatic compound).

Specific examples of the electron-transport material include metal complexes having a quinoline skeleton or a benzoquinoline skeleton, such as 2-[3'-(dibenzothiophen-4-yl)biphenyl-3-yl]dibenzo[f,h]quinoxaline (abbreviation: 2mDBTBPDBq-II), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 4-[3-(dibenzothiophen-4-yl)phenyl]-8-(naphthalen-2-yl)-[1]benzofuro[3,2-d]pyrimidine (abbreviation: 8PN-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 9-[(3'-dibenzothiophen-4-yl)biphenyl-3-yl]naphtho[1',2': 4,5]furo[2,3-b]pyrazine (abbreviation: 9mDBtBPNfpr), 8-[3'-(dibenzothiophen-4-yl)(1,1'-biphenyl-3-yl)]naphtho[1',2': 4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), tris(8-quinolinolato)aluminum(III) (abbreviation: $Alq_3$), $Almq_3$, $BeBq_2$, bis(2-methyl-8-quinolinolato)(4-phenylphenolato)aluminum(III) (abbreviation: BAlq), and bis(8-quinolinolato)zinc(II) (abbreviation: Znq), and metal complexes having an oxazole skeleton or a thiazole skeleton, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Other than the metal complexes, oxadiazole derivatives such as PBD, OXD-7, and CO11, triazole derivatives such as TAZ and p-EtTAZ, imidazole derivatives (including benzimidazole derivatives) such as TPBI and mDBTBIm-II, an oxazole derivative such as BzOS, phenanthroline derivatives such as Bphen, BCP, NBphen, and mPPhen2P, quinoxaline derivatives and dibenzoquinoxaline derivatives such as 2mDBTPDBq-II, 2mDBTBPDBq-II, 2mCzBPDBq, 2CzPDBq-III, 7mDBTPDBq-II, and 6mDBTPDBq-II, pyridine derivatives such as 35DCzPPy and TmPyPB, pyrimidine derivatives such as 4,6mPnP2Pm, 4,6mDBTP2Pm-II, and 4,6mCzP2Pm, and triazine derivatives such as PCCzPTzn and mPCCzPTzn-02 can be used as the electron-transport material.

High-molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can be used as the electron-transport material.

Each of the electron-transport layers (114, 114*a*, and 114*b*) is not limited to a single layer and may be a stack of two or more layers each containing any of the above substances.

<Electron-Injection Layer>

The electron-injection layers (115, 115*a*, and 115*b*) contain a substance having a high electron-injection property. The electron-injection layers (115, 115*a*, and 115*b*) are layers for increasing the efficiency of electron injection from the second electrode 102 and are preferably formed using a material whose value of the LUMO level has a small difference (0.5 eV or less) from the work function of a material used for the second electrode 102. Thus, the electron-injection layers (115, 115*a*, and 115*b*) can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide ($LiO_x$), or cesium carbonate. A rare earth metal compound like erbium fluoride ($ErF_3$) can also be used. Electride may also be used for the electron-injection layers (115, 115*a*, and 115*b*). Examples of the electride include a substance in which electrons are added at high concentration to calcium oxide-aluminum oxide. Any of the substances used for the electron-transport layers (114, 114*a*, and 114*b*), which are given above, can also be used.

A composite material in which an organic compound and an electron donor (donor) are mixed may also be used for the electron-injection layers (115, 115*a*, and 115*b*). Such a composite material is excellent in an electron-injection property and an electron-transport property because electrons are generated in the organic compound by the electron donor. The organic compound here is preferably a material excellent in transporting the generated electrons; specifically, for example, the electron-transport materials used for the electron-transport layers (114, 114*a*, and 114*b*), such as a metal complex and a heteroaromatic compound, can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

A composite material in which an organic compound and a metal are mixed may also be used for the electron-injection layers (115, 115*a*, and 115*b*). The organic compound used here preferably has a lowest unoccupied molecular orbital (LUMO) level higher than or equal to −3.6 eV and lower than or equal to −2.3 eV. Moreover, a material having an unshared electron pair is preferable.

Therefore, the above organic compound is preferably a material having an unshared electron pair, such as a heterocyclic compound having a pyridine skeleton, a diazine skeleton (e.g., a pyrimidine skeleton or a pyrazine skeleton), or a triazine skeleton.

Examples of the heterocyclic compound having a pyridine skeleton include 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathocuproine (abbreviation: BCP), 2,9-bis(naphthalen-2-yl)-4,7-diphenyl-1,10-phenanthroline (abbreviation: NBPhen), 2,2-(1,3-phenylene)bis[9-phenyl-1,10-phenanthroline] (abbreviation: mPPhen2P), and bathophenanthroline (abbreviation: Bphen).

Examples of the heterocyclic compound having a diazine skeleton include 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation:

2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-{3-[3'-(9H-carbazol-9-yl)]biphenyl-3-yl}benzofuro[3,2-d]pyrimidine (abbreviation: 4mCzBPBfpm).

Examples of the heterocyclic compound having a triazine skeleton include 2-{4-[3-(N-phenyl-9H-carbazol-3-yl)-9H-carbazol-9-yl]phenyl}-4,6-diphenyl-1,3,5-triazine (abbreviation: PCCzPTzn), 2,4,6-tris[3'-(pyridin-3-yl)biphenyl-3-yl]-1,3,5-triazine (abbreviation: TmPPPyTz), and 2,4,6-tris(2-pyridyl)-1,3,5-triazine (abbreviation: 2Py3Tz).

As the metal, a transition metal that belongs to Group 5, Group 7, Group 9, or Group 11 or a material that belongs to Group 13 in the periodic table is preferably used, and examples include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 2D, a structure in which a plurality of EL layers are stacked between the pair of electrodes (the structure is also referred to as a tandem structure) can be obtained.

<Charge-Generation Layer>

The charge-generation layer 106 has a function of injecting electrons into the EL layer 103*a* and injecting holes into the EL layer 103*b* when voltage is applied between the first electrode (anode) 101 and the second electrode (cathode) 102. The charge-generation layer 106 may be either a p-type layer in which an electron acceptor (acceptor) is added to a hole-transport material or an electron-injection buffer layer in which an electron donor (donor) is added to an electron-transport material. Alternatively, both of these layers may be stacked. Furthermore, an electron-relay layer may be provided between the p-type layer and the electron-injection buffer layer. Note that forming the charge-generation layer 106 with the use of any of the above materials can inhibit an increase in driving voltage caused by the stack of the EL layers.

In the case where the charge-generation layer 106 is a p-type layer in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide. Any of the above-described acceptor materials may be used. Furthermore, a p-type layer may be a mixed film obtained by mixing a hole-transport material and an electron acceptor, or a stack of a film containing a hole-transport material and a film containing an electron acceptor.

In the case where the charge-generation layer 106 is an electron-injection buffer layer in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide ($Li_2O$), cesium carbonate, or the like is preferably used. An organic compound such as tetrathianaphthacene may be used as the electron donor.

When an electron-relay layer is provided between a p-type layer and an electron-injection buffer layer in the charge-generation layer 106, the electron-relay layer contains at least a substance having an electron-transport property and has a function of preventing an interaction between the electron-injection buffer layer and the p-type layer and transferring electrons smoothly. The LUMO level of the substance having an electron-transport property in the electron-relay layer is preferably between the LUMO level of the acceptor substance in the p-type layer and the LUMO level of the substance having an electron-transport property in the electron-transport layer in contact with the charge-generation layer 106. Specifically, the LUMO level of the substance having an electron-transport property in the electron-relay layer is preferably higher than or equal to −5.0 eV, further preferably higher than or equal to −5.0 eV and lower than or equal to −3.0 eV. Note that as the substance having an electron-transport property in the electron-relay layer, a phthalocyanine-based material or a metal complex having a metal-oxygen bond and an aromatic ligand is preferably used.

Although FIG. 2D illustrates the structure in which two EL layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide, polyimide, aramid, epoxy, an inorganic vapor deposition film, and paper.

For fabrication of the light-emitting device in this embodiment, a vacuum process such as an evaporation method or a solution process such as a spin coating method and an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be used. Specifically, the functional layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), the electron-injection layers (115, 115*a*, and 115*b*)) included in the EL layers and the charge-generation layers (106, 106*a*, and 106*b*) of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Note that materials that can be used for the functional layers (the hole-injection layers (111, 111*a*, and 111*b*), the hole-transport layers (112, 112*a*, and 112*b*), the light-emitting layers (113, 113*a*, 113*b*, and 113*c*), the electron-transport layers (114, 114*a*, and 114*b*), and the electron-injection layers (115, 115*a*, and 115*b*)) included in the EL layers (103, 103*a*, and 103*b*) and the charge-generation layers (106, 106*a*, and 106*b*) of the light-emitting device described in this embodiment are not limited to the materials described in this embodiment, and other materials can be used in combination as long as the functions of the layers are fulfilled.

The structures described in this embodiment can be used in combination with any of the structures described in the other embodiments as appropriate.

Embodiment 2

In this embodiment, specific structure examples and manufacturing methods of a light-emitting apparatus (also referred to as a display panel) of one embodiment of the present invention will be described.

Structure Example 1 of Light-Emitting Apparatus 700

Figure 3A:
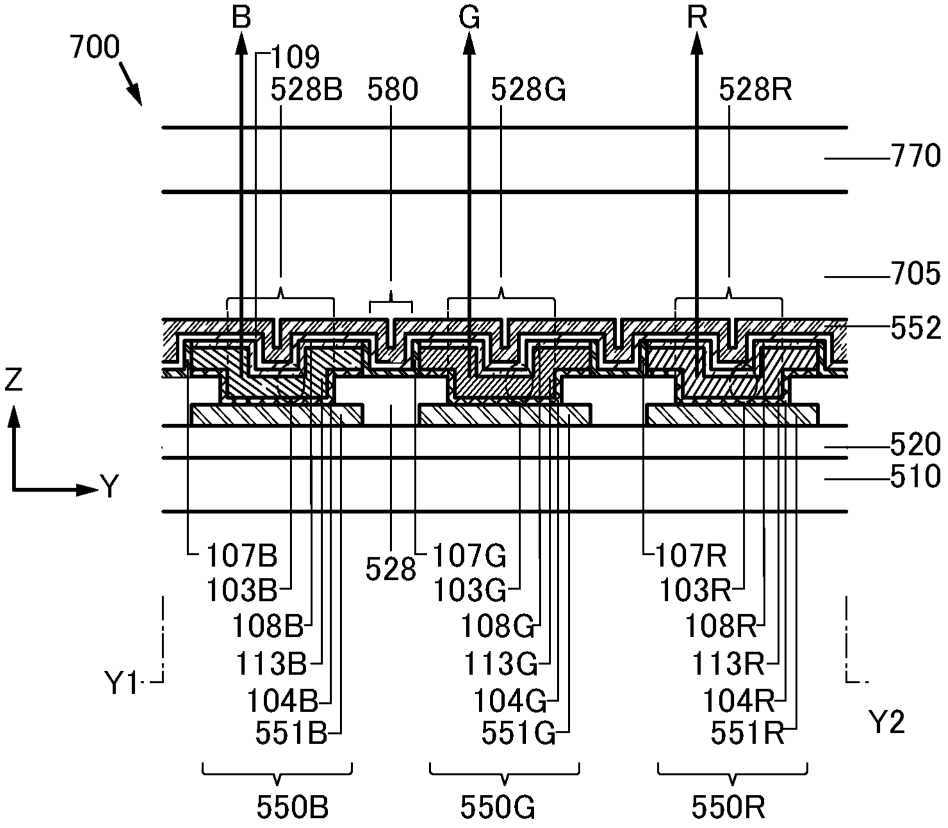
FIGS. 3A and 3B illustrate a structure of a light-emitting apparatus of an embodiment.

A light-emitting apparatus 700 illustrated in FIG. 3A includes a light-emitting device 550B, a light-emitting device 550G, a light-emitting device 550R, and a partition 528. The light-emitting device 550B, the light-emitting device 550G, the light-emitting device 550R, and the partition 528 are formed over a functional layer 520 provided over a first substrate 510. The functional layer 520 includes, for example, a driver circuit GD, a driver circuit SD, pixel circuits, and the like that are composed of a plurality of transistors, and wirings that electrically connect these circuits. Note that these driver circuits are electrically connected to the light-emitting device 550B, the light-emitting device 550G, and the light-emitting device 550R to drive them. The light-emitting apparatus 700 includes an insulating layer 705 over the functional layer 520 and the light-emitting devices, and the insulating layer 705 has a function of attaching a second substrate 770 and the functional layer 520. The driver circuit GD and the driver circuit SD will be described in Embodiment 3.

The light-emitting device 550B, the light-emitting device 550G, and the light-emitting device 550R each have the device structure described in Embodiment 1. Specifically, the case is described in which the EL layer 103 in the structure illustrated in FIG. 2A differs between the light-emitting devices.

The light-emitting device 550B includes an electrode 551B, an electrode 552, an EL layer 103B, and an insulating layer 107B. Note that a specific structure of each layer is as described in Embodiment 1. The EL layer 103B has a stacked-layer structure of layers having different functions including a light-emitting layer. Although FIG. 3A illustrates only a hole-injection/transport layer 104B, a light-emitting layer 113B, an electron-transport layer 108B, and the electron-injection layer 109 among the layers included in the EL layer 103B, the present invention is not limited thereto. Note that the hole-injection/transport layer 104B represents the layer having the functions of the hole-injection layer and the hole-transport layer described in Embodiment 1 and may have a stacked-layer structure. Note that in this specification, a hole-injection/transport layer in any light-emitting device can be interpreted in the above manner. The electron-transport layer 108B may have a stacked-layer structure, and may include a hole-blocking layer, in contact with the light-emitting layer 113B, which blocks holes moving from the anode side to the cathode side through the light-emitting layer. The electron-injection layer 109 may have a stacked-layer structure in which some or all of layers are formed using different materials.

As illustrated in FIG. 3A, the insulating layer 107B is formed while a resist formed over some layers in the EL layer 103B (in this embodiment, the layers up to the electron-transport layer 108B over the light-emitting layer 113B) remains over the electrode 551B. Thus, the insulating layer 107B is formed in contact with side surfaces (or end portions) of the above layers in the EL layer 103B. Accordingly, entry of oxygen, moisture, or constituent elements thereof through the side surface of the EL layer 103B into the inside of the EL layer 103B can be inhibited. For the insulating layer 107B, aluminum oxide, magnesium oxide, hafnium oxide, gallium oxide, indium gallium zinc oxide, silicon nitride, or silicon nitride oxide can be used, for example. The insulating layer 107B can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103B (the layers up to the electron-transport layer 108B over the light-emitting layer 113B) and the insulating layer 107B. The electron-injection layer 109 preferably has a stacked-layer structure of two or more layers having different electric resistances. For example, the electron-injection layer 109 may have one of the following structures: a structure in which a first layer in contact with the electron-transport layer 108B is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108B.

The electrode 552 is formed over the electron-injection layer 109. Note that the electrode 551B and the electrode 552 have an overlap region. The EL layer 103B is positioned between the electrode 551B and the electrode 552. Thus, the electron-injection layer 109 is positioned on the side surfaces (or end portions) of some layers in the EL layer 103B with the insulating layer 107B therebetween, or the electrode 552 is positioned on the side surfaces (or end portions) of some layers in the EL layer 103B with the electron-injection layer 109 and the insulating layer 107B therebetween. Hence, the EL layer 103B and the electrode 552, specifically the hole-injection/transport layer 104B in the EL layer 103B and the electrode 552 can be prevented from being electrically short-circuited.

The EL layer 103B illustrated in FIG. 3A has the same structure as the EL layers 103, 103*a*, 103*b*, and 103*c* described in Embodiment 1. The EL layer 103B is capable of emitting blue light, for example.

The light-emitting device 550G includes an electrode 551G, the electrode 552, an EL layer 103G, and an insulating layer 107G. Note that a specific structure of each layer is as described in Embodiment 1. The EL layer 103G has a stacked-layer structure of layers having different functions including a light-emitting layer. Although FIG. 3A illustrates only a hole-injection/transport layer 104G, a light-emitting layer 113G, an electron-transport layer 108G, and the electron-injection layer 109 among the layers included in the EL layer 103G, the present invention is not limited thereto. Note that the hole-injection/transport layer 104G represents the layer having the functions of the hole-injection layer and the hole-transport layer described in Embodiment 1 and may have a stacked-layer structure.

The electron-transport layer 108G may have a stacked-layer structure, and may include a hole-blocking layer, in contact with the light-emitting layer 113G, which blocks holes moving from the anode side to the cathode side through the light-emitting layer 113G. The electron-injection layer 109 may have a stacked-layer structure in which some or all of layers are formed using different materials.

As illustrated in FIG. 3A, the insulating layer 107G is formed while a resist formed over some layers in the EL layer 103G (in this embodiment, the layers up to the electron-transport layer 108G over the light-emitting layer 113G) remains over the electrode 551G. Thus, the insulating layer 107G is formed in contact with side surfaces (or end portions) of the above layers in the EL layer 103G. Accordingly, entry of oxygen, moisture, or constituent elements thereof through the side surface of the EL layer 103G into the inside of the EL layer 103G can be inhibited. For the insulating layer 107G, aluminum oxide, magnesium oxide, hafnium oxide, gallium oxide, indium gallium zinc oxide, silicon nitride, or silicon nitride oxide can be used, for example. The insulating layer 107G can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103G (the layers up to the electron-transport layer 108G over the light-emitting layer 113G) and the insulating layer 107G. The electron-injection layer 109 preferably has a stacked-layer structure of two or more layers having different electric resistances. For example, the electron-injection layer 109 may have one of the following structures: a structure in which a first layer in contact with the electron-transport layer 108G is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108G.

The electrode 552 is formed over the electron-injection layer 109. Note that the electrode 551G and the electrode 552 have an overlap region. The EL layer 103G is positioned between the electrode 551G and the electrode 552. Thus, the electron-injection layer 109 is positioned on the side surfaces (or end portions) of some layers in the EL layer 103G with the insulating layer 107G therebetween, or the electrode 552 is positioned on the side surfaces (or end portions) of some layers in the EL layer 103G with the electron-injection layer 109 and the insulating layer 107G therebetween. Hence, the EL layer 103G and the electrode 552, specifically the hole-injection/transport layer 104G in the EL layer 103G and the electrode 552 can be prevented from being electrically short-circuited.

The EL layer 103G illustrated in FIG. 3A has the same structure as the EL layers 103, 103*a*, 103*b*, and 103*c* described in Embodiment 1. The EL layer 103G is capable of emitting green light, for example.

The light-emitting device 550R includes an electrode 551R, the electrode 552, an EL layer 103R, and an insulating layer 107R. Note that a specific structure of each layer is as described in Embodiment 1. The EL layer 103R has a stacked-layer structure of layers having different functions including a light-emitting layer. Although FIG. 3A illustrates only a hole-injection/transport layer 104R, a light-emitting layer 113R, an electron-transport layer 108R, and the electron-injection layer 109 among the layers included in the EL layer 103R, the present invention is not limited thereto. The hole-injection/transport layer 104R represents the layer having the functions of the hole-injection layer and the hole-transport layer described in Embodiment 1 and may have a stacked-layer structure. Note that in this specification, a hole-injection/transport layer in any light-emitting device can be interpreted in the above manner. The electron-transport layer 108R may have a stacked-layer structure, and may include a hole-blocking layer, in contact with the light-emitting layer, which blocks holes moving from the anode side to the cathode side through the light-emitting layer. The electron-injection layer 109 may have a stacked-layer structure in which some or all of layers are formed using different materials.

As illustrated in FIG. 3A, the insulating layer 107R is formed while a resist formed over some layers in the EL layer 103R (in this embodiment, the layers up to the electron-transport layer 108R over the light-emitting layer 113R) remains over the electrode 551R. Thus, the insulating layer 107R is formed in contact with side surfaces (or end portions) of the above layers in the EL layer 103R. Accordingly, entry of oxygen, moisture, or constituent elements thereof through the side surface of the EL layer 103R into the inside of the EL layer 103R can be inhibited. For the insulating layer 107R, aluminum oxide, magnesium oxide, hafnium oxide, gallium oxide, indium gallium zinc oxide, silicon nitride, or silicon nitride oxide can be used, for example. The insulating layer 107R can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103R (the layers up to the electron-transport layer 108R over the light-emitting layer 113R) and the insulating layer 107R. The electron-injection layer 109 preferably has a stacked-layer structure of two or more layers having different electric resistances. For example, the electron-injection layer 109 may have one of the following structures: a structure in which a first layer in contact with the electron-transport layer 108R is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108R.

The electrode 552 is formed over the electron-injection layer 109. Note that the electrode 551R and the electrode 552 have an overlap region. The EL layer 103R is positioned between the electrode 551R and the electrode 552. Thus, the electron-injection layer 109 is positioned on the side surfaces (or end portions) of some layers in the EL layer 103R with the insulating layer 107R therebetween, or the electrode 552 is positioned on the side surfaces (or end portions) of some layers in the EL layer 103R with the electron-injection layer 109 and the insulating layer 107R therebetween. Hence, the EL layer 103R and the electrode 552, specifically the hole-injection/transport layer 104R in the EL layer 103R and the electrode 552 can be prevented from being electrically short-circuited.

The EL layer 103R illustrated in FIG. 3A has the same structure as the EL layers 103, 103*a*, 103*b*, and 103*c* described in Embodiment 1. The EL layer 103R is capable of emitting red light, for example.

A space 580 is provided between the EL layer 103B, the EL layer 103G, and the EL layer 103R. In each of the EL layers, particularly the hole-injection layer, which is included in the hole-transport region between the anode and the light-emitting layer, often has high conductivity; therefore, a hole-injection layer formed as a layer shared by adjacent light-emitting devices might lead to crosstalk. Thus, providing the space 580 between the EL layers as shown in this structure example can suppress occurrence of crosstalk between adjacent light-emitting devices.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the space 580 in a high-resolution display panel with more than 1000 ppi, preferably more than 2000 ppi, or further preferably in an ultrahigh-resolution display panel with more than 5000 ppi allows the display panel to express vivid colors.

Figure 3B:
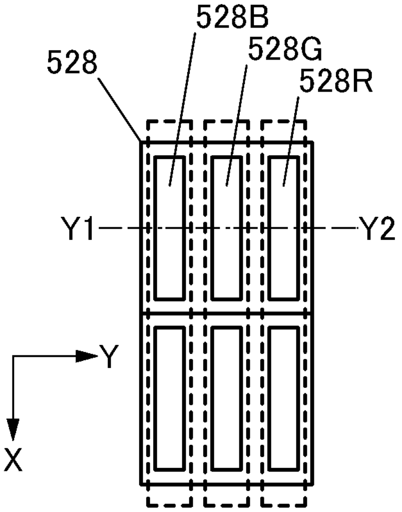

FIG. 3B is a top view of the light-emitting apparatus in FIG. 3A in the X-Y direction, and a Y1-Y2 cross section corresponds to FIG. 3A. As illustrated in FIG. 3B, the partition 528 has an opening 528B, an opening 528G, and an opening 528R. As illustrated in FIG. 3A, the opening 528B overlaps the electrode 551B, the opening 528G overlaps the electrode 551G, and the opening 528R overlaps the electrode 551R.

The EL layers 103B, 103G, and 103R are processed to be separated by patterning using a photolithography method; hence, a high-resolution light-emitting apparatus (display panel) can be fabricated. End portions (side surfaces) of the EL layer (the hole-injection/transport layer, the light-emitting layer, and the electron-transport layer) processed by patterning using a photolithography method have substantially one surface (or are positioned on substantially the same plane). In this case, the space 580 between the EL layers is preferably 5 μm or less, further preferably 1 μm or less.

In the EL layer, particularly the hole-injection layer, which is included in the hole-transport region between the anode and the light-emitting layer, often has high conductivity; therefore, a hole-injection layer formed as a layer shared by adjacent light-emitting devices might lead to crosstalk. Thus, processing the EL layers to be separated by patterning using a photolithography method as shown in this structure example can suppress occurrence of crosstalk between adjacent light-emitting devices.

Example 1 of Method for Manufacturing Light-Emitting Apparatus

Figure 4A:
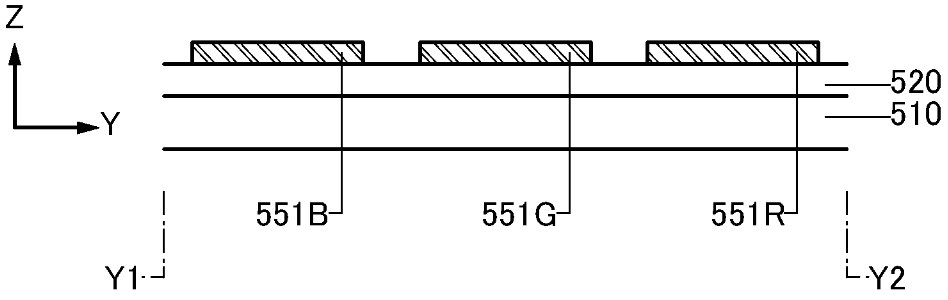
FIGS. 4A and 4B illustrate a method for manufacturing a light-emitting apparatus of an embodiment.

The electrode 551B, the electrode 551G, and the electrode 551R are formed as illustrated in FIG. 4A. For example, a conductive film is formed over the functional layer 520 over the first substrate 510 and processed into predetermined shapes by a photolithography method.

The conductive film can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method includes a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask.

There are two typical processing methods using a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of a thin film using a resist mask, a dry etching method, a wet etching method, a sandblast method, or the like can be used.

Figure 4B:
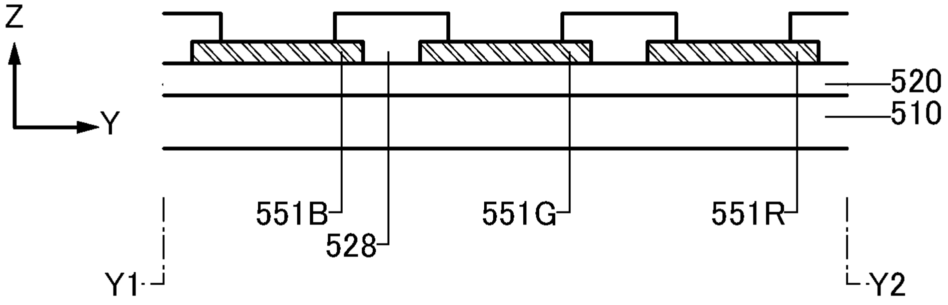

Next, as illustrated in FIG. 4B, the partition 528 is formed between the electrode 551B, the electrode 551G, and the electrode 551R. For example, the partition 528 can be formed in such a manner that an insulating film covering the electrode 551B, the electrode 551G, and the electrode 551R is formed, and openings are formed by a photolithography method to partly expose the electrode 551B, the electrode 551G, and the electrode 551R. Examples of a material that can be used for the partition 528 include an inorganic material, an organic material, and a composite material of an inorganic material and an organic material. Specifically, it is possible to use an inorganic oxide film, an inorganic nitride film, an inorganic oxynitride film, or the like, or a layered material in which two or more films selected from the above are stacked. More specifically, it is possible to use a silicon oxide film, a film containing acrylic, a film containing polyimide, or the like, or a layered material in which two or more films selected from the above are stacked.

Figure 5A:
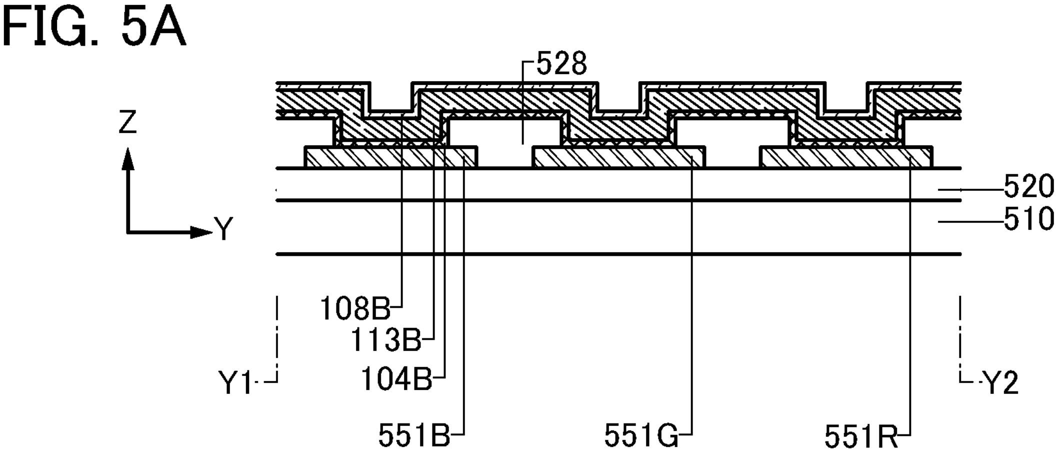
FIGS. 5A to 5C illustrate a method for manufacturing a light-emitting apparatus of an embodiment.

Subsequently, as illustrated in FIG. 5A, the hole-injection/transport layer 104B, the light-emitting layer 113B, and the electron-transport layer 108B are formed over the electrode 551B, the electrode 551G, the electrode 551R, and the partition 528. For example, the hole-injection/transport layer 104B, the light-emitting layer 113B, and the electron-transport layer 108B are formed by a vacuum evaporation method over the electrode 551B, the electrode 551G, the electrode 551R, and the partition 528 so as to cover them.

Figure 5B:
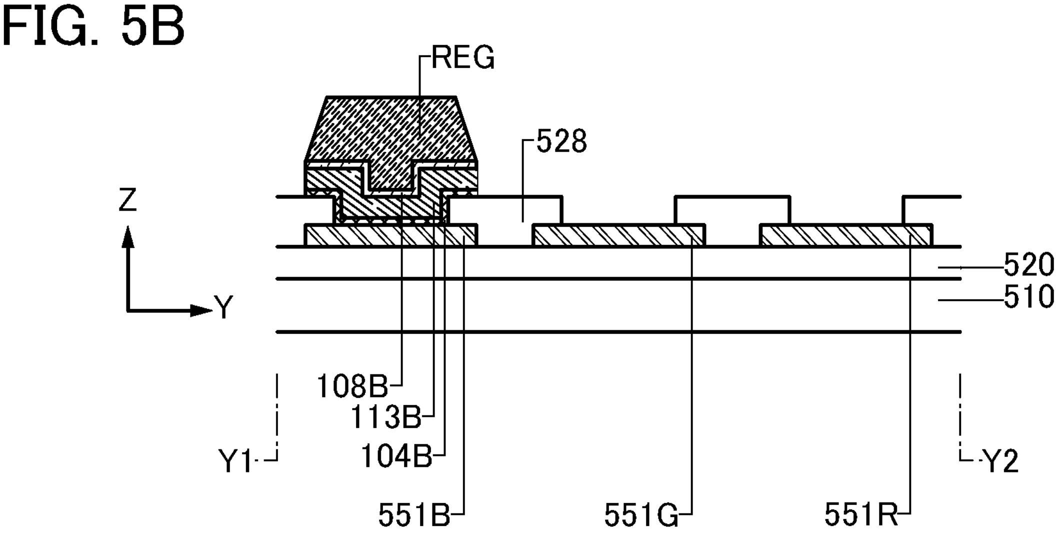

Then, as illustrated in FIG. 5B, the hole-injection/transport layer 104B, the light-emitting layer 113B, and the electron-transport layer 108B over the electrode 551B are processed into predetermined shapes. For example, a resist is formed by a photolithography method, and the hole-injection/transport layer 104B, the light-emitting layer 113B, and the electron-transport layer 108B over the electrode 551G and those over the electrode 551R are removed by etching so that those over the electrode 551B are processed to have side surfaces (or have their side surfaces exposed), that is, have a belt-like shape that extends in the direction intersecting the sheet of the diagram (the X-axis direction). Specifically, dry etching is performed using a resist REG formed over the hole-injection/transport layer 104B, the light-emitting layer 113B, and the electron-transport layer 108B that overlap the electrode 551B (see FIG. 5B). Note that the partition 528 can be used as an etching stopper.

Figure 5C:
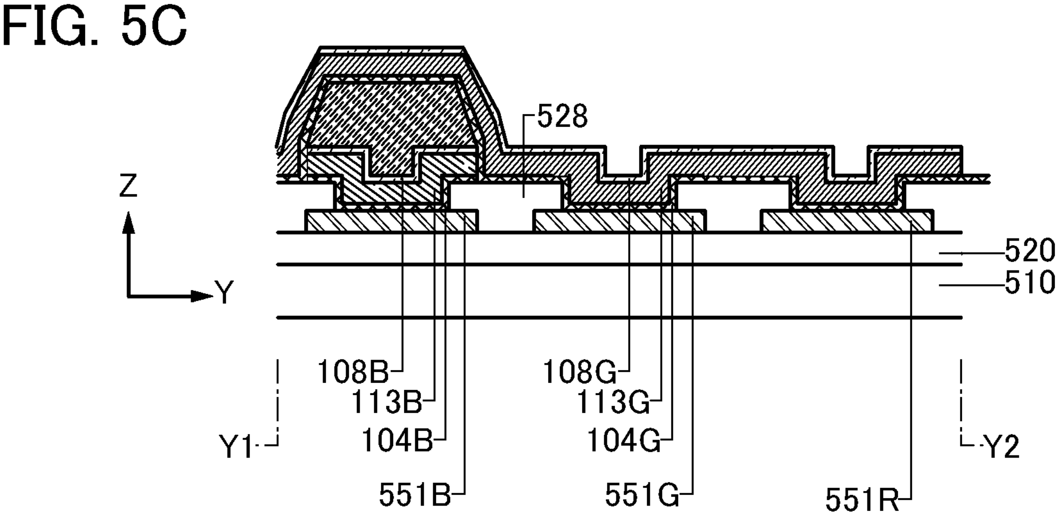

Next, as illustrated in FIG. 5C, with the resist REG remaining, the hole-injection/transport layer 104G, the light-emitting layer 113G, and the electron-transport layer 108G are formed over the resist REG, the electrode 551G, the electrode 551R, and the partition 528. For example, the hole-injection/transport layer 104G, the light-emitting layer 113G, and the electron-transport layer 108G are formed by a vacuum evaporation method over the electrode 551G, the electrode 551R, and the partition 528 so as to cover them.

Figure 6A:
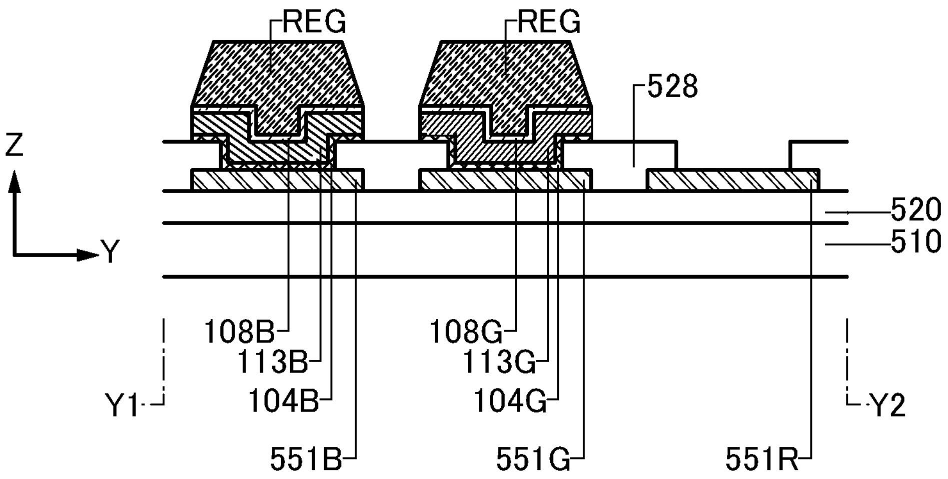
FIGS. 6A to 6C illustrate a method for manufacturing a light-emitting apparatus of an embodiment.

Subsequently, as illustrated in FIG. 6A, the hole-injection/transport layer 104G, the light-emitting layer 113G, and the electron-transport layer 108G over the electrode 551G are processed into predetermined shapes. For example, a resist is formed by a photolithography method over the hole-injection/transport layer 104G, the light-emitting layer 113G, and the electron-transport layer 108G over the electrode 551G; and the hole-injection/transport layer 104G, the light-emitting layer 113G, and the electron-transport layer 108G over the electrode 551B and those over the electrode 551R are removed by etching so that those over the electrode 551G are processed to have side surfaces (or have their side surfaces exposed), that is, have a belt-like shape that extends in the direction intersecting the sheet of the diagram (the X-axis direction). Specifically, dry etching is performed using the resist REG formed over the hole-injection/transport layer 104G, the light-emitting layer 113G, and the electron-transport layer 108G that overlap the electrode 551G. Note that the partition 528 can be used as an etching stopper.

Figure 6B:
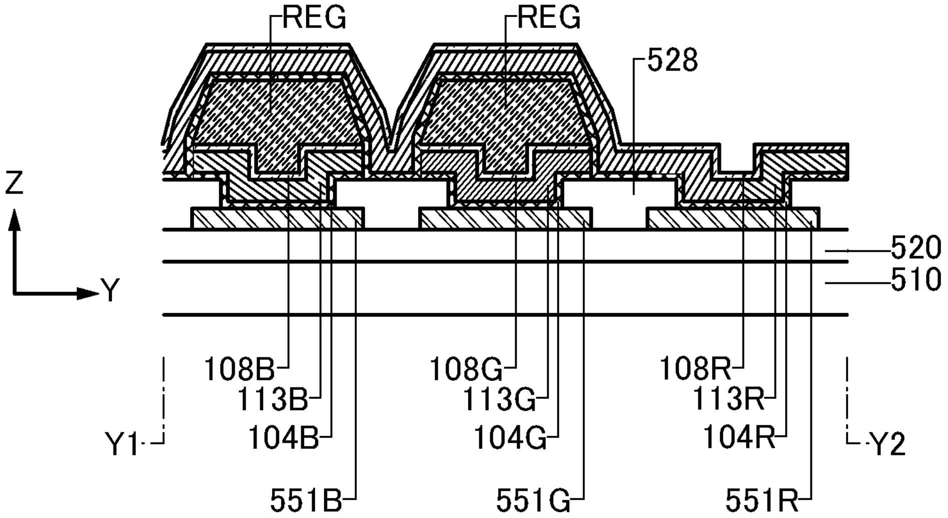

Then, as illustrated in FIG. 6B, with the resist REG remaining over the electrode 551B and the electrode 551G, the hole-injection/transport layer 104R, the light-emitting layer 113R, and the electron-transport layer 108R are formed over the resist REG, the electrode 551R, and the partition 528. For example, the hole-injection/transport layer 104R, the light-emitting layer 113R, and the electron-transport layer 108R are formed by a vacuum evaporation method over the electrode 551R, the resist REG, and the partition 528 so as to cover them.

Figure 6C:
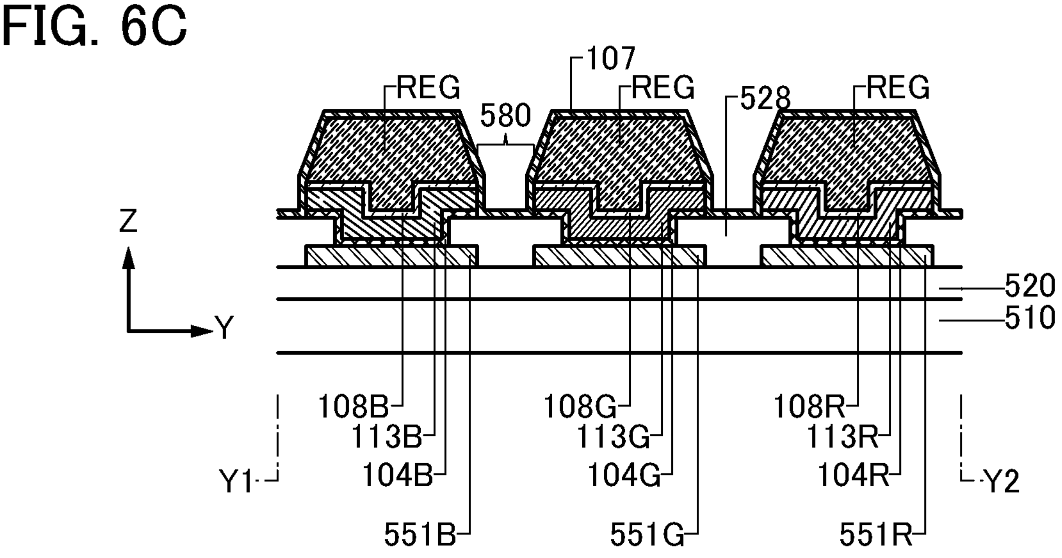

Next, as illustrated in FIG. 6C, the hole-injection/transport layer 104R, the light-emitting layer 113R, and the electron-transport layer 108R over the electrode 551R are processed into predetermined shapes. For example, a resist is formed by a photolithography method over the hole-injection/transport layer 104R, the light-emitting layer 113R, and the electron-transport layer 108R over the electrode 551R; and the hole-injection/transport layer 104R, the light-emitting layer 113R, and the electron-transport layer 108R over the electrode 551B and those over the electrode 551G are removed so that those over the electrode 551R are processed to have side surfaces (or have their side surfaces exposed), that is, have a belt-like shape that extends in the direction intersecting the sheet of the diagram (the X-axis direction). Specifically, dry etching is performed using the resist REG formed over the hole-injection/transport layer 104R, the light-emitting layer 113R, and the electron-transport layer 108R that overlap the electrode 551R. Note that the partition 528 can be used as an etching stopper.

Preferably, the hole-injection/transport layer 104B, the light-emitting layer 113B, and the electron-transport layer 108B are firstly formed over the electrode 551B, then the hole-injection/transport layer 104G, the light-emitting layer 113G, and the electron-transport layer 108G are formed over the electrode 551G, and lastly the hole-injection/transport layer 104R, the light-emitting layer 113R, and the electron-transport layer 108R are formed over the electrode 551R, as illustrated in FIGS. 5A to 5C and FIGS. 6A to 6C.

In the above steps, when the hole-injection/transport layer 104B, the light-emitting layer 113B, and the electron-transport layer 108B over the electrode 551G and those over the electrode 551R are removed by etching, the surfaces of the electrode 551G and the electrode 551R are also exposed to the etching gas. When the hole-injection/transport layer 104G, the light-emitting layer 113G, and the electron-transport layer 108G over the electrode 551R are removed by etching, the surface of the electrode 551R is also exposed to the etching gas. Consequently, the surface of the electrode 551B is not exposed to the etching gas, whereas the surface of the electrode 551G is exposed to the etching gas once and the surface of the electrode 551R is exposed to the etching gas twice.

The surface of an electrode might be damaged by being exposed to the etching gas. Furthermore, a light-emitting device formed using an electrode whose surface is damaged might have degraded characteristics. Note that the degree of influence of the surface state of an electrode on the characteristics of a light-emitting device depends on the structure, materials, and the like of the light-emitting device. Among the light-emitting device 550B, the light-emitting device 550G, and the light-emitting device 550R, the light-emitting device 550B is most likely to be affected by the surface state of the electrode.

Accordingly, forming the hole-injection/transport layer 104B, the light-emitting layer 113B, and the electron-transport layer 108B over the electrode 551B firstly can prevent the surface of the electrode 551B from being exposed to the etching gas; hence, the characteristics of the light-emitting device 550B, which is most likely affected by the surface state of the electrode, can be prevented from deteriorating.

Next, the insulating layer 107 is formed over the resist REG, the hole-injection/transport layer 104B, the light-emitting layer 113B, the electron-transport layer 108B, the hole-injection/transport layer 104G, the light-emitting layer 113G, the electron-transport layer 108G, the hole-injection/transport layer 104R, the light-emitting layer 113R, the electron-transport layer 108R, and the partition 528. For example, the insulating layer 107 is formed by an ALD method over the resist REG, the hole-injection/transport layer 104B, the light-emitting layer 113B, the electron-transport layer 108B, the hole-injection/transport layer 104G, the light-emitting layer 113G, the electron-transport layer 108G, the hole-injection/transport layer 104R, the light-emitting layer 113R, the electron-transport layer 108R, and the partition 528 so as to cover them. In this case, the insulating layer 107 is formed in contact with the side surfaces of the hole-injection/transport layer 104B, the light-emitting layer 113B, the electron-transport layer 108B, the hole-injection/transport layer 104G, the light-emitting layer 113G, the electron-transport layer 108G, the hole-injection/transport layer 104R, the light-emitting layer 113R, and the electron-transport layer 108R, as illustrated in FIG. 6C. This can inhibit entry of oxygen, moisture, or constituent elements thereof into the inside through the side surfaces of the hole-injection/transport layer 104B, the light-emitting layer 113B, the electron-transport layer 108B, the hole-injection/transport layer 104G, the light-emitting layer 113G, the electron-transport layer 108G, the hole-injection/transport layer 104R, the light-emitting layer 113R, and the electron-transport layer 108R. Examples of the material for the insulating layer 107 include aluminum oxide, magnesium oxide, hafnium oxide, gallium oxide, indium gallium zinc oxide, silicon nitride, and silicon nitride oxide.

Figure 7A:
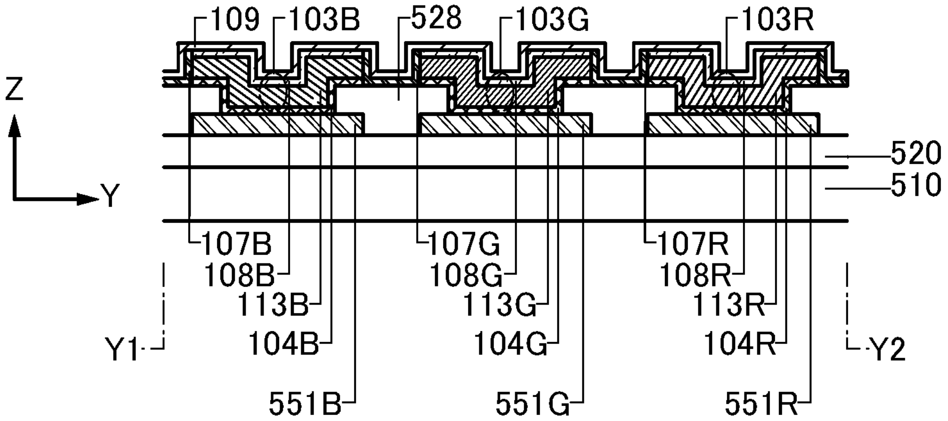
FIGS. 7A and 7B illustrate a method for manufacturing a light-emitting apparatus of an embodiment.

Then, as illustrated in FIG. 7A, the resist REG is removed, and the electron-injection layer 109 is formed over the insulating layers (107B, 107G, and 107R) and the electron-transport layers (108B, 108G, and 108R). The electron-injection layer 109 is formed by a vacuum evaporation method, for example. Note that the electron-injection layer 109 is positioned on the side surfaces of some layers (including the hole-injection/transport layers (104R, 104G, and 104B), the light-emitting layers (113B, 113G, and 113R), and the electron-transport layers (108B, 108G, and 108R)) in the EL layers (103B, 103G, and 103R) with the insulating layers (107B, 107G, and 107R) therebetween.

Figure 7B:
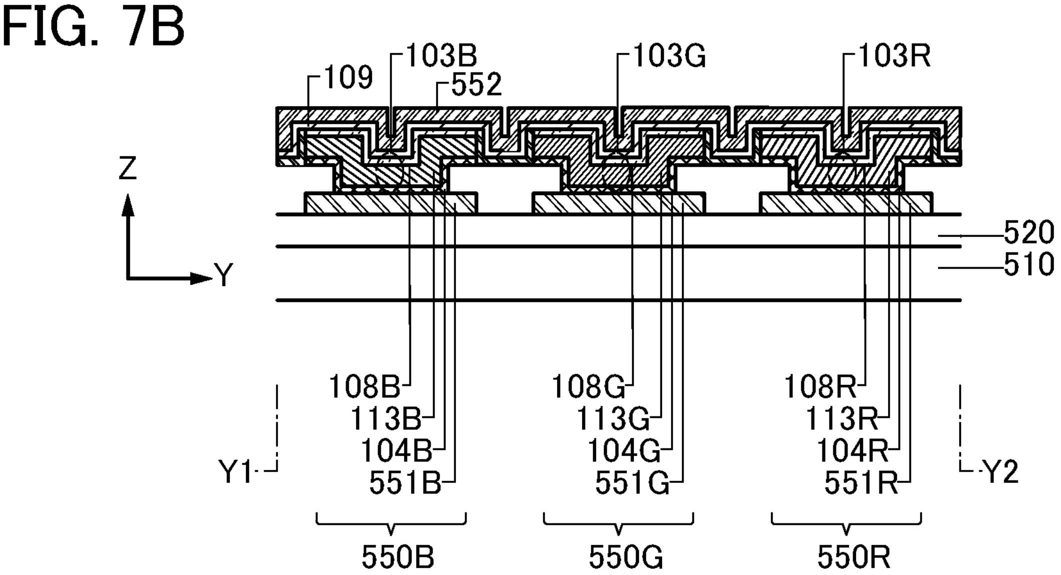

Next, as illustrated in FIG. 7B, the electrode 552 is formed. The electrode 552 is formed by a vacuum evaporation method, for example. The electrode 552 is formed over the electron-injection layer 109. Note that the electrode 552 is positioned on the side surfaces (or end portions) of some layers (including the hole-injection/transport layers (104R, 104G, and 104B), the light-emitting layers (113B, 113G, and 113R), and the electron-transport layers (108B, 108G, and 108R)) in the EL layers (103B, 103G, and 103R) with the electron-injection layer 109 and the insulating layers (107B, 107G, and 107R) therebetween. Thus, the EL layers (103B, 103G, and 103R) and the electrode 552, specifically the hole-injection/transport layers (104B, 104G, and 104R) in the EL layers (103B, 103G, and 103R) and the electrode 552 can be prevented from being electrically short-circuited.

Through the above steps, the EL layer 103B, the EL layer 103G, and the EL layer 103R in the light-emitting device 550B, the light-emitting device 550G, and the light-emitting device 550R can be processed to be separated from each other.

The EL layers 103B, 103G, and 103R are processed to be separated by patterning using a photolithography method; hence, a high-resolution light-emitting apparatus (display panel) can be fabricated. End portions (side surfaces) of the EL layer (the hole-injection/transport layer, the light-emitting layer, and the electron-transport layer) processed by patterning using a photolithography method have substantially one surface (or are positioned on substantially the same plane).

In the EL layer, particularly the hole-injection layer, which is included in the hole-transport region between the anode and the light-emitting layer, often has high conductivity; therefore, a hole-injection layer formed as a layer shared by adjacent light-emitting devices might lead to crosstalk. Thus, processing the EL layers to be separated by patterning using a photolithography method as shown in this structure example can suppress occurrence of crosstalk between adjacent light-emitting devices.

Structure Example 2 of Light-Emitting Apparatus 700

Figure 8:
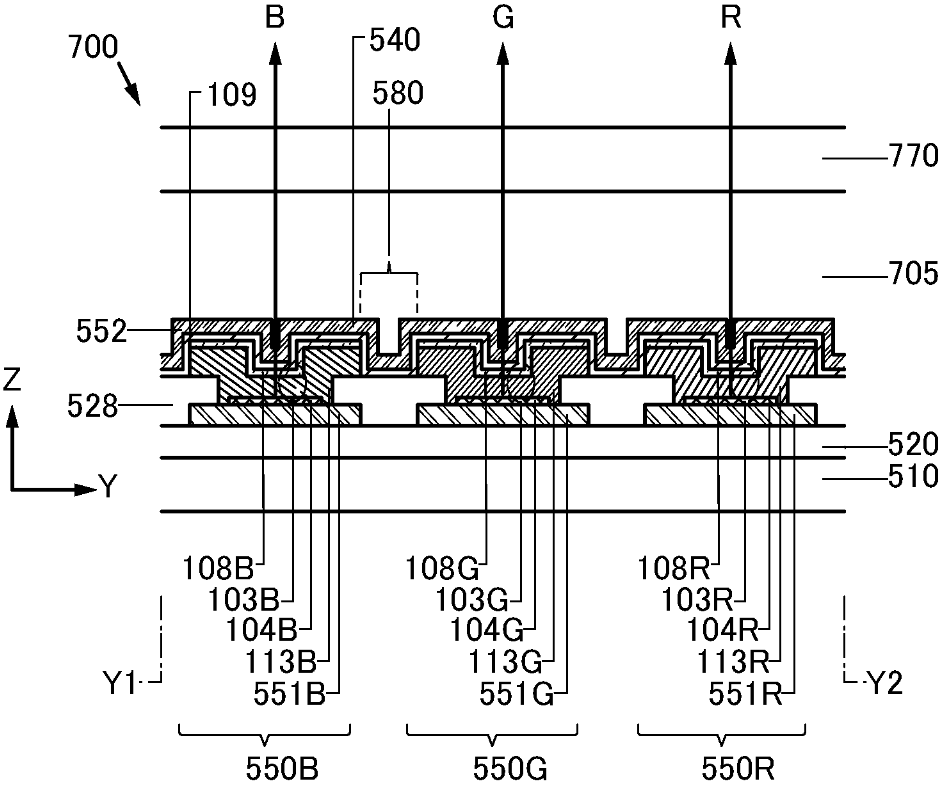
FIG. 8 illustrates a light-emitting apparatus of an embodiment.

The light-emitting apparatus 700 illustrated in FIG. 8 includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. Specifically, the case is described in which the EL layer 103 in the structure illustrated in FIG. 2A differs between the light-emitting devices.

Note that specific structures of the light-emitting devices illustrated in FIG. 8 are the same as the structures of the light-emitting devices 550B, 550G, and 550R described using FIGS. 3A and 3B.

As illustrated in FIG. 8, the hole-injection/transport layers (104B, 104G, and 104R) in the EL layers (103B, 103G, and 103R) of the light-emitting devices (550B, 550G, and 550R) are smaller than the other functional layers in the EL layers (103B, 103G, and 103R) and are covered with the functional layers stacked over the hole-injection/transport layers.

In this structure, the hole-injection/transport layers (104B, 104G, and 104R) in the EL layers are completely separated from each other by being covered with the other functional layers; thus, the insulating layer 107 for preventing a short circuit between the hole-injection/transport layers and the electrode 552, which is described in Structure example 1 (see FIG. 3A), is unnecessary.

The EL layers in this structure (the EL layers 103B, 103G, and 103R) are processed to be separated by patterning using a photolithography method; hence, end portions (side surfaces) of the processed EL layers (light-emitting layers and electron-transport layers) have substantially one surface (or are positioned on substantially the same plane).

In the EL layer, particularly the hole-injection layer, which is included in the hole-transport region between the anode and the light-emitting layer, often has high conductivity; thus, a hole-injection layer formed as a layer shared by adjacent light-emitting devices might lead to crosstalk. Therefore, processing the EL layers to be separated by patterning using a photolithography method as shown in this structure example can suppress occurrence of crosstalk between adjacent light-emitting devices.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a combination of white light-emitting devices and coloring layers (e.g., color filters) achieves a full-color display apparatus.

Structures of light-emitting devices can be classified roughly into a single structure and a tandem structure. A device having a single structure includes one EL layer between a pair of electrodes, and the EL layer preferably includes one or more light-emitting layers. To obtain white light emission, two or more light-emitting layers that emit light of complementary colors are selected. For example, when emission colors of a first light-emitting layer and a second light-emitting layer are complementary colors, a light-emitting device can be configured to emit white light as a whole. The same applies to a light-emitting device including three or more light-emitting layers.

A device having a tandem structure includes two or more EL layers between a pair of electrodes, and each of the EL layers preferably includes one or more light-emitting layers. White light emission is obtained by combining light from the light-emitting layers in a plurality of EL layers. Note that a structure for obtaining white light emission is similar to that in the case of a single structure. In a device having a tandem structure, an intermediate layer such as a charge-generation layer is preferably provided between a plurality of EL layers.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

Structure Example 3 of Light-Emitting Apparatus 700

Figure 9A:
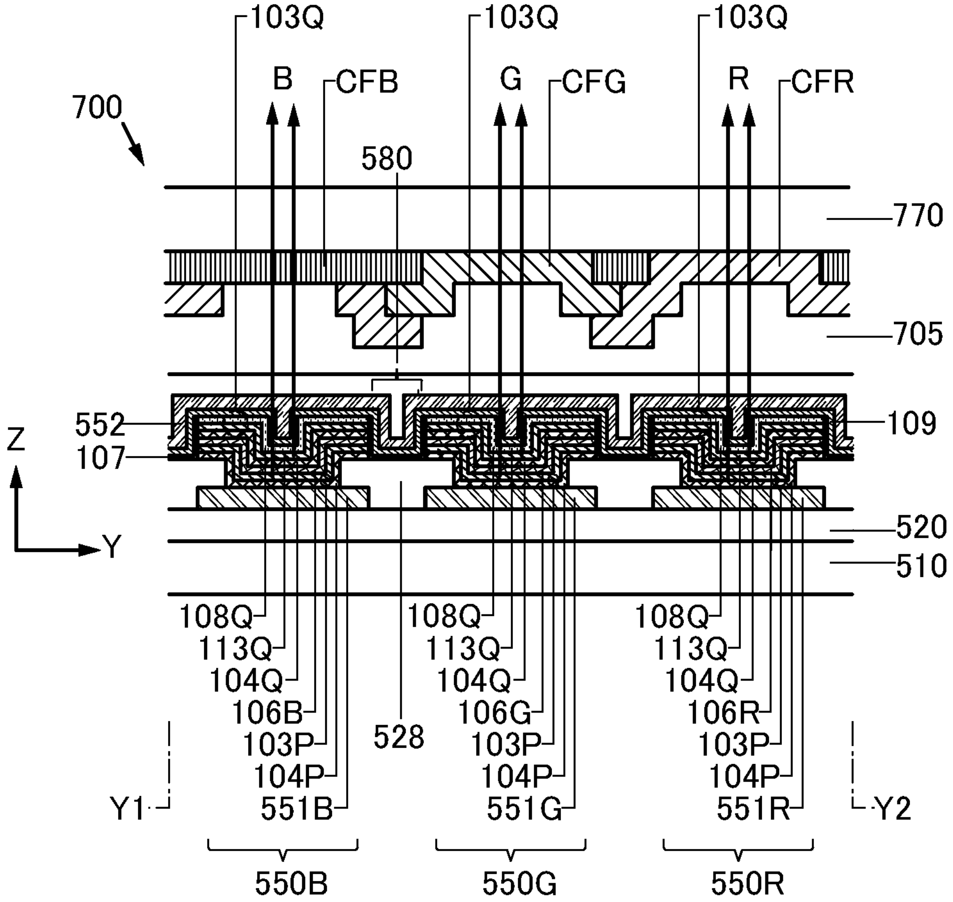
FIGS. 9A and 9B each illustrate a light-emitting apparatus and a light-emitting device of an embodiment.

The light-emitting apparatus 700 illustrated in FIG. 9A includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. Specifically, the light-emitting devices share the EL layer 103 having the structure illustrated in FIG. 2B, i.e., a tandem structure.

The light-emitting device 550B has a stacked-layer structure illustrated in FIG. 9A, which includes the electrode 551B, the electrode 552, EL layers (103P and 103Q), a charge-generation layer 106B, and the insulating layer 107. Note that a specific structure of each layer is as described in Embodiment 1. The electrode 551B and the electrode 552 overlap each other. The EL layer 103P and the EL layer 103Q are stacked with the charge-generation layer 106B therebetween, and the EL layer 103P, the EL layer 103Q, and the charge-generation layer 106B are positioned between the electrode 551B and the electrode 552. Note that each of the EL layers 103P and 103Q has a stacked-layer structure of layers having different functions including a light-emitting layer, like the EL layers 103, 103*a*, 103*b*, and 103*c* described in Embodiment 1. The EL layer 103P is capable of emitting blue light, for example, and the EL layer 103Q is capable of emitting yellow light, for example.

FIG. 9A illustrates only a hole-injection/transport layer 104P among the layers included in the EL layer 103P and a hole-injection/transport layer 104Q, a light-emitting layer 113Q, an electron-transport layer 108Q, and the electron-injection layer 109 among the layers included in the EL layer 103Q; however, one embodiment of the present invention is not limited thereto. In the following description, the term "EL layer" (the EL layer 103P and the EL layer 103Q) may be used for convenience to describe the layers included in the EL layer as well. The electron-transport layer may have a stacked-layer structure, and may include a hole-blocking layer for blocking holes that move from the anode side to the cathode side through the light-emitting layer. The electron-injection layer 109 may have a stacked-layer structure in which some or all of layers are formed using different materials.

As illustrated in FIG. 9A, the insulating layer 107 is formed while a resist formed over some layers in the EL layer 103Q (in this embodiment, the layers up to the electron-transport layer 108Q over the light-emitting layer 113Q) remains over the electrode 551B. Thus, the insulating layer 107 is formed in contact with side surfaces (or end portions) of the above layers in the EL layer 103Q, the EL layer 103P, and the charge-generation layer 106B. Accordingly, it is possible to inhibit entry of oxygen, moisture, or constituent elements thereof into the inside through the side surfaces of the EL layer 103P, the EL layer 103Q, and the charge-generation layer 106B. For the insulating layer 107, aluminum oxide, magnesium oxide, hafnium oxide, gallium oxide, indium gallium zinc oxide, silicon nitride, or silicon nitride oxide can be used, for example. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103Q (the layers up to the electron-transport layer 108Q over the light-emitting layer 113Q) and the insulating layer 107. The electron-injection layer 109 preferably has a stacked-layer structure of two or more layers having different electric resistances. For example, the electron-injection layer 109 may have one of the following structures: a structure in which a first layer in contact with the electron-transport layer 108Q is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108Q.

The electrode 552 is formed over the electron-injection layer 109. Note that the electrode 551B and the electrode 552 have an overlap region. The EL layer 103P, the EL layer 103Q, and the charge-generation layer 106B are positioned between the electrode 551B and the electrode 552. Thus, the electron-injection layer 109 is positioned on the side surfaces (or end portions) of the EL layer 103Q, the EL layer 103P, and the charge-generation layer 106B with the insulating layer 107 therebetween, or the electrode 552 is positioned on the side surfaces (or end portions) of the EL layer 103Q, the EL layer 103P, and the charge-generation layer 106B with the electron-injection layer 109 and the insulating layer 107 therebetween. Consequently, the EL layer 103P and the electrode 552, specifically the hole-injection/transport layer 104P in the EL layer 103P and the electrode 552 can be prevented from being electrically short-circuited. In addition, the EL layer 103Q and the electrode 552, specifically the hole-injection/transport layer 104Q in the EL layer 103Q and the electrode 552 can be prevented from being electrically short-circuited. Moreover, the charge-generation layer 106B and the electrode 552 can be prevented from being electrically short-circuited.

The light-emitting device 550G has a stacked-layer structure illustrated in FIG. 9A, which includes the electrode 551G, the electrode 552, the EL layers (103P and 103Q), a charge-generation layer 106G, and the insulating layer 107. Note that a specific structure of each layer is as described in Embodiment 1. The electrode 551G and the electrode 552 overlap each other. The EL layer 103P and the EL layer 103Q are stacked with the charge-generation layer 106G therebetween, and the EL layer 103P, the EL layer 103Q, and the charge-generation layer 106G are positioned between the electrode 551G and the electrode 552.

As illustrated in FIG. 9A, the insulating layer 107 is formed while a resist formed over some layers in the EL layer 103Q (in this embodiment, the layers up to the electron-transport layer 108Q over the light-emitting layer 113Q) remains over the electrode 551G. Thus, the insulating layer 107 is formed in contact with side surfaces (or end portions) of the above layers in the EL layer 103Q, the EL layer 103P, and the charge-generation layer 106G. Accordingly, it is possible to inhibit entry of oxygen, moisture, or constituent elements thereof into the inside through the side surfaces of the EL layer 103P, the EL layer 103Q, and the charge-generation layer 106G. For the insulating layer 107, aluminum oxide, magnesium oxide, hafnium oxide, gallium oxide, indium gallium zinc oxide, silicon nitride, or silicon nitride oxide can be used, for example. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103Q (the layers up to the electron-transport layer 108Q over the light-emitting layer 113Q) and the insulating layer 107. The electron-injection layer 109 preferably has a stacked-layer structure of two or more layers having different electric resistances. For example, the electron-injection layer 109 may have one of the following structures: a structure in which a first layer in contact with the electron-transport layer 108Q is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108Q.

The electrode 552 is formed over the electron-injection layer 109. Note that the electrode 551G and the electrode 552 have an overlap region. The EL layer 103P, the EL layer 103Q, and the charge-generation layer 106G are positioned between the electrode 551G and the electrode 552. Thus, the electron-injection layer 109 is positioned on the side surfaces (or end portions) of the EL layer 103Q, the EL layer 103P, and the charge-generation layer 106G with the insulating layer 107 therebetween, or the electrode 552 is positioned on the side surfaces (or end portions) of the EL layer 103Q, the EL layer 103P, and the charge-generation layer 106G with the electron-injection layer 109 and the insulating layer 107 therebetween. Consequently, the EL layer 103P and the electrode 552, specifically the hole-injection/transport layer 104P in the EL layer 103P and the electrode 552 can be prevented from being electrically short-circuited. In addition, the EL layer 103Q and the electrode 552, specifically the hole-injection/transport layer 104Q in the EL layer 103Q and the electrode 552 can be prevented from being electrically short-circuited. Moreover, the charge-generation layer 106G and the electrode 552 can be prevented from being electrically short-circuited.

The light-emitting device 550R has a stacked-layer structure illustrated in FIG. 9A, which includes the electrode 551R, the electrode 552, the EL layers (103P and 103Q), a charge-generation layer 106R, and the insulating layer 107. Note that a specific structure of each layer is as described in Embodiment 1. The electrode 551R and the electrode 552 overlap each other. The EL layer 103P and the EL layer 103Q are stacked with the charge-generation layer 106R therebetween, and the EL layer 103P, the EL layer 103Q, and the charge-generation layer 106R are positioned between the electrode 551R and the electrode 552.

As illustrated in FIG. 9A, the insulating layer 107 is formed while a resist formed over some layers in the EL layer 103Q (in this embodiment, the layers up to the electron-transport layer 108Q over the light-emitting layer 113Q) remains over the electrode 551R. Thus, the insulating layer 107 is formed in contact with side surfaces (or end portions) of the above layers in the EL layer 103Q, the EL layer 103P, and the charge-generation layer 106R. Accordingly, it is possible to inhibit entry of oxygen, moisture, or constituent elements thereof into the inside through the side surfaces of the EL layer 103P, the EL layer 103Q, and the charge-generation layer 106R. For the insulating layer 107, aluminum oxide, magnesium oxide, hafnium oxide, gallium oxide, indium gallium zinc oxide, silicon nitride, or silicon nitride oxide can be used, for example. The insulating layer 107 can be formed by a sputtering method, a CVD method, an MBE method, a PLD method, an ALD method, or the like and is formed preferably by an ALD method, which achieves favorable coverage.

The electron-injection layer 109 is formed to cover some layers in the EL layer 103Q (the layers up to the electron-transport layer 108Q over the light-emitting layer 113Q) and the insulating layer 107. The electron-injection layer 109 preferably has a stacked-layer structure of two or more layers having different electric resistances. For example, the electron-injection layer 109 may have one of the following structures: a structure in which a first layer in contact with the electron-transport layer 108Q is formed using only an electron-transport material, and a second layer formed using an electron-transport material containing a metal material is stacked over the first layer; or the aforementioned structure including a third layer formed using an electron-transport material containing a metal material, between the first layer and the electron-transport layer 108Q.

The electrode 552 is formed over the electron-injection layer 109. Note that the electrode 551R and the electrode 552 have an overlap region. The EL layer 103P, the EL layer 103Q, and the charge-generation layer 106R are positioned between the electrode 551R and the electrode 552. Thus, the electron-injection layer 109 is positioned on the side surfaces (or end portions) of the EL layer 103Q, the EL layer 103P, and the charge-generation layer 106R with the insulating layer 107 therebetween, or the electrode 552 is positioned on the side surfaces (or end portions) of the EL layer 103Q, the EL layer 103P, and the charge-generation layer 106R with the electron-injection layer 109 and the insulating layer 107 therebetween. Consequently, the EL layer 103P and the electrode 552, specifically the hole-injection/transport layer 104P in the EL layer 103P and the electrode 552 can be prevented from being electrically short-circuited. In addition, the EL layer 103Q and the electrode 552, specifically the hole-injection/transport layer 104Q in the EL layer 103Q and the electrode 552 can be prevented from being electrically short-circuited. Moreover, the charge-generation layer 106R and the electrode 552 can be prevented from being electrically short-circuited.

The EL layers (103P and 103Q) and the charge-generation layers (106B, 106G, and 106R) included in the light-emitting devices are processed to be separated between the light-emitting devices by patterning using a photolithography method; hence, the end portions (side surfaces) of the processed EL layers (EL layer 103P, hole-injection/transport layer 104Q, light-emitting layer 113Q, and electron-transport layer 108Q) and the processed charge-generation layers 106 have substantially one surface (or are positioned on substantially the same plane).

The space 580 is provided between the EL layers (103P and 103Q) and the charge-generation layer (106B, 106G, or 106R) in one light-emitting device and those in the adjacent light-emitting device. The charge-generation layers (106B, 106G, and 106R) and the hole-injection layer included in the hole-transport region in the EL layers (103P and 103Q) often have high conductivity; therefore, these layers formed as layers shared by adjacent light-emitting devices might lead to crosstalk. Thus, providing the space 580 as shown in this structure example can suppress occurrence of crosstalk between adjacent light-emitting devices.

When electrical continuity is established between the EL layer 103B, the EL layer 103G, and the EL layer 103R in a light-emitting apparatus (display panel) with a high resolution exceeding 1000 ppi, crosstalk occurs, resulting in a narrower color gamut that the light-emitting apparatus is capable of reproducing. Providing the space 580 in a high-resolution display panel with more than 1000 ppi, preferably more than 2000 ppi, or further preferably in an ultrahigh-resolution display panel with more than 5000 ppi allows the display panel to express vivid colors.

In this structure example, the light-emitting device 550B, the light-emitting device 550G, and the light-emitting device 550R each emit white light. Accordingly, the second substrate 770 includes a coloring layer CFB, a coloring layer CFG, and a coloring layer CFR. Note that these coloring layers may be provided to partly overlap each other as illustrated in FIG. 9A. When the coloring layers partly overlap each other, the overlap portion can function as a light-blocking film. In this structure example, a material that preferentially transmits blue light (B) is used for the coloring layer CFB, a material that preferentially transmits green light (G) is used for the coloring layer CFG, and a material that preferentially transmits red light (R) is used for the coloring layer CFR, for example.

Figure 9B:
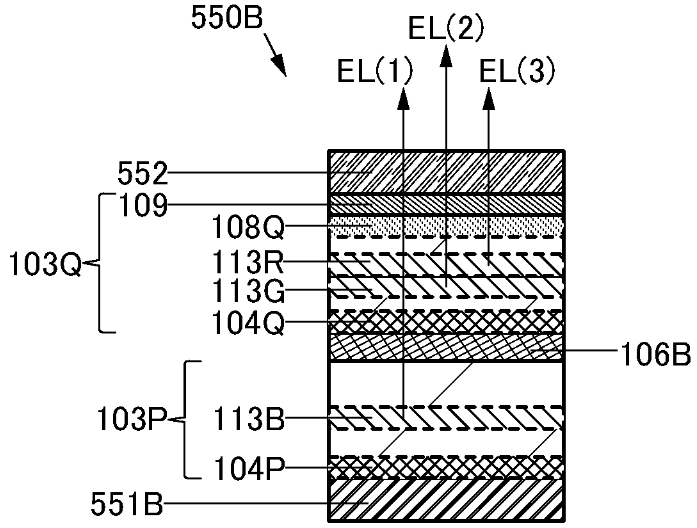

FIG. 9B illustrates a structure of the light-emitting device 550B in the case where each of the light-emitting devices 550B, 550G, and 550R is a light-emitting device that emits white light. The EL layer 103P and the EL layer 103Q are stacked over the electrode 551B, with the charge-generation layer 106B therebetween. The EL layer 103P includes the light-emitting layer 113B that emits blue light EL(1), and the EL layer 103Q includes the light-emitting layer 113G that emits green light EL(2) and the light-emitting layer 113R that emits red light EL(3).

Note that a color conversion layer can be used instead of the coloring layer. For example, nanoparticles or quantum dots can be used for the color conversion layer.

For example, a color conversion layer that converts blue light into green light can be used instead of the coloring layer CFG. Thus, blue light emitted from the light-emitting device 550G can be converted into green light. Moreover, a color conversion layer that converts blue light into red light can be used instead of the coloring layer CFR. Thus, blue light emitted from the light-emitting device 550R can be converted into red light.

Structure Example 4 of Light-Emitting Apparatus 700

Figure 10:
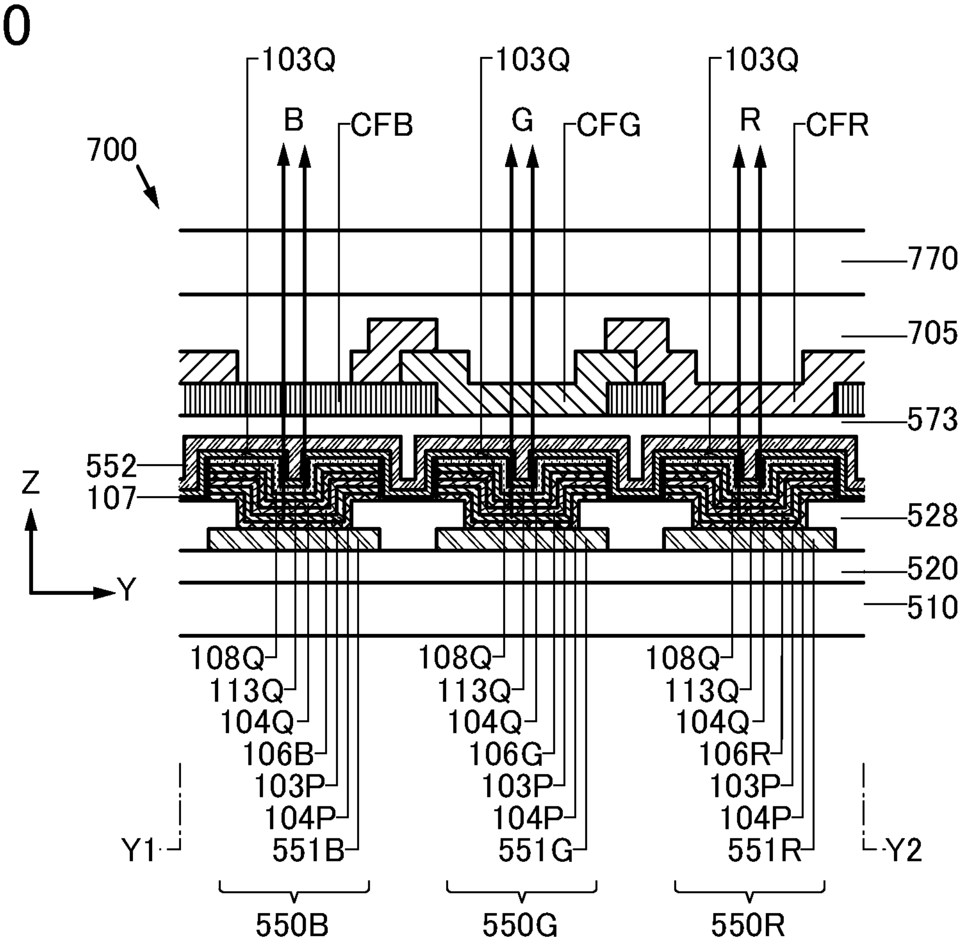
FIG. 10 illustrates a light-emitting apparatus of an embodiment.

The light-emitting apparatus (display panel) 700 illustrated in FIG. 10 includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. This is suitable particularly for the case where the light-emitting devices share the EL layer 103 having the structure illustrated in FIG. 2B, i.e., a tandem structure.

Note that specific structures of the light-emitting devices illustrated in FIG. 10 are the same as the structures of the light-emitting devices 550B, 550G, and 550R described using FIG. 9A, and each of the light-emitting devices emits white light.

The light-emitting apparatus in this structure example is different from the light-emitting apparatus illustrated in FIG. 9A in including the coloring layer CFB, the coloring layer CFG, and the coloring layer CFR formed over the light-emitting devices over the first substrate 510.

In other words, an insulating layer 573 is provided over the electrode 552 of each light-emitting device formed over the first substrate 510, and the coloring layer CFB, the coloring layer CFG, and the coloring layer CFR are provided over the insulating layer 573.

The insulating layer 705 is provided over the coloring layer CFB, the coloring layer CFG, and the coloring layer CFR. The insulating layer 705 includes a region sandwiched between the second substrate 770 and the first substrate 510 on the side closer to the coloring layers (CFB, CFG, and CFR), which is provided with the functional layer 520, the light-emitting devices (550B, 550G, and 550R), and the coloring layers CFB, CFG, and CFR. The insulating layer 705 has a function of attaching the first substrate 510 and the second substrate 770.

For the insulating layer 573 and the insulating layer 705, an inorganic material, an organic material, a composite material of an inorganic material and an organic material, or the like can be used.

As the inorganic material, an inorganic oxide film, an inorganic nitride film, an inorganic oxynitride film, and the like, or a layered material obtained by stacking some of these films can be used. For example, a film including any of a silicon oxide film, a silicon nitride film, a silicon oxynitride film, an aluminum oxide film, and the like, or a film including a material obtained by stacking any of these films can be used. Note that a silicon nitride film is a dense film and has an excellent function of inhibiting diffusion of impurities. Alternatively, for an oxide semiconductor (e.g., an IGZO film), a stacked-layer structure of an aluminum oxide film and an IGZO film over the aluminum oxide film, for example, can be used.

As the organic material, polyester, polyolefin, polyamide, polyimide, polycarbonate, polysiloxane, acrylic, and the like, or a layered material or a composite material including two or more of resins selected from the above can be used. Alternatively, an organic material such as a reactive curable adhesive, a photo-curable adhesive, a thermosetting adhesive, and/or an anaerobic adhesive can be used.

Example 2 of Method for Manufacturing Light-Emitting Apparatus

Next, a method for manufacturing the light-emitting apparatus illustrated in FIG. will be described with reference to FIGS. 11A to 11C and FIGS. 12A and 12B.

Figure 11A:
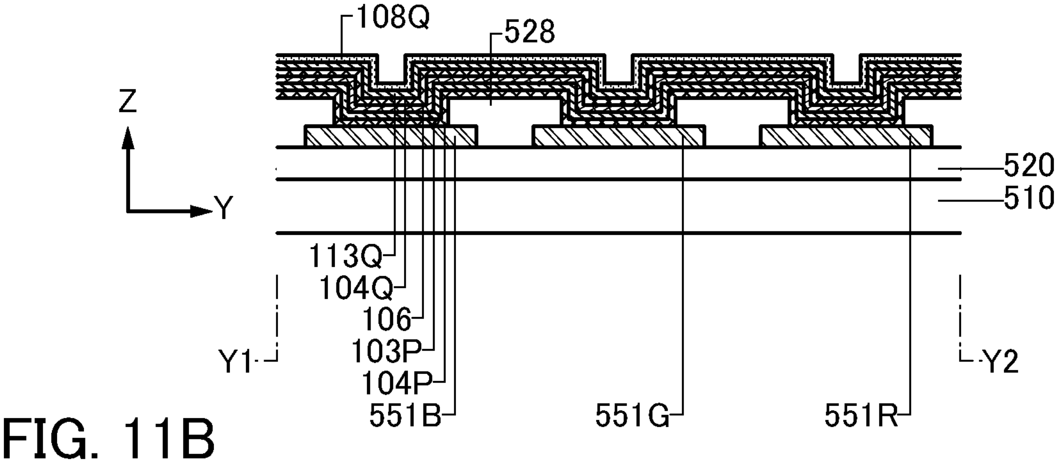
FIGS. 11A to 11C illustrate a method for manufacturing a light-emitting apparatus of an embodiment.

As illustrated in FIG. 11A, over the electrodes (551B, 551G, and 551R) and the partition 528 (see FIG. 4B) formed over the first substrate 510, the EL layer 103P (including the hole-injection/transport layer 104P), the charge-generation layer 106 to be charge-generation layers 106B, 106G, and 106R, the hole-injection/transport layer 104Q, the light-emitting layer 113Q, and the electron-transport layer 108Q are formed so as to cover the electrodes and the partition 528.

Figure 11B:
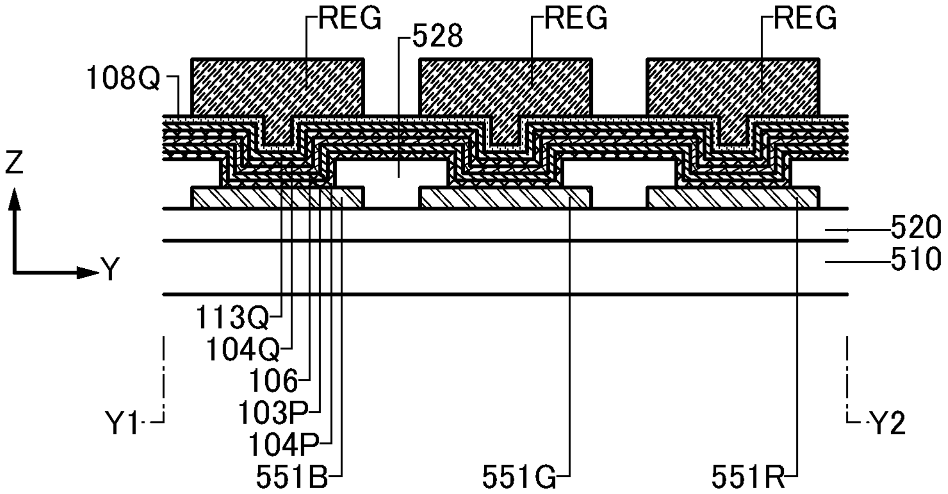

Next, as illustrated in FIG. 11B, the EL layer 103P (including the hole-injection/transport layer 104P), the charge-generation layer 106, the hole-injection/transport layer 104Q, the light-emitting layer 113Q, and the electron-transport layer 108Q over the electrodes (551B, 551G, and 551R) are processed into predetermined shapes. For example, the resists REG are formed by a photolithography method over the hole-injection/transport layer 104Q, the light-emitting layer 113Q, and the electron-transport layer 108Q over the electrodes (551B, 551G, and 551R); and portions over which the resists REG are not formed are removed by etching so that the remaining portions are processed to have side surfaces (or have their side surfaces exposed), that is, have a belt-like shape that extends in the direction intersecting the sheet of the diagram (the X-axis direction). Specifically, dry etching is performed using the resists REG formed over the electron-transport layer 108Q (see FIG. 11C). Note that the partition 528 can be used as an etching stopper.

Figure 11C:
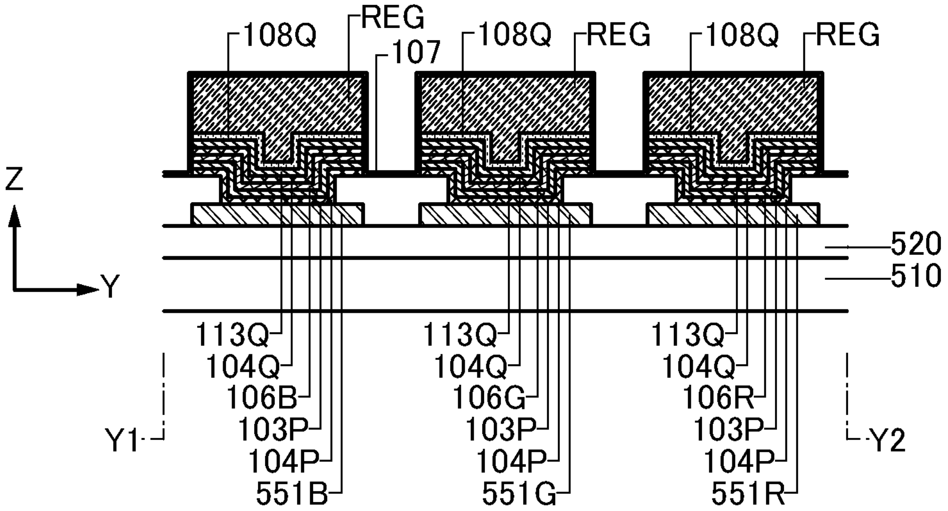

Then, the insulating layer 107 is formed over the resists REG, the EL layer 103P, the charge-generation layers (106B, 106G, and 106R), the hole-injection/transport layer 104Q, the light-emitting layer 113Q, the electron-transport layer 108Q, and the partition 528. For example, the insulating layer 107 is formed by an ALD method over the resists REG, the EL layer 103P, the charge-generation layers (106B, 106G, and 106R), the hole-injection/transport layer 104Q, the light-emitting layer 113Q, the electron-transport layer 108Q, and the partition 528 so as to cover them. In this case, the insulating layer 107 is formed in contact with the side surface of the EL layer 103P, the side surfaces of the charge-generation layers (106B, 106G, and 106R), the side surface of the hole-injection/transport layer 104Q, the side surface of the light-emitting layer 113Q, and the side surface of the electron-transport layer 108Q, as illustrated in FIG. 11C. This can inhibit entry of oxygen, moisture, or constituent elements thereof into the inside through the side surface of the EL layer 103P, the side surfaces of the charge-generation layers (106B, 106G, and 106R), the side surface of the hole-injection/transport layer 104Q, the side surface of the light-emitting layer 113Q, and the side surface of the electron-transport layer 108Q. Examples of the material used for the insulating layer 107 include aluminum oxide, magnesium oxide, hafnium oxide, gallium oxide, indium gallium zinc oxide, silicon nitride, and silicon nitride oxide.

Figure 12A:
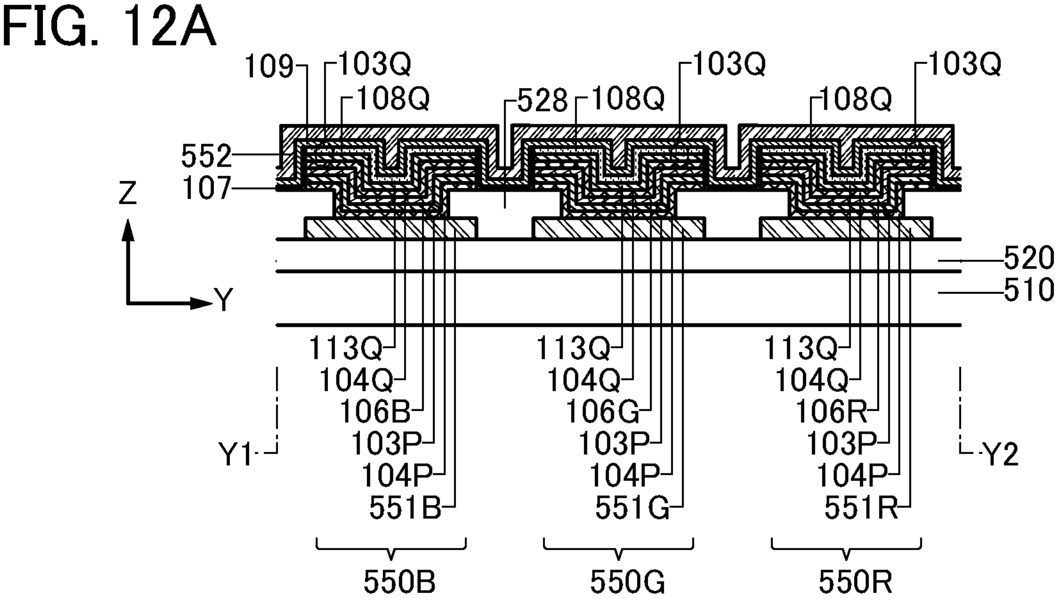
FIGS. 12A and 12B illustrate a method for manufacturing a light-emitting apparatus of an embodiment.

Subsequently, as illustrated in FIG. 12A, the resists REG are removed, and the electron-injection layer 109 is formed over the insulating layer 107, the electron-transport layer 108Q, and the partition 528. The electron-injection layer 109 is formed by a vacuum evaporation method, for example. Note that the electron-injection layer 109 is positioned on the side surfaces of some layers (the hole-injection/transport layer 104Q, the light-emitting layer 113Q, and the electron-transport layer 108Q) in the EL layers 103P and 103Q and the side surfaces of the charge-generation layers (106B, 106G, and 106R), with the insulating layer 107 therebetween.

Next, the electrode 552 is formed over the electron-injection layer 109. The electrode 552 is formed by a vacuum evaporation method, for example. The electrode 552 is formed over the electron-injection layer 109. Note that the electrode 552 is positioned on the side surfaces (or end portions) of some layers (the hole-injection/transport layer 104Q, the light-emitting layer 113Q, and the electron-transport layer 108Q) in the EL layer 103P and the EL layer 103Q and the charge-generation layers (106B, 106G, and 106R), with the electron-injection layer 109 and the insulating layer 107 therebetween. Thus, the EL layers (103P and 103Q) and the electrode 552, specifically the hole-injection/ transport layers (104P and 104Q) in the EL layers (103P and 103Q) and the electrode 552 can be prevented from being electrically short-circuited.

In the above manner, the EL layer 103P (including the hole-injection/transport layer 104P), the charge-generation layers (106B, 106G, and 106R), and some layers (including the hole-injection/transport layer 104Q, the light-emitting layer 113Q, and the electron-transport layer 108Q) in the EL layer 103Q in the light-emitting device 550B, the light-emitting device 550G, and the light-emitting device 550R can be separately formed by one patterning using a photolithography method.

For the electron-injection layer 109, any of the hole-transport materials described in Embodiment 1 can be used.

Note that the electron-injection layer 109 is also formed on side surfaces exposed by etching of the EL layer 103P (including the hole-injection/transport layer 104P), the charge-generation layers (106B, 106G, and 106R), and the EL layer 103Q (including the hole-injection/transport layer 104Q and the electron-transport layer 108Q).

The electrode 552 is formed over the electron-injection layer 109. The electrode 552 is positioned on the side surfaces of the EL layer 103P (including the hole-injection/transport layer 104P), the charge-generation layers (106B, 106G, and 106R), and some layers (including the hole-injection/transport layer 104Q, the light-emitting layer 113Q, and the electron-transport layer 108Q) in the EL layer 103Q, with the insulating layer 107 therebetween. Consequently, the EL layer 103P and the electrode 552, specifically the hole-injection/transport layer 104P in the EL layer 103P and the electrode 552 can be prevented from being electrically short-circuited. In addition, the EL layer 103Q and the electrode 552, specifically the hole-injection/transport layer 104Q in the EL layer 103Q and the electrode 552 can be prevented from being electrically short-circuited. Moreover, the charge-generation layers (106B, 106G, and 106R) and the electrode 552 can be prevented from being electrically short-circuited.

Figure 12B:
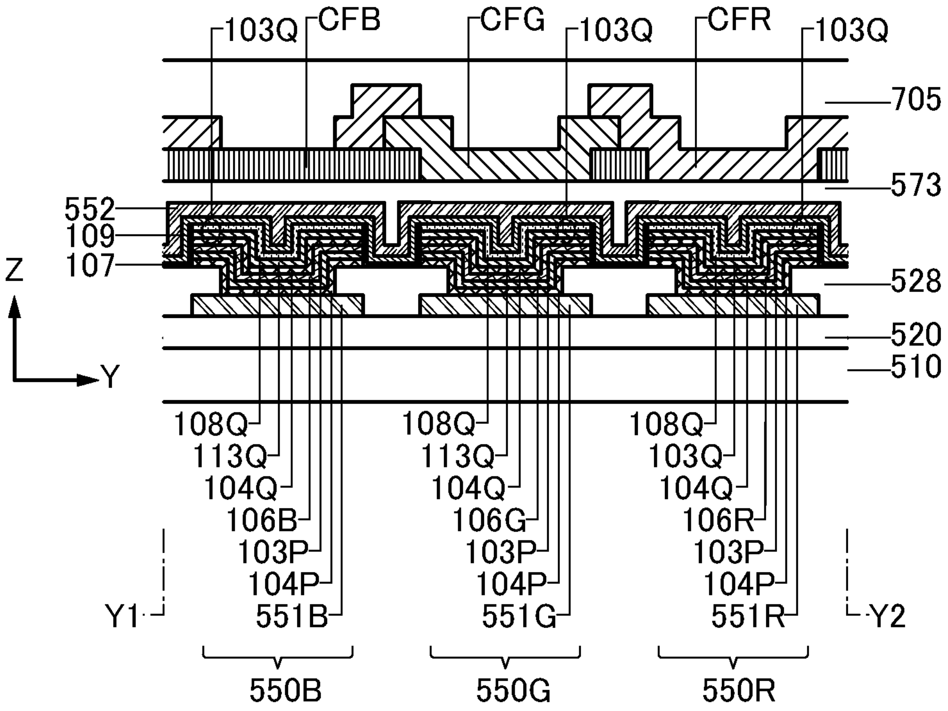

Next, the insulating layer 573, the coloring layer CFB, the coloring layer CFG, the coloring layer CFR, and the insulating layer 705 are formed (see FIG. 12B).

For example, the insulating layer 573 is formed by stacking a flat film and a dense film. Specifically, the flat film is formed by a coating method, and the dense film is formed over the flat film by a chemical vapor deposition method, an atomic layer deposition (ALD) method, or the like. Thus, the insulating layer 573 with few defects and high quality can be formed.

The coloring layer CFB, the coloring layer CFG, and the coloring layer CFR are formed to have predetermined shapes by using a color resist, for example. Note that the coloring layers are processed so that the coloring layer CFR and the coloring layer CFB overlap each other over the partition 528. This can suppress a phenomenon in which light emitted from one light-emitting device enters an adjacent light-emitting device.

For the insulating layer 705, an inorganic material, an organic material, a composite material of an inorganic material and an organic material, or the like can be used.

The EL layers (103P and 103Q) and the charge-generation layers (106B, 106G, and 106R) included in the light-emitting devices are processed to be separated between the light-emitting devices by patterning using a photolithography method; thus, a high-resolution light-emitting apparatus (display panel) can be fabricated. The end portions (side surfaces) of the EL layers processed by patterning using a photolithography method have substantially one surface (or are positioned on substantially the same plane).

The charge-generation layers (106B, 106G, and 106R) and the hole-injection layer included in the hole-transport region in the EL layers (103P and 103Q) often have high conductivity; therefore, these layers formed as layers shared by adjacent light-emitting devices might lead to crosstalk. Thus, processing the EL layers to be separated by patterning using a photolithography method as shown in this structure example can suppress occurrence of crosstalk between adjacent light-emitting devices.

Structure Example 5 of Light-Emitting Apparatus 700

Figure 13:
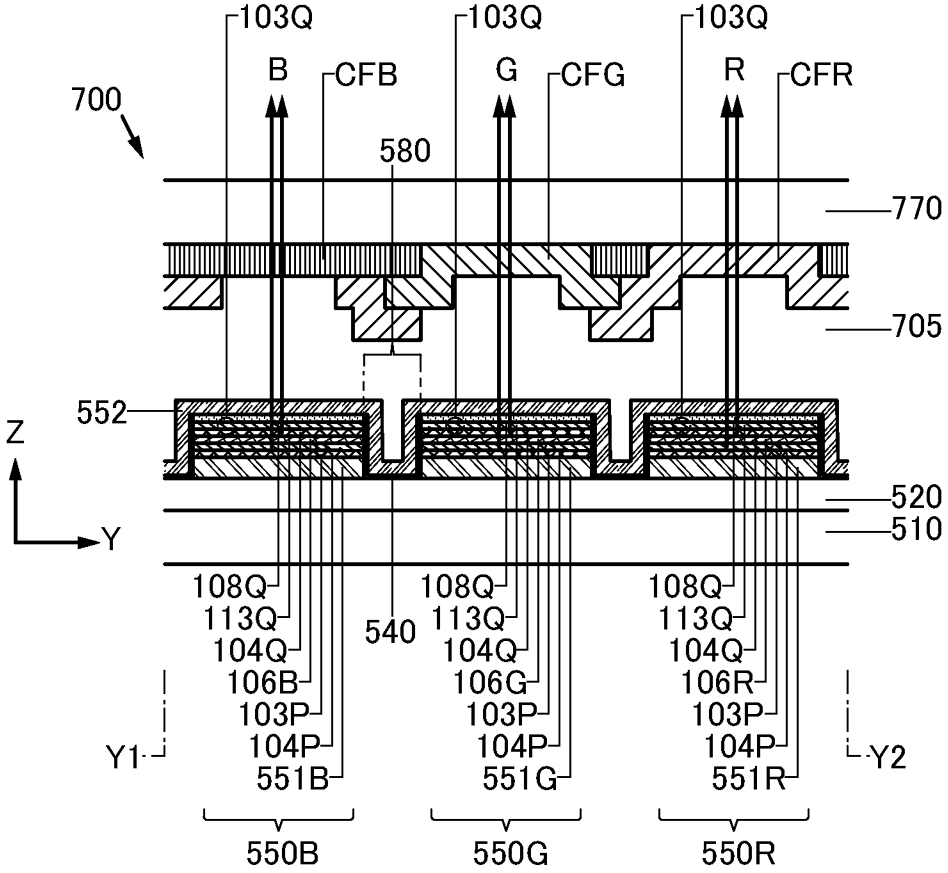
FIG. 13 illustrates a light-emitting apparatus of an embodiment.

The light-emitting apparatus (display panel) 700 illustrated in FIG. 13 includes the light-emitting device 550B, the light-emitting device 550G, the light-emitting device 550R, and the partition 528. The light-emitting device 550B, the light-emitting device 550G, the light-emitting device 550R, and the partition 528 are formed over the functional layer 520 provided over the first substrate 510. The functional layer 520 includes, for example, the driver circuit GD, the driver circuit SD, and the like that are composed of a plurality of transistors, and wirings that electrically connect these circuits. Note that these driver circuits are electrically connected to the light-emitting device 550B, the light-emitting device 550G, and the light-emitting device 550R to drive them.

The light-emitting device 550B, the light-emitting device 550G, and the light-emitting device 550R each have the device structure described in Embodiment 1. This is suitable particularly for the case where the light-emitting devices share the EL layer 103 having the structure illustrated in FIG. 2B, i.e., a tandem structure.

As illustrated in FIG. 13, the space 580 is provided between the light-emitting devices, for example, between the light-emitting device 550B and the light-emitting device 550G. Accordingly, an insulating layer 540 is formed in the space 580.

For example, the insulating layer 540 can be formed in the space 580 over the partition 528 by a photolithography method after the EL layer 103P (including the hole-injection/transport layer 104P), the charge-generation layers (106B, 106G, and 106R), and the EL layer 103Q (including the hole-injection/transport layer 104Q) are separately formed by patterning using a photolithography method. Furthermore, the electrode 552 can be formed over the EL layer 103Q (including the hole-injection/transport layer 104Q) and the insulating layer 540.

In this structure, the EL layers are completely separated from each other by the insulating layer 540; thus, the insulating layer 107 described in Structure example 3 (see FIG. 9A) is unnecessary.

The EL layers (103P and 103Q) and the charge-generation layers (106B, 106G, and 106R) included in the light-emitting devices are processed to be separated between the light-emitting devices by patterning using a photolithography method; thus, a high-resolution light-emitting apparatus (display panel) can be fabricated. The end portions (side surfaces) of the EL layers processed by patterning using a photolithography method have substantially one surface (or are positioned on substantially the same plane).

The charge-generation layers (106B, 106G, and 106R) and the hole-injection layer included in the hole-transport region in the EL layers (103P and 103Q) often have high conductivity; therefore, these layers formed as layers shared by adjacent light-emitting devices might lead to crosstalk. Thus, processing the EL layers to be separated by patterning using a photolithography method as shown in this structure example can suppress occurrence of crosstalk between adjacent light-emitting devices.

The structures described in this embodiment can be used in appropriate combination with any of the structures described in the other embodiments.

Embodiment 3

In this embodiment, a light-emitting apparatus of one embodiment of the present invention will be described with reference to FIGS. 14A and 14B, FIGS. 15A and 15B, and FIGS. 16A and 16B. The light-emitting apparatus 700 illustrated in FIGS. 14A and 14B, FIGS. 15A and 15B, and FIGS. 16A and 16B includes the light-emitting device described in Embodiment 1. The light-emitting apparatus 700 described in this embodiment can be referred to as a display panel because it can be used in a display portion of an electronic device and the like.

Figure 14A:
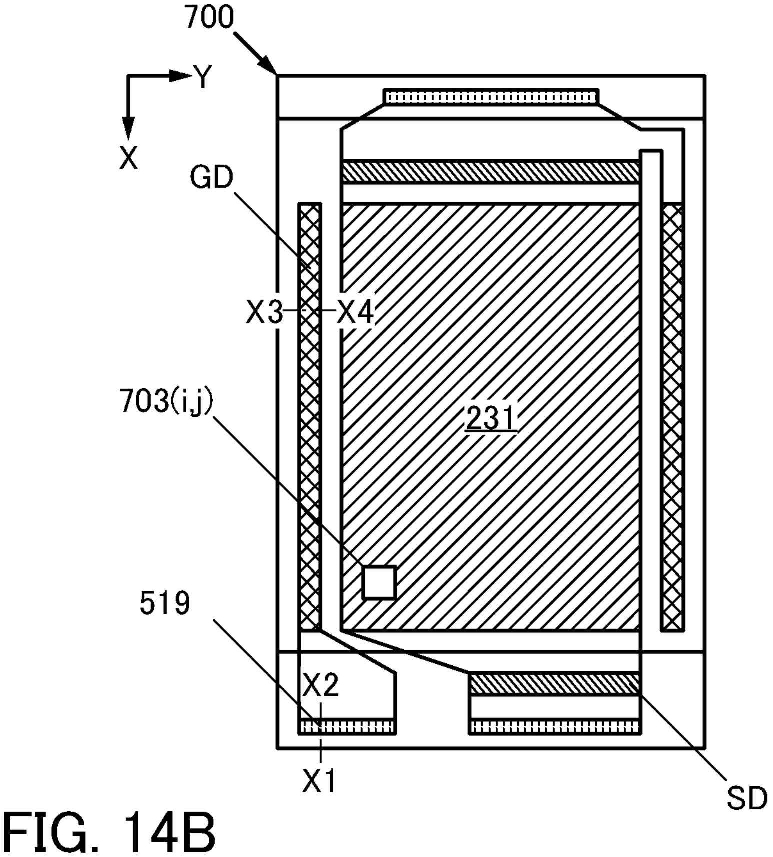
FIGS. 14A and 14B illustrate a light-emitting apparatus of an embodiment.
Figure 14B:
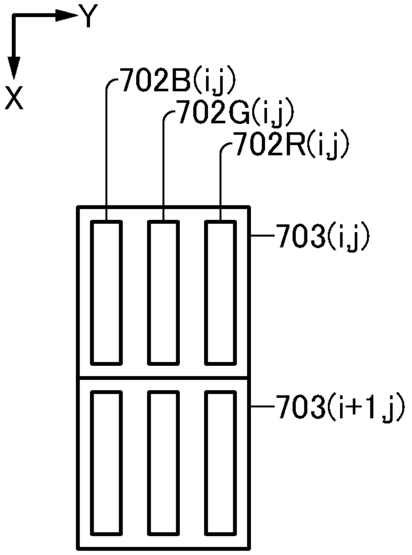

As illustrated in FIG. 14A, the light-emitting apparatus 700 described in this embodiment includes a display region 231, and the display region 231 includes a pixel set 703(*i,j*). A pixel set 703(*i*+1j) adjacent to the pixel set 703(*i,j*) is provided as illustrated in FIG. 14B.

Note that a plurality of pixels can be used in the pixel 703(*i,j*). For example, a plurality of pixels that show colors of different hues can be used. Note that a plurality of pixels can be referred to as subpixels. In addition, a set of subpixels can be referred to as a pixel.

Such a structure enables additive mixture or subtractive mixture of colors shown by the plurality of pixels. Alternatively, it is possible to express a color of a hue that an individual pixel cannot show.

Specifically, a pixel 702B(i,j) for showing blue, the pixel 702G(i,j) for showing green, and a pixel 702R(i,j) for showing red can be used in the pixel 703(*i,j*). The pixel 702B(i,j), the pixel 702G(i,j), and the pixel 702R(i,j) can each be referred to as a subpixel.

A pixel for showing white or the like in addition to the above set may be used in the pixel 703(*i,j*). Moreover, a pixel for showing cyan, a pixel for showing magenta, and a pixel for showing yellow may be used as subpixels in the pixel 703(*i,j*).

A pixel that emits infrared light in addition to the above set may be used in the pixel 703(*i,j*). Specifically, a pixel that emits light including light with a wavelength greater than or equal to 650 nm and less than or equal to 1000 nm can be used in the pixel 703(*i,j*).

The light-emitting apparatus 700 includes the driver circuit GD and the driver circuit SD around the display region 231 in FIG. 14A. The light-emitting apparatus 700 also includes a terminal 519 electrically connected to the driver circuit GD, the driver circuit SD, and the like. The terminal 519 can be electrically connected to a flexible printed circuit FPC1 (see FIGS. 16A and 16B), for example.

The driver circuit GD has a function of supplying a first selection signal and a second selection signal. For example, the driver circuit GD is electrically connected to an after-mentioned conductive film G1(*i*) to supply the first selection signal, and is electrically connected to an after-mentioned conductive film G2(*i*) to supply the second selection signal. The driver circuit SD has a function of supplying an image signal and a control signal, and the control signal includes a first level and a second level. For example, the driver circuit SD is electrically connected to an after-mentioned conductive film S1*g*(*j*) to supply the image signal, and is electrically connected to an after-mentioned conductive film S2*g*(*j*) to supply the control signal.

Figure 16A:
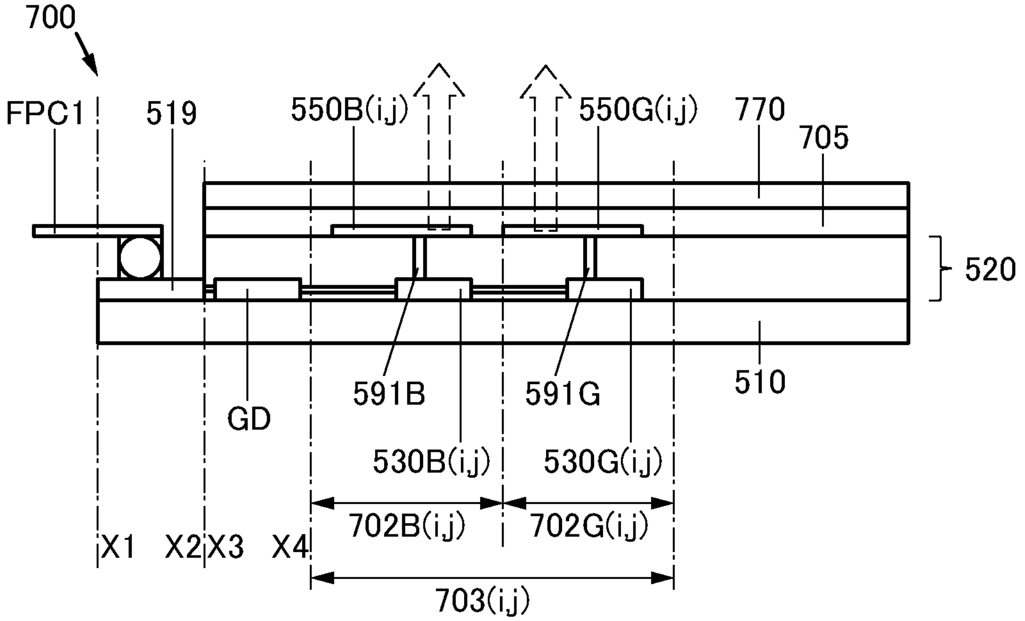
FIGS. 16A and 16B each illustrate a light-emitting apparatus of an embodiment.

As illustrated in FIG. 16A, the light-emitting apparatus 700 includes the functional layer 520 between the first substrate 510 and the second substrate 770. The functional layer 520 includes, for example, the driver circuit GD, the driver circuit SD, and the like, and wirings that electrically connect these circuits. Although FIG. 16A illustrates the functional layer 520 including a pixel circuit 530B(i,j), a pixel circuit 530G(i,j), and the driver circuit GD, the functional layer 520 is not limited thereto.

Each pixel circuit (e.g., the pixel circuit 530B(i,j) and the pixel circuit 530G(i,j) in FIG. 16A) included in the functional layer 520 is electrically connected to a light-emitting device (e.g., a light-emitting device 550B(i,j) and a light-emitting device 550G(i,j) in FIG. 16A) formed over the functional layer 520. The insulating layer 705 is provided over the functional layer 520 and the light-emitting devices, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting apparatus of one embodiment of the present invention can be used as a touch panel.

Figure 15A:
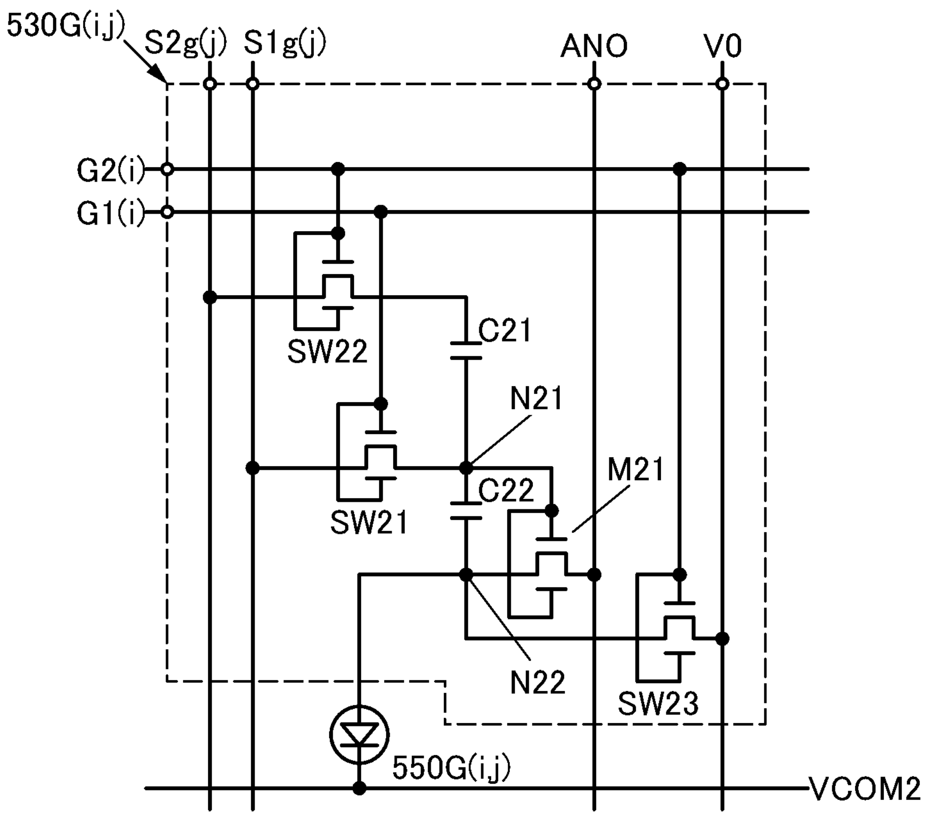
FIGS. 15A and 15B illustrate a light-emitting apparatus of an embodiment.

FIG. 15A illustrates a specific configuration of the pixel circuit 530G(i,j).

As illustrated in FIG. 15A, the pixel circuit 530G(i,j) includes a switch SW21, a switch SW22, a transistor M21, a capacitor C21, and a node N21. The pixel circuit 530G(i,j) includes a node N22, a capacitor C22, and a switch SW23.

The transistor M21 includes a gate electrode electrically connected to the node N21, a first electrode electrically connected to the light-emitting device 550G(i,j), and a second electrode electrically connected to a conductive film ANO.

The switch SW21 includes a first terminal electrically connected to the node N21 and a second terminal electrically connected to the conductive film S1*g*(j), and has a function of controlling its on/off state on the basis of the potential of the conductive film G1(*i*).

The switch SW22 includes a first terminal electrically connected to the conductive film S2*g*(*j*), and has a function of controlling its on/off state on the basis of the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550G(i,j) can be controlled with the potential of the node N21.

Figure 15B:
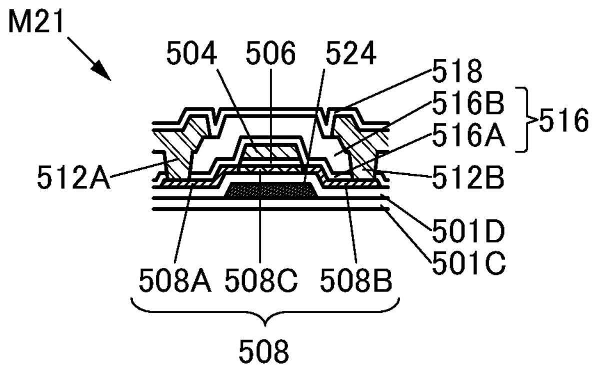

FIG. 15B illustrates an example of a specific structure of the transistor M21 described in FIG. 15A. As the transistor M21, a bottom-gate transistor, a top-gate transistor, or the like can be used as appropriate.

The transistor illustrated in FIG. 15B includes a semiconductor film 508, a conductive film 504, an insulating film 506, a conductive film 512A, and a conductive film 512B. The transistor is formed over an insulating film 501C, for example.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping the region 508C and has a function of a gate electrode.

The insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other.

A conductive film 524 can be used in the transistor. The conductive film 524 includes a region where the semiconductor film 508 is positioned between the conductive film 504 and the conductive film 524. The conductive film 524 has a function of a second gate electrode. An insulating film 501D is positioned between the semiconductor film 508 and the conductive film 524 and has a function of a second gate insulating film.

Note that in a step of forming the semiconductor film used in the transistor of the pixel circuit, the semiconductor film used in the transistor of the driver circuit can be formed. A semiconductor film with the same composition as the semiconductor film used in the transistor of the pixel circuit can be used in the driver circuit, for example.

For the semiconductor film 508, a semiconductor containing an element of Group 14 can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide a light-emitting apparatus having less display unevenness than a light-emitting apparatus (or a display panel) using polysilicon for the semiconductor film 508, for example. Moreover, it is easy to increase the size of the light-emitting apparatus.

Polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic device can be reduced.

Single crystal silicon can be used for the semiconductor film 508. In this case, for example, the resolution can be higher than that of a light-emitting apparatus (or a display panel) using hydrogenated amorphous silicon for the semiconductor film 508. For another example, it is possible to provide a light-emitting apparatus having less display unevenness than a light-emitting apparatus using polysilicon for the semiconductor film 508. For another example, smart glasses or ahead-mounted display can be provided.

A metal oxide can be used for the semiconductor film 508. In this case, the pixel circuit can hold an image signal for a longer time than a pixel circuit including a transistor that uses hydrogenated amorphous silicon for the semiconductor film. Specifically, a selection signal can be supplied at a frequency lower than 30 Hz, preferably lower than 1 Hz, further preferably less than once per minute while flickering is suppressed. Consequently, fatigue of a user of an electronic device can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having a lower leakage current in the off state than a transistor using hydrogenated amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining a potential of a floating node for a longer time than a circuit in which a transistor using hydrogenated amorphous silicon for the semiconductor film is used as a switch.

Figure 16B:
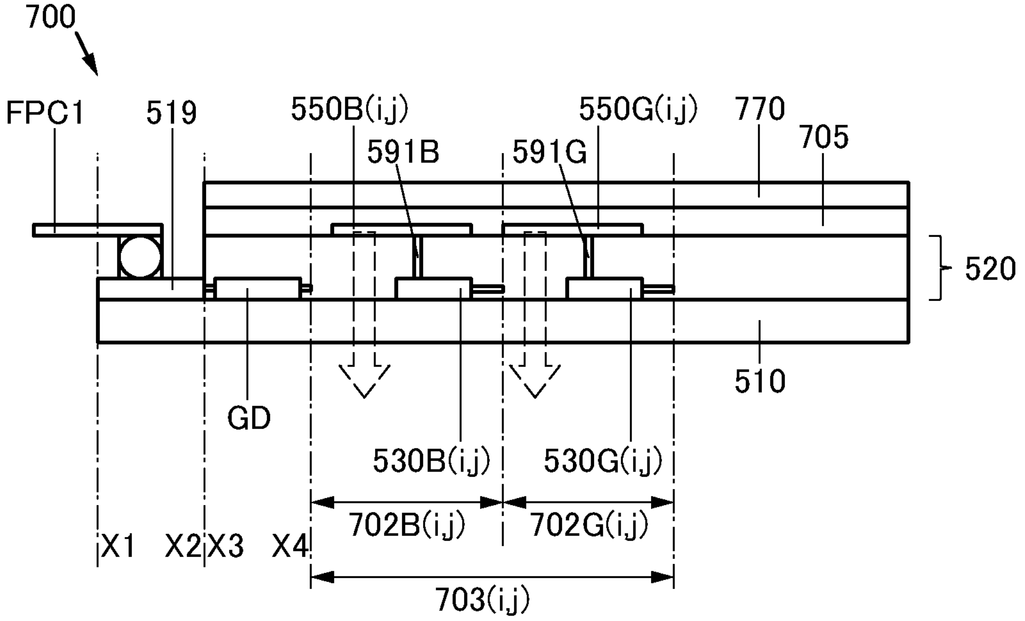

Although the light-emitting apparatus in FIG. 16A has a structure in which light is extracted from the second substrate 770 side (top emission structure), a light-emitting apparatus may have a structure in which light is extracted from the first substrate 510 side (bottom emission structure) as illustrated in FIG. 16B. In a bottom-emission light-emitting apparatus, the first electrode 101 is formed as a transflective electrode and the second electrode 102 is formed as a reflective electrode.

Figure 17A:
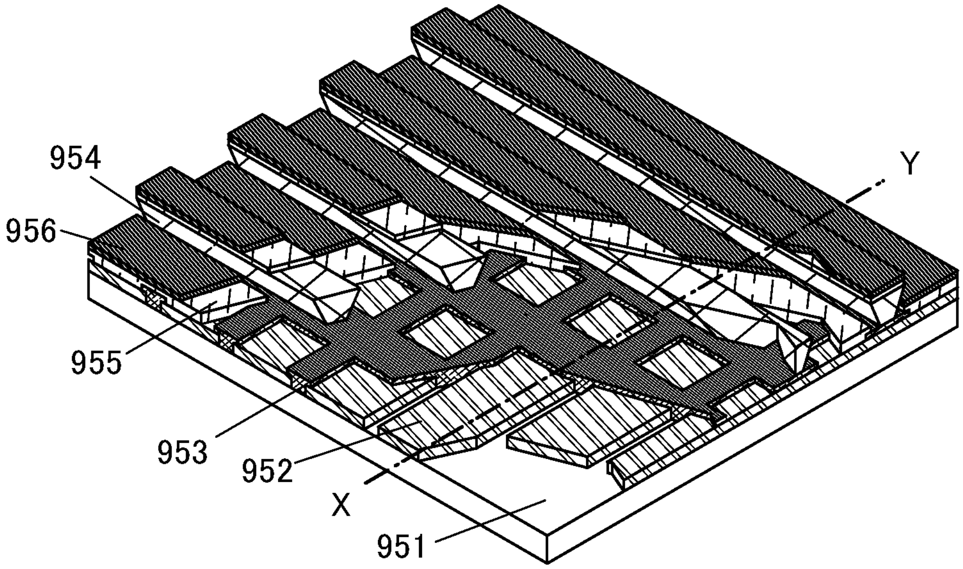
FIGS. 17A and 17B illustrate a light-emitting apparatus of an embodiment.
Figure 17B:
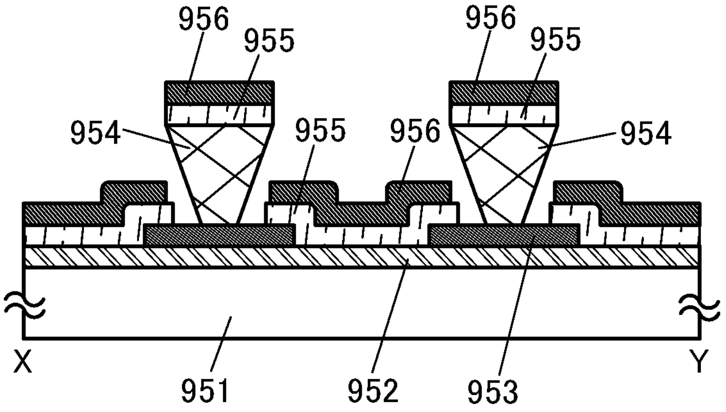

Although FIGS. 16A and 16B illustrate active-matrix light-emitting apparatuses, the structure of the light-emitting device described in Embodiment 1 may be applied to a passive-matrix light-emitting apparatus illustrated in FIGS. 17A and 17B.

FIG. 17A is a perspective view illustrating the passive-matrix light-emitting apparatus, and FIG. 17B shows a cross section along the line X-Y in FIG. 17A. In FIGS. 17A and 17B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section of the partition layer 954 in the short axis direction is trapezoidal, and the lower base (the side in contact with the insulating layer 953) is shorter than the upper base. The partition layer 954 thus provided can prevent defects in the light-emitting device due to static electricity or the like.

The structures described in this embodiment can be used in appropriate combination with any of the structures described in the other embodiments.

Embodiment 4

In this embodiment, structures of electronic devices of embodiments of the present invention will be described with reference to FIGS. 18A to 18E, FIGS. 19A to 19E, and FIGS. 20A and 20B.

Figure 18A:
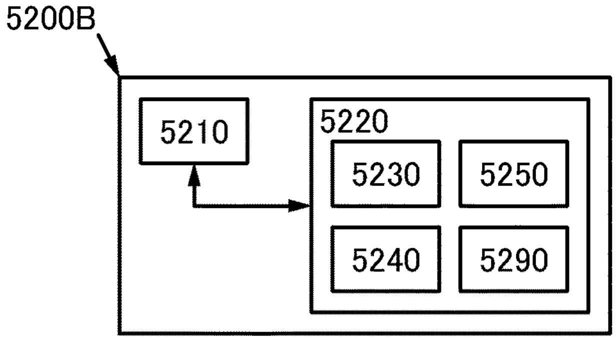
FIGS. 18A to 18E illustrate electronic devices of embodiments.
Figure 18B:
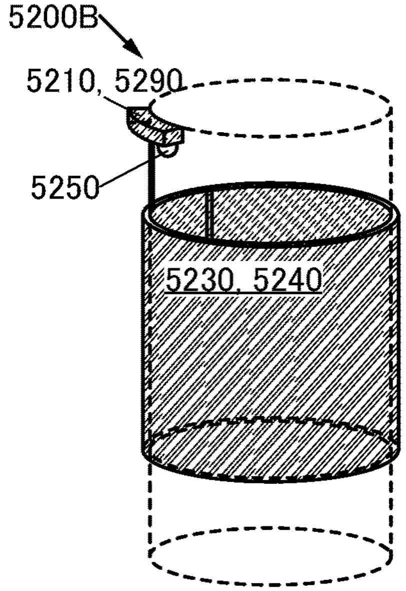
Figure 18C:
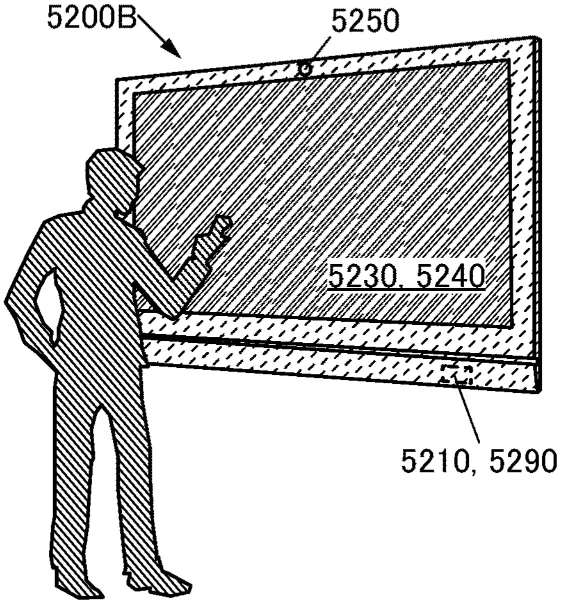
Figure 18D:
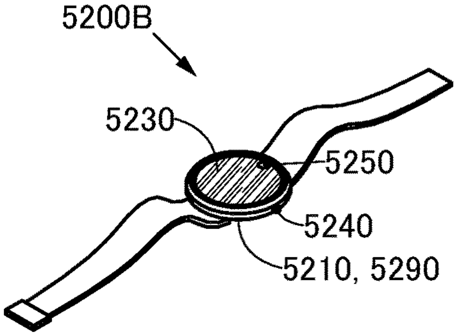
Figure 18E:
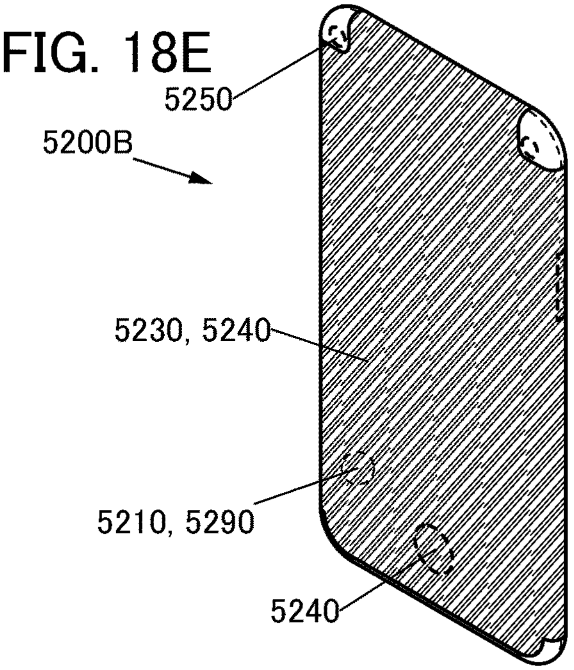
Figure 19A:
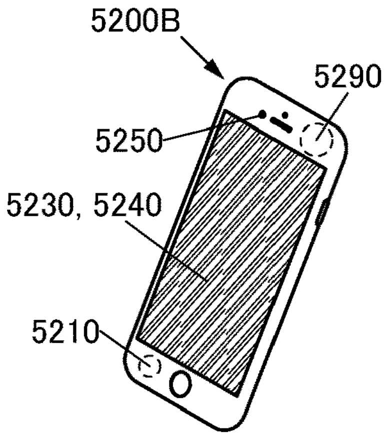
FIGS. 19A to 19E illustrate electronic devices of embodiments.
Figure 19B:
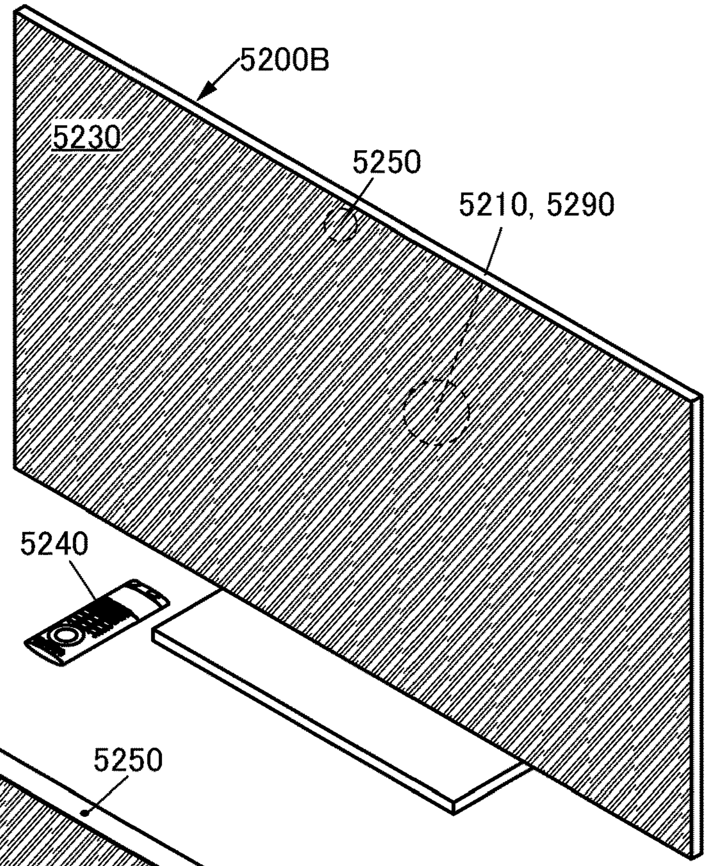
Figure 19C:
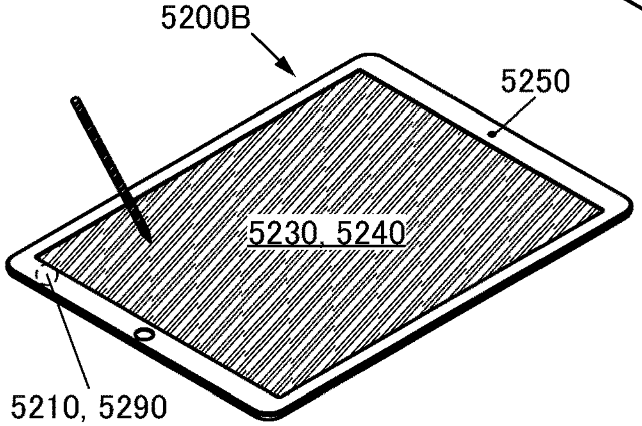
Figure 19D:
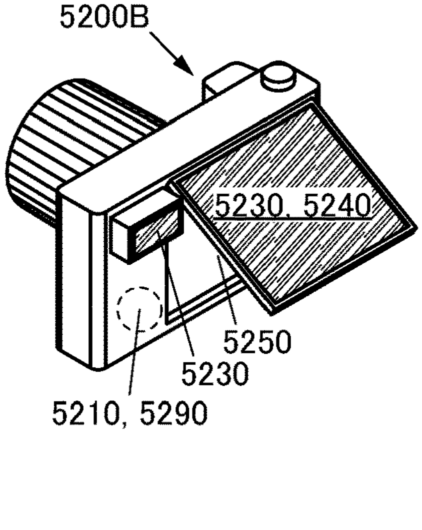
Figure 19E:
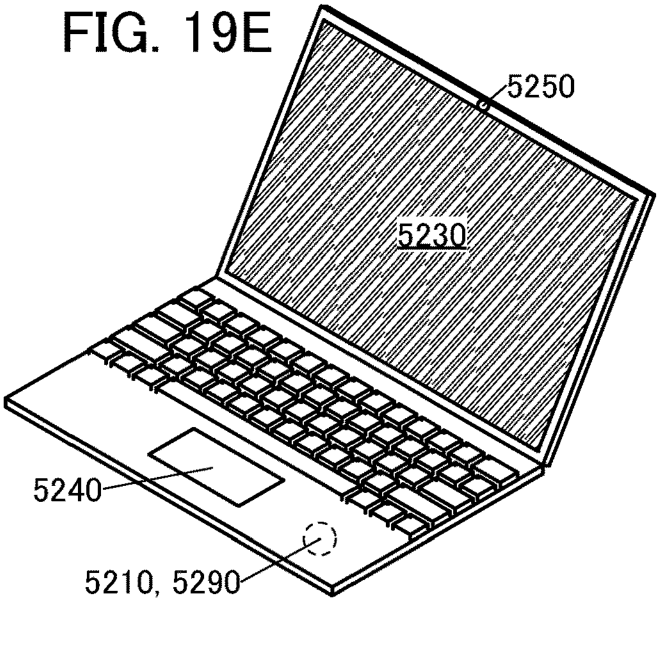
Figure 20A:
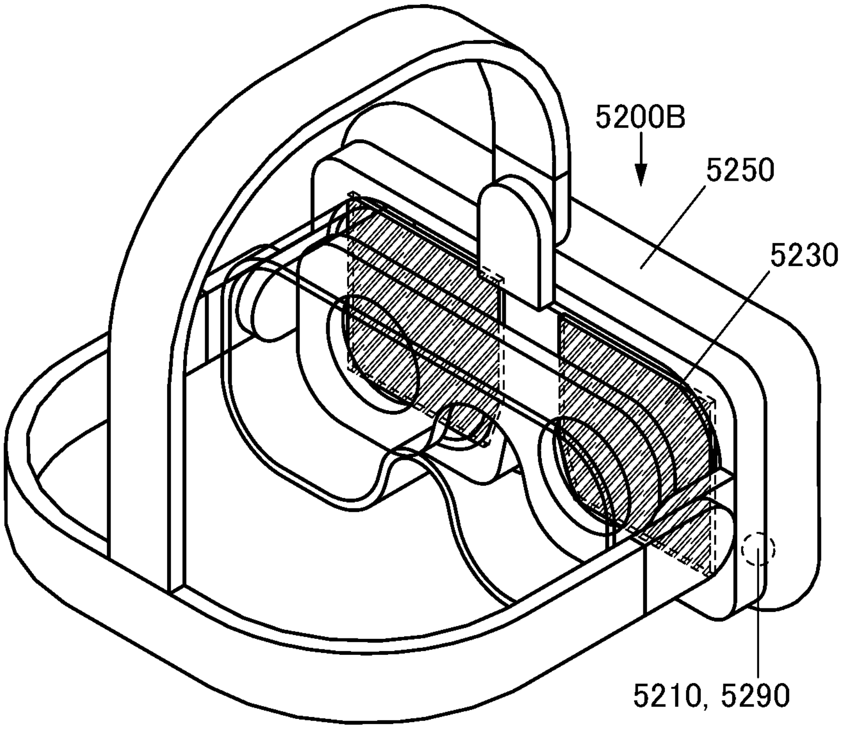
FIGS. 20A and 20B illustrate electronic devices of embodiments.
Figure 20B:
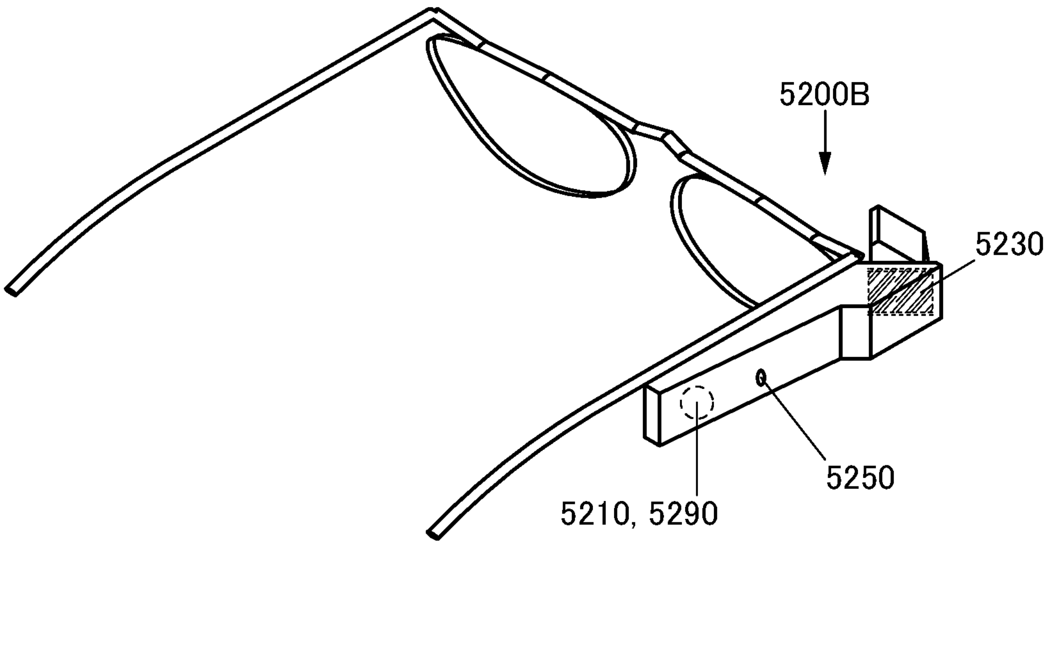

FIGS. 18A to 18E, FIGS. 19A to 19E, and FIGS. 20A and 20B each illustrate a structure of the electronic device of one embodiment of the present invention. FIG. 18A is a block diagram of the electronic device, and FIGS. 18B to 18E are perspective views illustrating structures of the electronic device. FIGS. 19A to 19E are perspective views illustrating structures of the electronic device. FIGS. 20A and 20B are perspective views illustrating structures of the electronic device.

An electronic device 5200B described in this embodiment includes an arithmetic device 5210 and an input/output device 5220 (see FIG. 18A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the electronic device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 2 can be used for the display unit 5230.

The sensor unit 5250 has a function of supplying sensing data. For example, the sensor unit 5250 has a function of sensing a surrounding environment where the electronic device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

FIG. 18B illustrates an electronic device having an outer shape along a cylindrical column or the like. An example of such an electronic device is digital signage. The display panel of one embodiment of the present invention can be used for the display unit 5230. The electronic device may have a function of changing its display method in accordance with the illuminance of a usage environment. The electronic device has a function of changing the displayed content when sensing the existence of a person. Thus, for example, the electronic device can be provided on a column of a building. The electronic device can display advertising, guidance, or the like.

FIG. 18C illustrates an electronic device having a function of generating image data on the basis of the path of a pointer used by the user. Examples of such an electronic device include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 18D illustrates an electronic device that is capable of receiving data from another device and displaying the data on the display unit 5230. An example of such an electronic device is a wearable electronic device. Specifically, the electronic device can display several options, and the user can choose some from the options and send a reply to the data transmitter. As another example, the electronic device has a function of changing its display method in accordance with the illuminance of a usage environment. Thus, for example, power consumption of the wearable electronic device can be reduced. As another example, the wearable electronic device can display an image so as to be suitably used even in an environment under strong external light, e.g., outdoors in fine weather.

FIG. 18E illustrates an electronic device including the display unit 5230 having a surface gently curved along a side surface of a housing. An example of such an electronic device is a mobile phone. The display unit 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 19A illustrates an electronic device that is capable of receiving data via the Internet and displaying the data on the display unit 5230. An example of such an electronic device is a smartphone. For example, the user can check a created message on the display unit 5230 and send the created message to another device. As another example, the electronic device has a function of changing its display method in accordance with the illuminance of a usage environment. Thus, power consumption of the smartphone can be reduced. As another example, the smartphone can display an image on the display unit 5230 so as to be suitably used even in an environment under strong external light, e.g., outdoors in fine weather.

FIG. 19B illustrates an electronic device that can use a remote controller as the input unit 5240. An example of such an electronic device is a television system. For example, data received from a broadcast station or via the Internet can be displayed on the display unit 5230. The electronic device can take an image of the user with the sensor unit 5250 and transmit the image of the user. The electronic device can acquire a viewing history of the user and provide it to a cloud service. The electronic device can acquire recommendation data from a cloud service and display the data on the display unit 5230. A program or a moving image can be displayed on the basis of the recommendation data. As another example, the electronic device has a function of changing its display method in accordance with the illuminance of a usage environment. Accordingly, an image can be displayed on the display unit 5230 such that the electronic device can be suitably used even when irradiated with strong external light that enters the room from the outside in fine weather.

FIG. 19C illustrates an electronic device that is capable of receiving educational materials via the Internet and displaying them on the display unit 5230. An example of such an electronic device is a tablet computer. The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, an image signal can be received from another electronic device and displayed on the display unit 5230. When the electronic device is placed on a stand or the like, the display unit 5230 can be used as a sub-display. As another example, an image can be displayed on the display unit 5230 such that the electronic device can be suitably used in an environment under strong external light, e.g., outdoors in fine weather.

FIG. 19D illustrates an electronic device including a plurality of display units 5230. An example of such an electronic device is a digital camera. For example, the display unit 5230 can display an image that the sensor unit 5250 is capturing. A captured image can be displayed on the display unit 5230. A captured image can be decorated using the input unit 5240. A message can be attached to a captured image. A captured image can be transmitted via the Internet. The electronic device has a function of changing shooting conditions in accordance with the illuminance of a usage environment. Accordingly, for example, a subject can be displayed on the display unit 5230 to be favorably viewed even in an environment under strong external light, e.g., outdoors in fine weather.

FIG. 19E illustrates an electronic device in which the electronic device of this embodiment is used as a master to control another electronic device used as a slave. An example of such an electronic device is a portable personal computer. For example, part of image data can be displayed on the display unit 5230 and another part of the image data can be displayed on a display unit of another electronic device. Image signals can be supplied. Data written from an input unit of another electronic device can be obtained with the communication unit 5290. Thus, a large display region can be utilized in the case of using a portable personal computer, for example.

FIG. 20A illustrates an electronic device including the sensing unit 5250 that senses an acceleration or a direction. An example of such an electronic device is a goggles-type electronic device. The sensor unit 5250 can supply data on the position of the user or the direction in which the user faces. The electronic device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on the display unit 5230, for example.

FIG. 20B illustrates an electronic device including an imaging device and the sensing unit 5250 that senses an acceleration or a direction. An example of such an electronic device is a glasses-type electronic device. The sensor unit 5250 can supply data on the position of the user or the direction in which the user faces. The electronic device can generate image data in accordance with the position of the user or the direction in which the user faces. Accordingly, the data can be shown together with a real-world scene, for example. Alternatively, an augmented reality image can be displayed on the glasses-type electronic device.

Note that this embodiment can be combined with any of the other embodiments in this specification as appropriate.

Embodiment 5

Figure 21A:
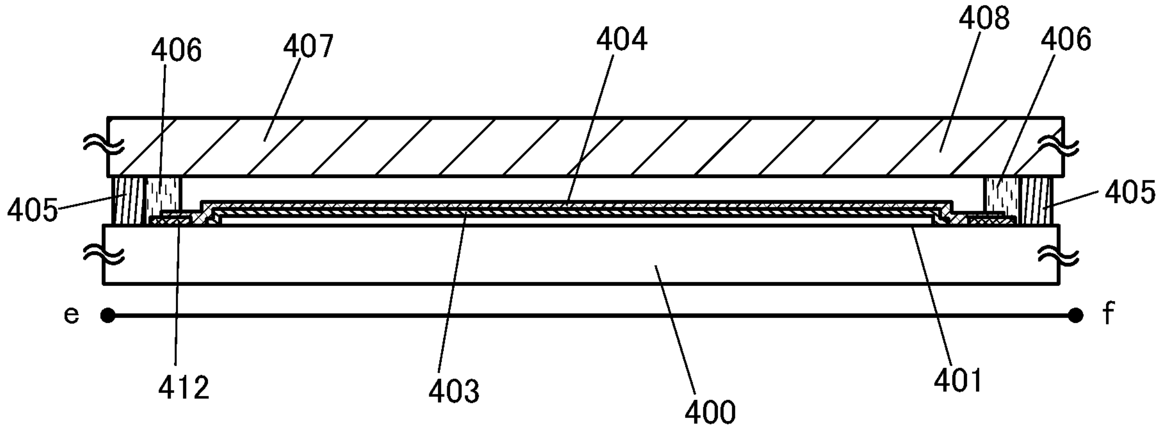
FIGS. 21A and 21B illustrate an electronic device of an embodiment.
Figure 21B:
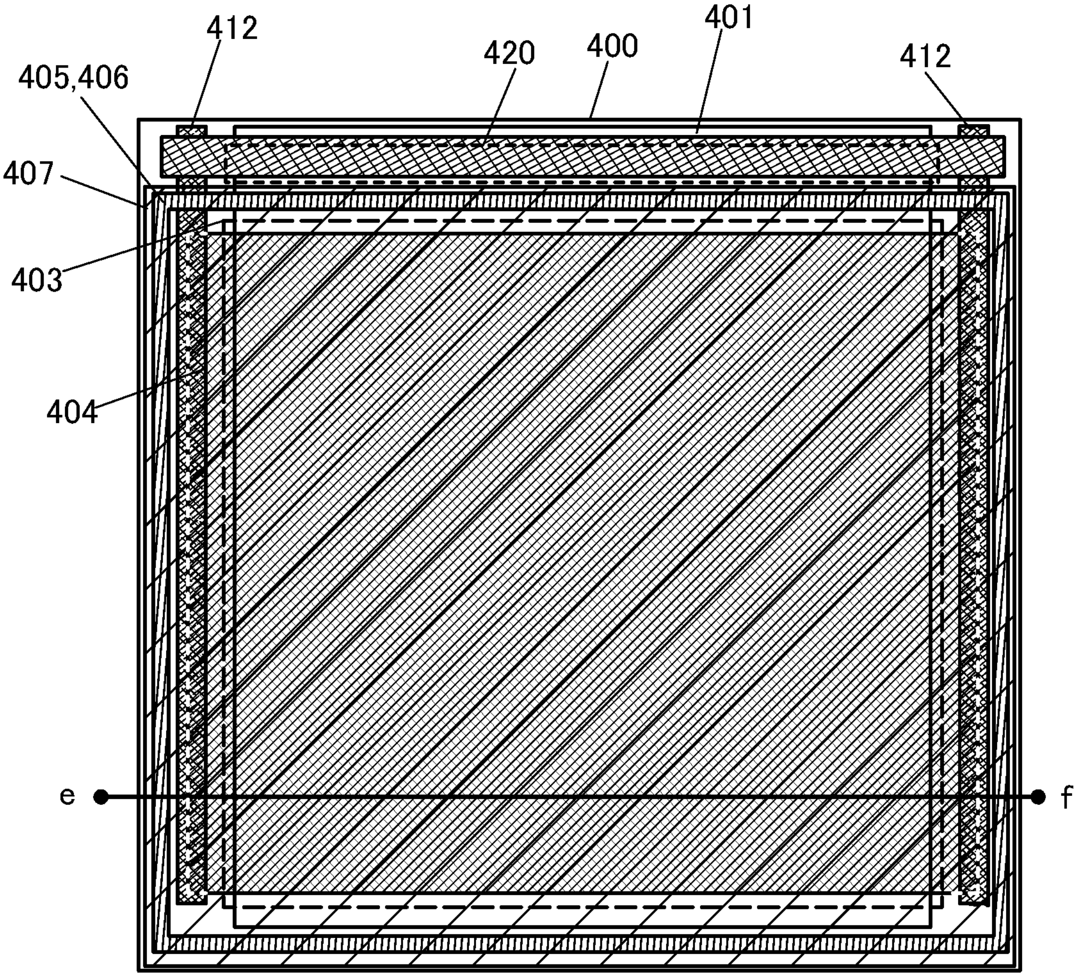

In this embodiment, a structure in which the light-emitting device described in Embodiment 2 is used in a lighting device will be described with reference to FIGS. 21A and 21B. FIG. 21A shows an e-f cross section in a top view of the lighting device in FIG. 21B.

In the lighting device in this embodiment, a first electrode 401 is formed over a substrate 400 that is a support and has a light-transmitting property. The first electrode 401 corresponds to the first electrode 101 in Embodiment 1. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1 or the structure in which the EL layers 103*a*, 103*b*, and 103*c* and the charge-generation layer 106 (106*a* and 106*b*) are combined. Refer to the corresponding description for these structures.

The second electrode 404 is formed to cover the EL layer 403. The second electrode 404 corresponds to the second electrode 102 in Embodiment 1. The second electrode 404 is formed using a material having high reflectance when light is extracted from the first electrode 401 side. The second electrode 404 is connected to the pad 412, whereby voltage is applied.

As described above, the lighting device described in this embodiment includes a light-emitting device including the first electrode 401, the EL layer 403, and the second electrode 404. Since the light-emitting device has high emission efficiency, the lighting device in this embodiment can have low power consumption.

The substrate 400 provided with the light-emitting device having the above structure and a sealing substrate 407 are fixed and sealed with sealing materials 405 and 406, whereby the lighting device is completed. It is possible to use only either the sealing material 405 or the sealing material 406. In addition, the inner sealing material 406 (not illustrated in FIG. 21B) can be mixed with a desiccant that enables moisture to be adsorbed, which results in improved reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

Embodiment 6

Figure 22:
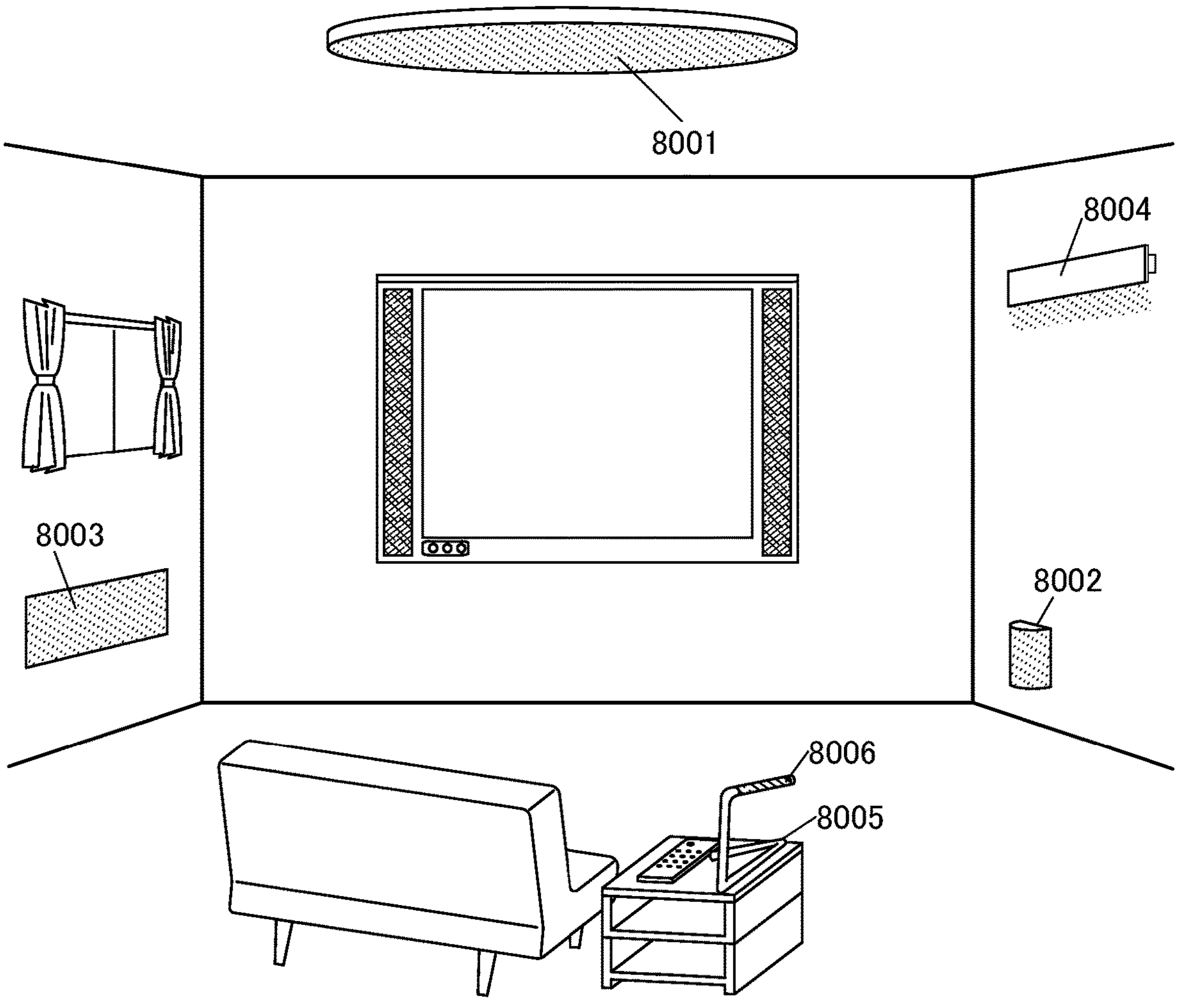
FIG. 22 illustrates electronic devices of embodiments.

In this embodiment, application examples of lighting devices fabricated using the light-emitting apparatus of one embodiment of the present invention or the light-emitting device, which is part of the light-emitting apparatus, will be described with reference to FIG. 22.

A ceiling light 8001 can be used as an indoor lighting device. Examples of the ceiling light 8001 include a direct-mount light and an embedded light. Such lighting devices are fabricated using the light-emitting apparatus and a housing or a cover in combination. Application to a cord pendant light (light that is suspended from a ceiling by a cord) is also possible.

A foot light 8002 lights a floor so that safety on the floor can be improved. For example, it can be effectively used in a bedroom, on a staircase, and on a passage. In such cases, the size and shape of the foot light can be changed in accordance with the dimensions and structure of a room. The foot light can be a stationary lighting device fabricated using the light-emitting apparatus and a support in combination.

A sheet-like lighting 8003 is a thin sheet-like lighting device. The sheet-like lighting, which is attached to a wall when used, is space-saving and thus can be used for a wide variety of uses. Furthermore, the area of the sheet-like lighting can be easily increased. The sheet-like lighting can also be used on a wall and a housing that have a curved surface.

A lighting device 8004 in which the direction of light from a light source is controlled to be only a desired direction can be used.

A desk lamp 8005 includes a light source 8006. As the light source 8006, the light-emitting apparatus of one embodiment of the present invention or the light-emitting device, which is part of the light-emitting apparatus, can be used.

Besides the above examples, when the light-emitting apparatus of one embodiment of the present invention or the light-emitting device, which is part of the light-emitting apparatus, is used as part of furniture in a room, a lighting device that functions as the furniture can be obtained.

As described above, a variety of lighting devices that include the light-emitting apparatus can be obtained. Note that these lighting devices are also embodiments of the present invention.

The structures described in this embodiment can be used in appropriate combination with any of the structures described in the other embodiments.

Example 1

Figure 23:
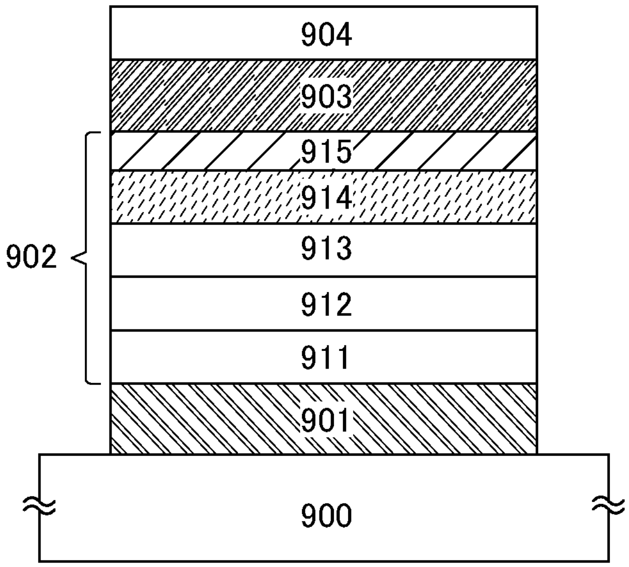
FIG. 23 illustrates a structure of light-emitting devices used in Example 1 to Example 4.

This example will describe a device structure, a fabrication method, and characteristics of a light-emitting device 1 and a light-emitting device 2 each of which is a blue fluorescent device fabricated as the light-emitting device of one embodiment of the present invention. Note that for comparison of device characteristics, a comparative light-emitting device 3 and a reference light-emitting device 4 were fabricated. FIG. 23 illustrates a device structure of the light-emitting devices used in this example, and Table 1 shows specific structures. The chemical formulae of materials used in this example are shown below.

[Chemical Formula 3]

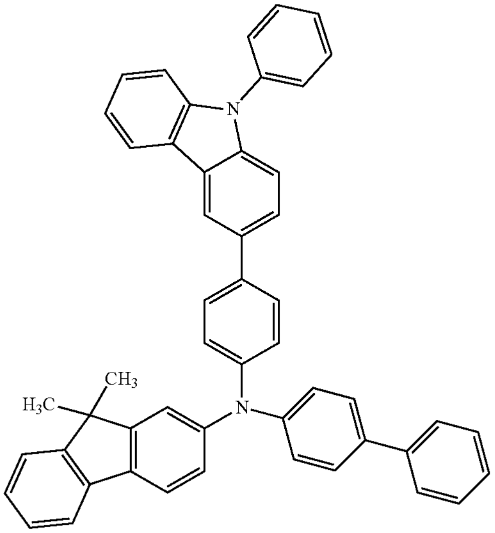

PCBBiF

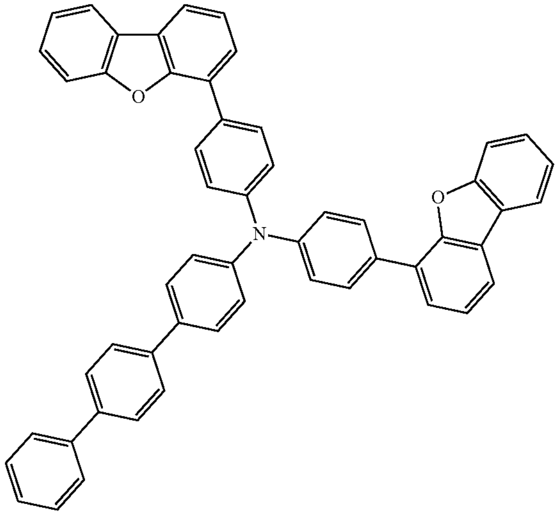

DBfBB1TP

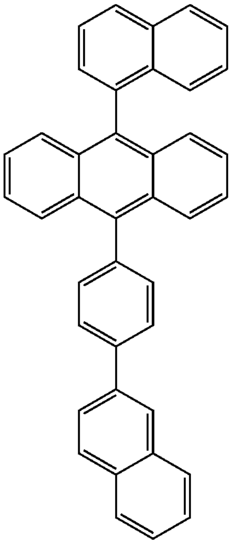

αN-β NPAnth

-continued

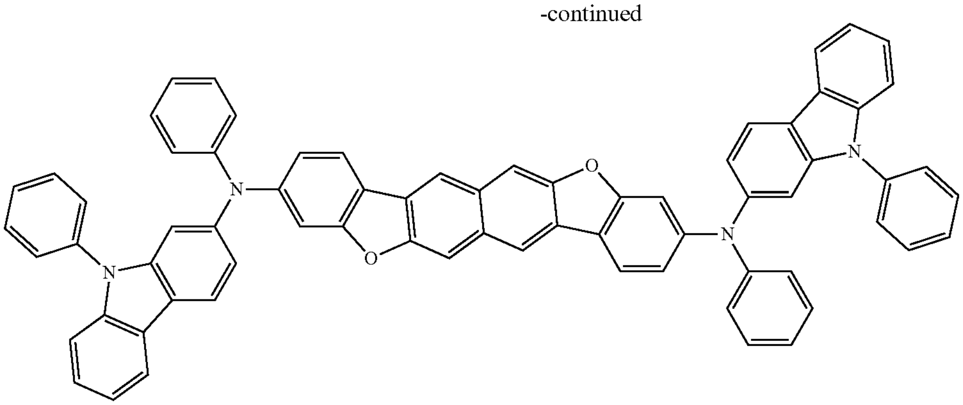

3,10PCA2Nbf(IV)-02

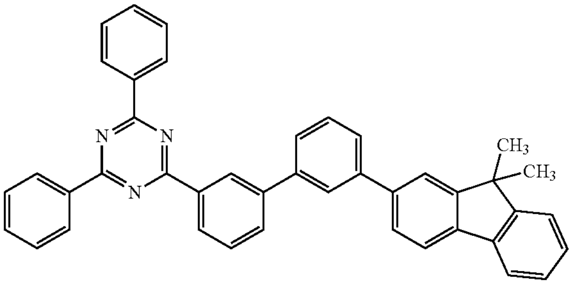

mFBPTzn

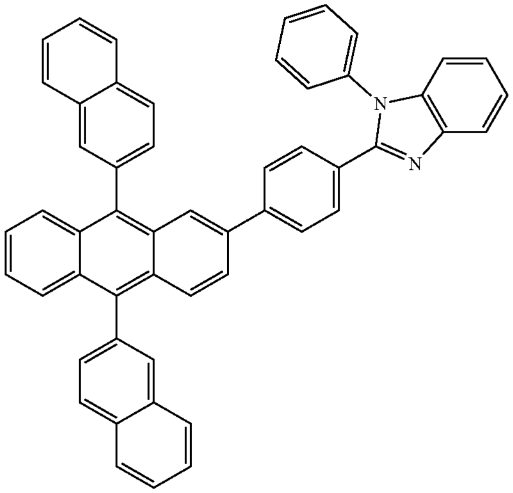

ZADN

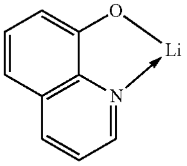

Liq

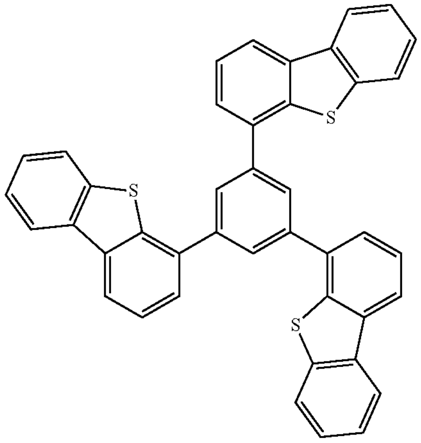

DBT3P-II

<<Fabrication of Light-Emitting Devices>>

In each of the light-emitting devices described in this example, as illustrated in FIG. 23, a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915. The light-emitting devices each have a device structure using the same materials in the functional layers, as shown in Table 1. However, part of the fabrication process differs between the light-emitting devices. In the reference light-emitting device 4, the components from the first electrode 901 to the second electrode 903 and a cap layer (CAP) 904 were formed successively. Meanwhile, in the light-emitting device 1, an electron-transport layer 914-2 was formed and then temporarily exposed to a nitrogen atmosphere (dew point: −78.0° C., moisture concentration: 0.8 ppm, oxygen concentration: 1 ppm) for one hour (also referred to as $N_2$ exposure treatment), and then the electron-injection layer 915, the second electrode 903, and the cap layer 904 were formed successively. In the light-emitting device 2, an electron-transport layer 914-1 was formed and then temporarily exposed to a nitrogen atmosphere (dew point: −78.0° C., moisture concentration: 0.8 ppm, oxygen concentration: 1 ppm) for one hour, and then the electron-transport layer 914-2, the electron-injection layer 915, the second electrode 903, and the cap layer 904 were formed successively. In the comparative light-emitting device 3, the light-emitting layer 913 was formed and then temporarily exposed to a nitrogen atmosphere (dew point: −78.0° C., moisture concentration: 0.8 ppm, oxygen concentration: 1 ppm) for one hour, and then the electron-transport layer 914 (914-1 and 914-2), the electron-injection layer 915, the second electrode 903, and the cap layer 904 were formed successively.

First, the first electrode 901 was formed over the substrate 900. The electrode area was set to 4 $mm^2$ (2 mm×2 mm). A glass substrate was used as the substrate 900. The first electrode 901 was formed in such a manner that 10-nm-thick indium tin oxide containing silicon oxide (ITSO) was deposited by a sputtering method, and then 100-nm-thick silver (Ag) was deposited by a sputtering method, and 10-nm-thick ITSO was subsequently deposited.

Here, for pretreatment, a surface of the substrate 900 was washed with water, baking was performed at 200° C. for one hour, and then UV ozone treatment was performed for 370 seconds. After that, the substrate was transferred into a vacuum evaporation apparatus where the pressure had been reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Next, the hole-injection layer 911 was formed over the first electrode 901. The hole-injection layer 911 was formed in such a manner that the pressure in a vacuum evaporation apparatus was reduced to $1\times10^{-4}$ Pa, and then N-(1,1'-biphenyl-4-yl)-N-[4-(9-phenyl-9H-carbazol-3-yl)phenyl]-9,9-dimethyl-9H-fluoren-2-amine (abbreviation: PCBBiF) and an electron acceptor material (OCHD-003) that contains fluorine and has a molecular weight of 672 were deposited by co-evaporation to a thickness of 10 nm in a mass ratio of PCBBiF:OCHD-003=1:0.03.

Subsequently, the hole-transport layer 912 (a hole-transport layer 912-1 and a hole-transport layer 912-2) was formed over the hole-injection layer 911. First, the hole-transport layer 912-1 was formed to a thickness of 97.5 nm by evaporation using PCBBiF. Then, the hole-transport layer 912-2 was formed to a thickness of 10 nm by evaporation using N,N-bis[4-(dibenzofuran-4-yl)phenyl]-4-amino-p-terphenyl (abbreviation: DBfBB1TP).

Next, the light-emitting layer 913 was formed over the hole-transport layer 912.

The light-emitting layer 913 was formed by co-evaporation using 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) as a guest material (fluorescent material) such that the weight ratio of αN-βNPAnth to 3,10PCA2Nbf(IV)-02 was 1:0.015. The thickness was set to 25 nm. Here, for the comparative light-emitting device 3, the surface of the light-emitting layer 913 was temporarily exposed to a nitrogen atmosphere (dew point: −78.0° C., moisture concentration: 0.8 ppm, oxygen concentration: 1 ppm) for one hour, i.e., was subjected to $N_2$ exposure treatment.

Next, the electron-transport layer 914 (the electron-transport layer 914-1 and the electron-transport layer 914-2) was formed over the light-emitting layer 913.

The electron-transport layer 914-1 was formed to a thickness of 20 nm by evaporation of 2-[3'-(9,9-dimethyl-9H-fluoren-2-yl)-1,1'-biphenyl-3-yl]-4,6-diphenyl-1,3,5-triazine (abbreviation: mFBPTzn).

Here, for the light-emitting device 2, the surface of the electron-transport layer 914-1 was temporarily exposed to a nitrogen atmosphere (dew point: −78.0° C., moisture concentration: 0.8 ppm, oxygen concentration: 1 ppm) for one hour, i.e., was subjected to $N_2$ exposure treatment. Then, the electron-transport layer 914-2 was formed to a thickness of 15 nm by co-evaporation using 2-{4-[9,10-di(naphthalen-2-yl)-2-anthryl]phenyl}-1-phenyl-1H-benzimidazole (abbreviation: ZADN) and 8-hydroxyquinolinato-lithium (abbreviation: Liq) in a weight ratio of ZADN:Liq=1:1. Here, for the light-emitting device 1, the surface of the electron-transport layer 914-2 was temporarily exposed to a nitrogen atmosphere (moisture concentration: 1 ppm, oxygen concentration: 1 ppm) for one hour, i.e., was subjected to $N_2$ exposure treatment.

Then, the electron-injection layer 915 was formed over the electron-transport layer 914. The electron-injection layer 915 was formed to a thickness of 1 nm by evaporation of lithium fluoride (LiF).

After that, the second electrode 903 was formed over the electron-injection layer 915. The second electrode 903 was formed by co-evaporation using silver (Ag) and magnesium (Mg) in a weight ratio of Ag:Mg=1:0.1. The thickness was set to 15 nm. In this example, the second electrode 903 has a light-transmitting property and functions as a cathode.

Through the above steps, a light-emitting device that includes an EL layer 902 between the pair of electrodes over the substrate 900 and has a top-emission structure in which light is extracted from the second electrode 903 was formed. Note that the reference light-emitting device 4 shown in Table 1 is a light-emitting device that has never been exposed to a nitrogen atmosphere (subjected to $N_2$ exposure treatment) in the steps thus far. Note that the hole-injection layer 911, the hole-transport layer 912, the light-emitting layer 913, the electron-transport layer 914, and the electron-injection layer 915 described in the above steps are the functional layers included in the EL layer in one embodiment of the present invention. Furthermore, in all the evaporation steps in the fabrication method shown in this example, evaporation was performed by a resistance-heating method.

The light-emitting device fabricated as described above includes the cap layer (CAP) 904 over the second electrode 903. The cap layer 904 was formed to a thickness of 80 nm by evaporation of 4,4',4"-(benzene-1,3,5-triyl)tri(dibenzothiophene) (abbreviation: DBT3P-II).

Note that the device in which the components up to the cap layer were formed was sealed with another substrate (not illustrated). The substrate (not illustrated) to which a sealant to be cured by ultraviolet light was applied was fixed to the substrate 900 in a glove box containing a nitrogen atmosphere, and the substrates were bonded to each other such that the sealant was attached to surround the light-emitting device formed over the substrate 900. In the sealing process, the sealant was irradiated with 365-nm ultraviolet light at 6 J/$cm^2$ to be cured, and the sealant was heated at 80° C. for one hour to be stabilized.

<<Operating Characteristics of Light-Emitting Devices>>

Figure 24:
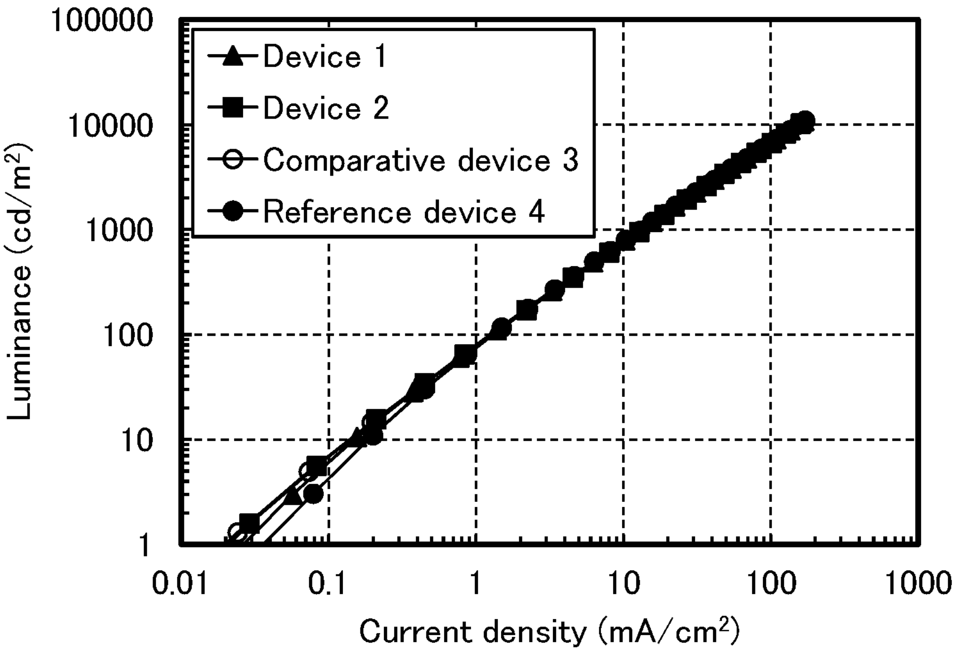
FIG. 24 shows the luminance-current density characteristics of light-emitting devices 1 and 2, a comparative light-emitting device 3, and a reference light-emitting device 4.
Figure 25:
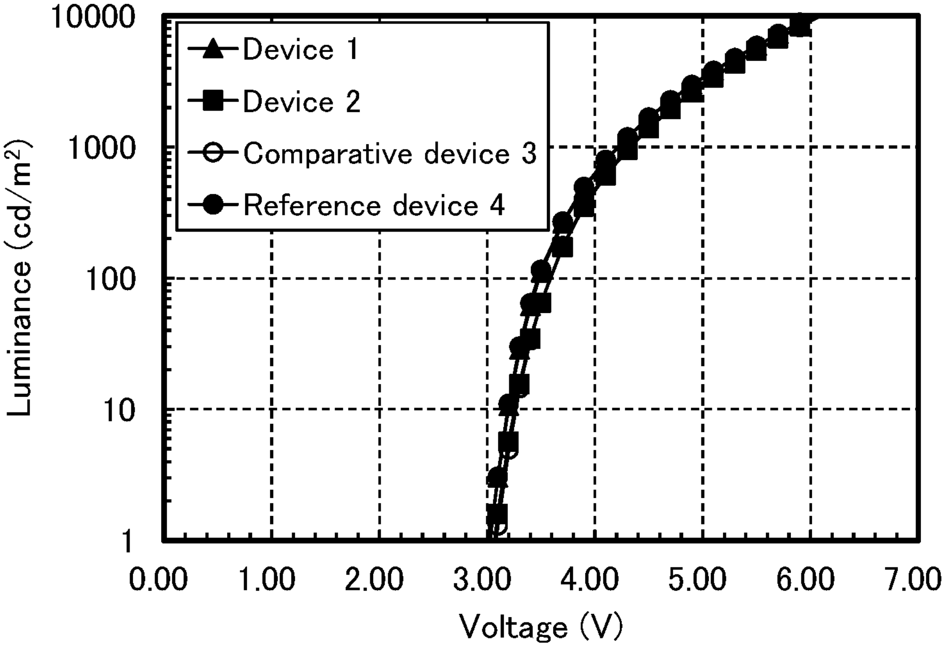
FIG. 25 shows the luminance-voltage characteristics of the light-emitting devices 1 and 2, the comparative light-emitting device 3, and the reference light-emitting device 4.
Figure 26:
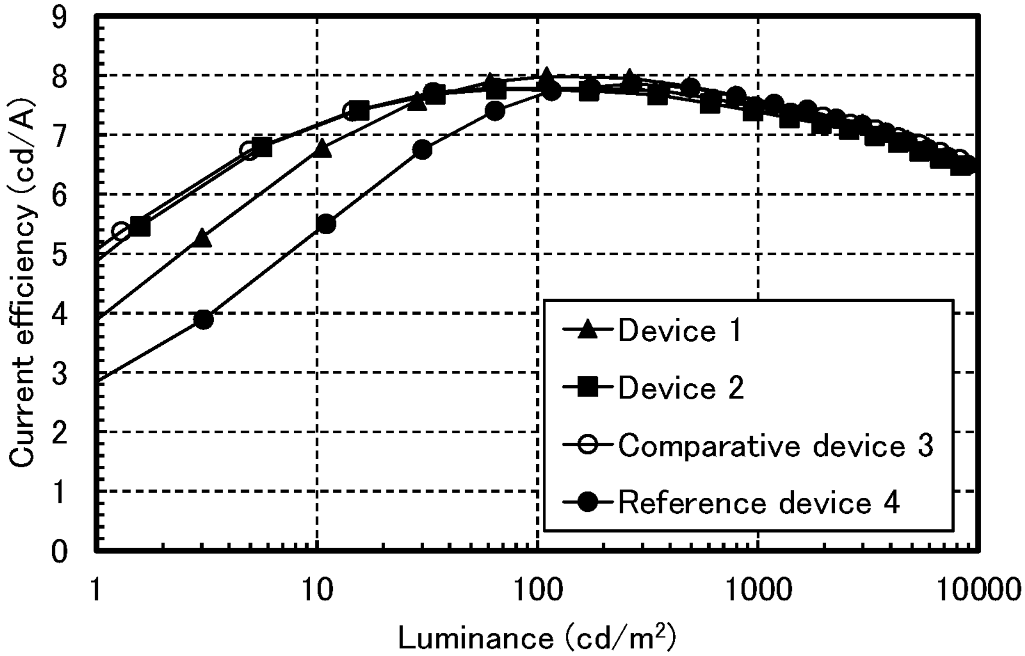
FIG. 26 shows the current efficiency-luminance characteristics of the light-emitting devices 1 and 2, the comparative light-emitting device 3, and the reference light-emitting device 4.
Figure 27:
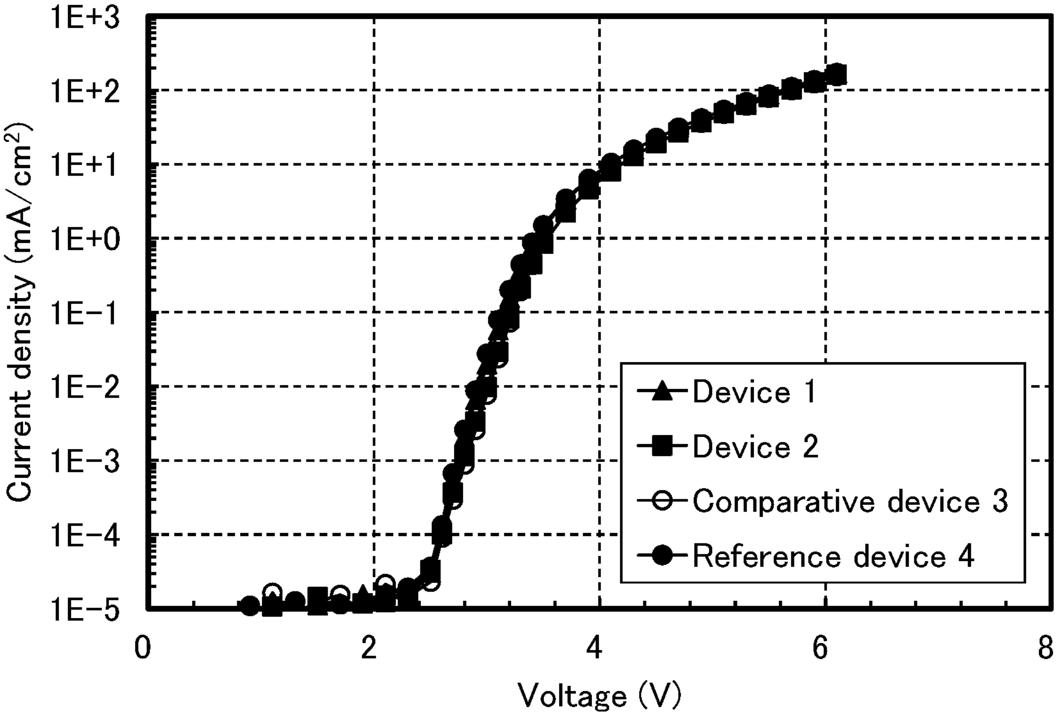
FIG. 27 shows the current density-voltage characteristics of the light-emitting devices 1 and 2, the comparative light-emitting device 3, and the reference light-emitting device 4.
Figure 28:
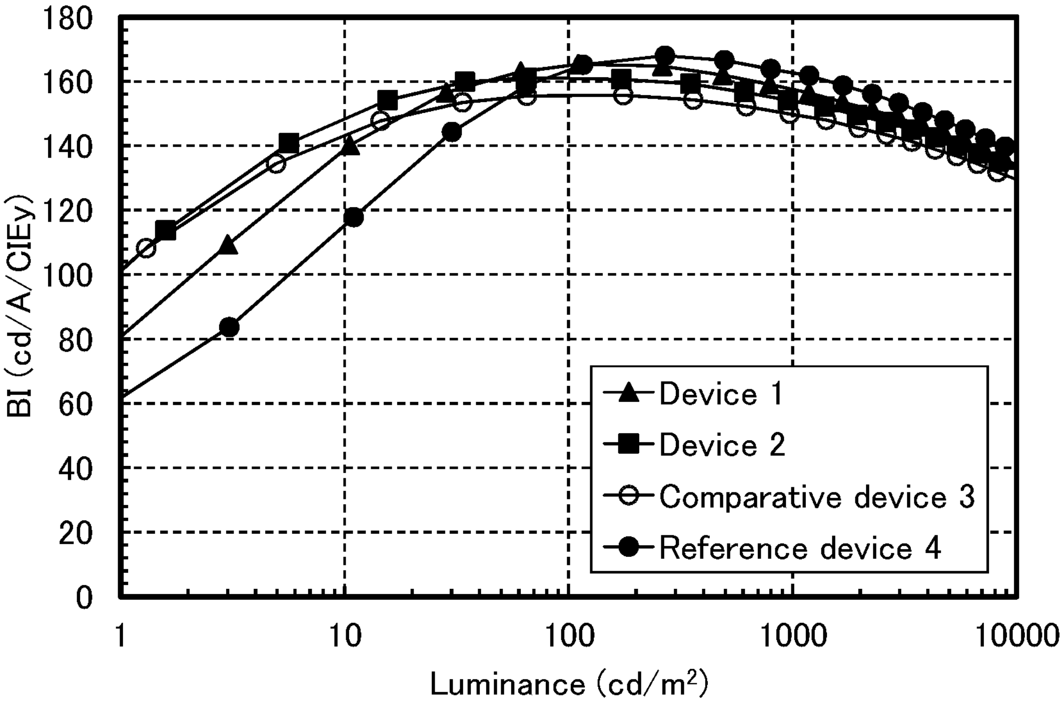
FIG. 28 shows the blue index-luminance characteristics of the light-emitting devices 1 and 2, the comparative light-emitting device 3, and the reference light-emitting device 4.

The operating characteristics of the fabricated light-emitting devices were measured. Note that the measurement was performed at room temperature. As the results of measuring the operating characteristics of the light-emitting devices, FIG. 24 shows luminance-current density characteristics, FIG. 25 shows luminance-voltage characteristics, FIG. 26 shows current efficiency-luminance characteristics, FIG. 27 shows current density-voltage characteristics, and FIG. 28 shows blue index (BI)-luminance characteristics. Luminance, CIE chromaticity, and emission spectra were measured at normal temperature with a spectroradiometer (SR-UL1R manufactured by TOPCON TECHNOHOUSE CORPORATION).

The blue index (BI) shown in FIG. 28 is a value obtained by dividing current efficiency (cd/A) by chromaticity y, and is one of the indicators of characteristics of blue light emission. As the chromaticity y is smaller, the color purity of blue light emission tends to be higher. With high color purity, a wide range of blue can be expressed even with a small number of luminance components; hence, using blue light emission with high color purity reduces the luminance needed for expressing blue, leading to lower power consumption. Thus, BI that is based on chromaticity y, which is one of the indicators of color purity of blue, is suitably used as a means for showing efficiency of blue light emission. The light-emitting device with higher BI can be regarded as a blue light-emitting device having higher efficiency for a display.

The above results demonstrate that, as for the initial characteristics shown in FIGS. 24 to 28, current efficiency, power efficiency, and the like on the low luminance side of the light-emitting device 1 and the light-emitting device 2 described in this example are slightly different from those of the reference light-emitting device 4, but their emission efficiency on the high luminance side, which affects light-emitting device characteristics, is substantially as high as that of the reference light-emitting device 4.

Figure 29:
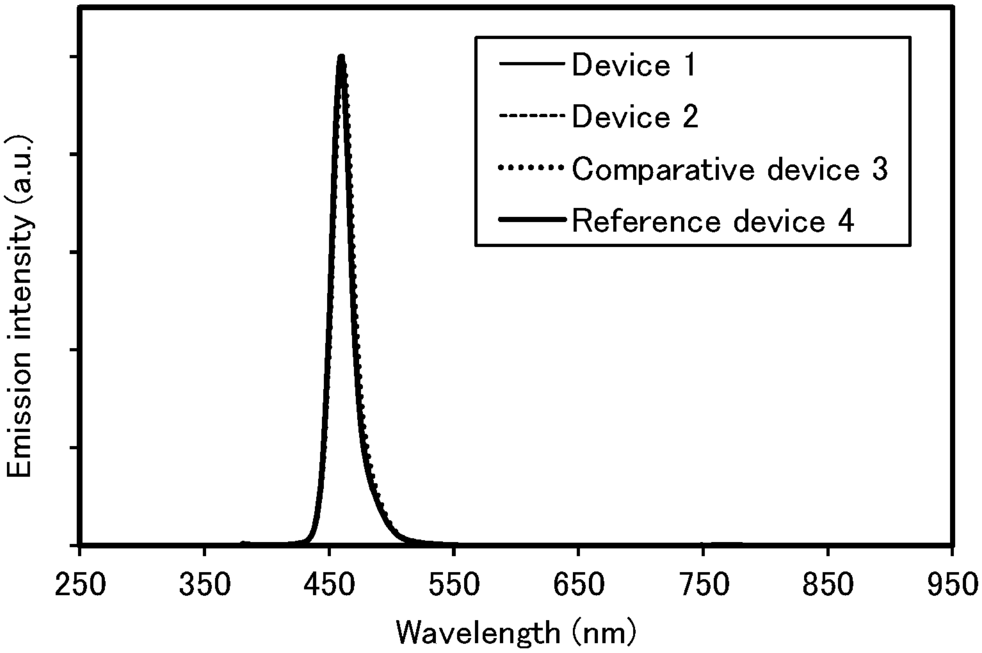
FIG. 29 shows the emission spectra of the light-emitting devices 1 and 2, the comparative light-emitting device 3, and the reference light-emitting device 4.

FIG. 29 shows emission spectra when current flowed at a current density (10 to mA/$cm^2$) with which the light-emitting devices emitted light at a luminance of approximately 1000 cd/$m^2$. As shown in FIG. 29, the emission spectra of these light-emitting devices have a peak at around 460 nm, which is presumably derived from light emission of 3,10PCA2Nbf(IV)-02 contained in the light-emitting layer 913.

Figure 30:
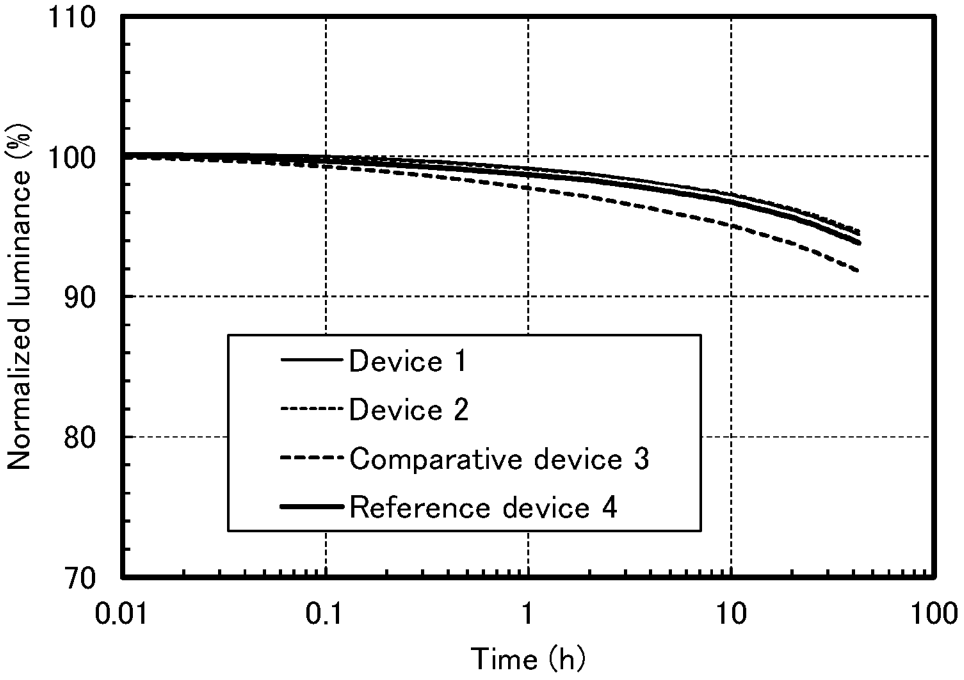
FIG. 30 shows the reliability of the light-emitting devices 1 and 2, the comparative light-emitting device 3, and the reference light-emitting device 4.

Next, reliability tests were performed on the light-emitting devices 1 and 2, the comparative light-emitting device 3, and the reference light-emitting device 4. FIG. 30 shows results of the reliability tests. In FIG. 30, the vertical axis represents normalized luminance (%) with an initial luminance of 100%, and the horizontal axis represents driving time (h) of the devices. As the reliability tests, constant current density driving tests for measuring a luminance change at a constant current density of 50 mA/$cm^2$ were performed at room temperature. As shown in the results in FIG. 30, the light-emitting device 1, in which $N_2$ exposure was performed after the formation of the electron-transport layer 914-2, and the light-emitting device 2, in which $N_2$ exposure was performed after the formation of the electron-transport layer 914-1, show substantially the same high reliability as that of the reference light-emitting device 4, in which exposure to a nitrogen atmosphere ($N_2$ exposure treatment) was never performed in the fabrication process. On the other hand, the comparative light-emitting device 3, in which $N_2$ exposure was performed after the formation of the light-emitting layer 913, shows lower reliability than the light-emitting device 1 and the light-emitting device 2. Thus, it is found that in the formation of the EL layer in the blue fluorescent device, the reliability of the light-emitting device is less affected by $N_2$ exposure that is performed at least not immediately after the formation of the light-emitting layer 913 but after the formation of the functional layer such as the electron-transport layer 914 formed over the light-emitting layer 913. This result shows that air exposure, patterning using a photolithography method, and the like can be performed after the formation of the functional layer such as the electron-transport layer 914 formed over the light-emitting layer 913. In other words, in fabrication of a plurality of light-emitting devices, patterning using a photolithography method or the like can be performed after the formation of the functional layer such as the electron-transport layer 914, and the functional layer formed subsequently can be formed using a layer shared by the plurality of light-emitting devices; thus, the fabrication process can be simplified.

Example 2

This example will describe a device structure, a fabrication method, and characteristics of a light-emitting device 5 that is a blue fluorescent device fabricated as the light-emitting device of one embodiment of the present invention. In the light-emitting device 5, the surface of the electron-transport layer 914-2 was subjected to $N_2$ exposure treatment by being temporarily exposed to a nitrogen atmosphere (moisture concentration: 0.5 ppm, oxygen concentration: 4 ppm) for one hour, and then the electron-injection layer 915, the second electrode 903, and the cap layer 904 were sequentially formed. Note that for comparison of device characteristics, a reference light-emitting device 6 was fabricated without performing exposure to a nitrogen atmosphere ($N_2$ exposure treatment). FIG. 23 illustrates a device structure of the light-emitting devices used in this example, and Table 2 shows specific structures. The chemical formulae of materials used in this example are shown below. The devices were fabricated in a manner similar to that in Example 1.

[Chemical Formula 4]
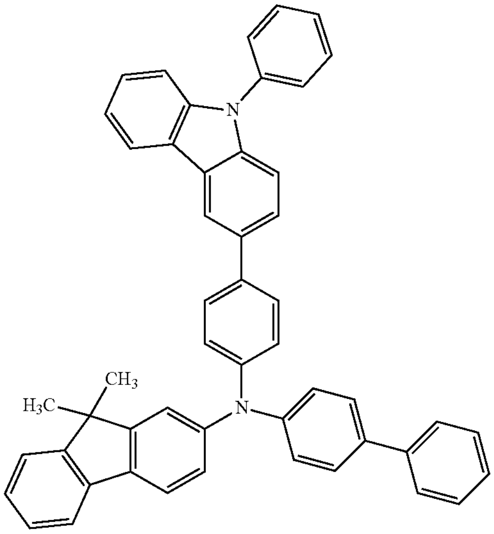
PCBBiF
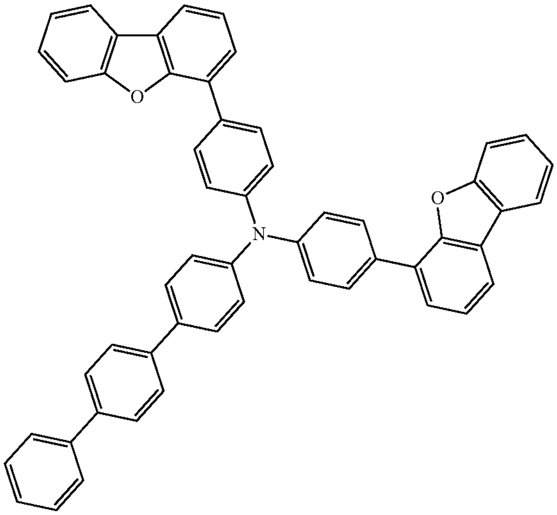
DBfBB1TP
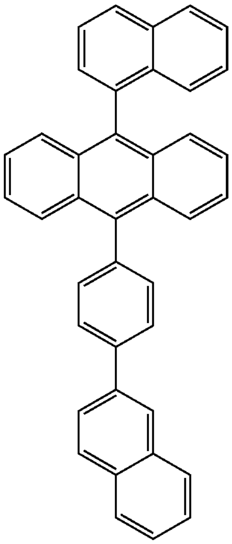
αN-βNPAnth
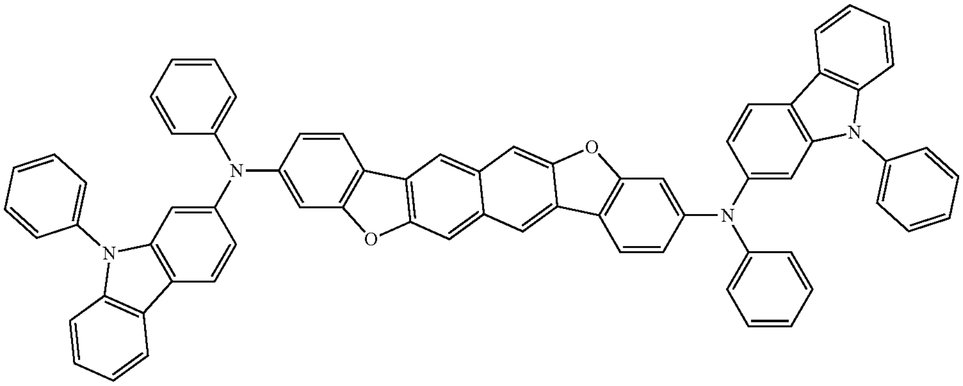
3,10PCA2Nbf(IV)-02

-continued

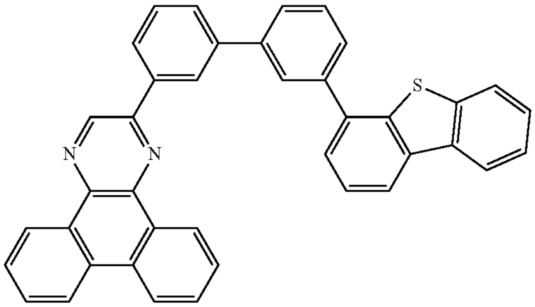

2mDBTBPDBq-II

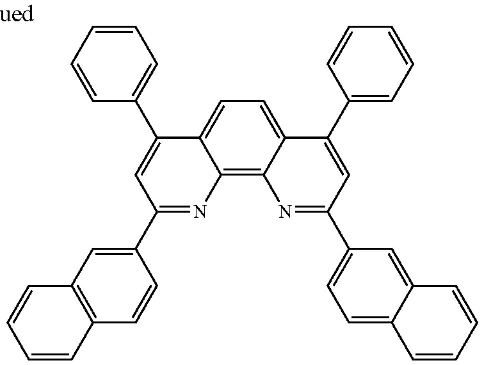

NBphen

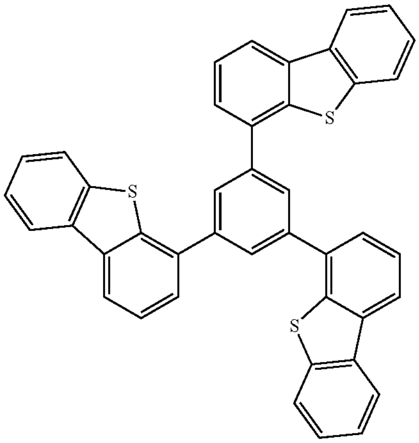

DBT3P-II

In Chemical Formula above, 2-[3'-(dibenzothiophen-4-yl) biphenyl-3-yl]dibenzo[f,h]quinoxaline (abbreviation: 2mDBTBPDBq-II) and 2,9-bis(naphthalen-2-yl)-4,7-diphenyl-1,10-phenanthroline (abbreviation: NBPhen) are shown.

<<Operating Characteristics of Light-Emitting Devices>>

Figure 31:
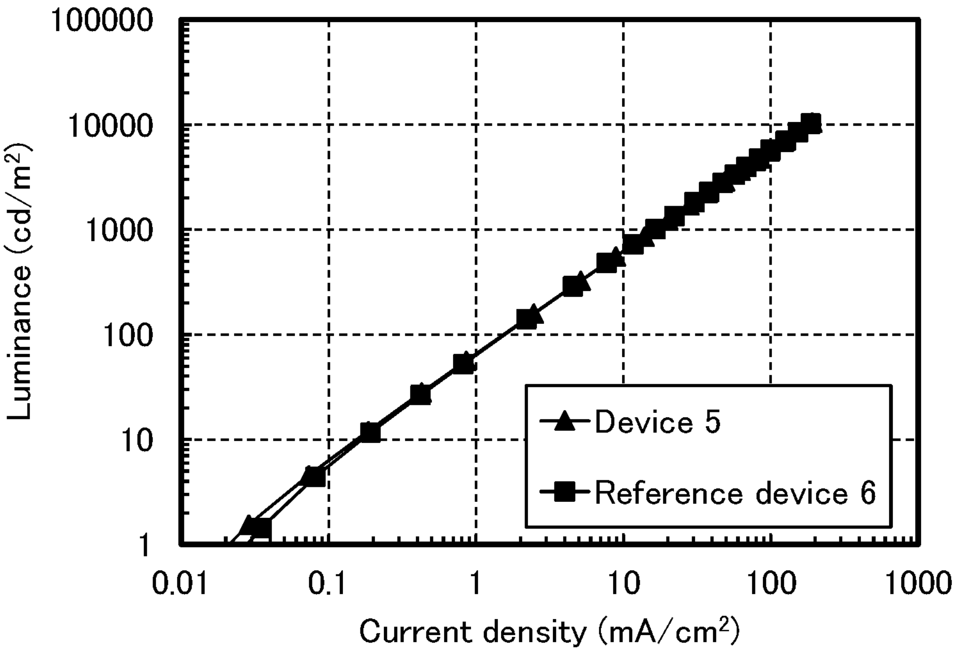
FIG. 31 shows the luminance-current density characteristics of a light-emitting device 5 and a reference light-emitting device 6.
Figure 32:
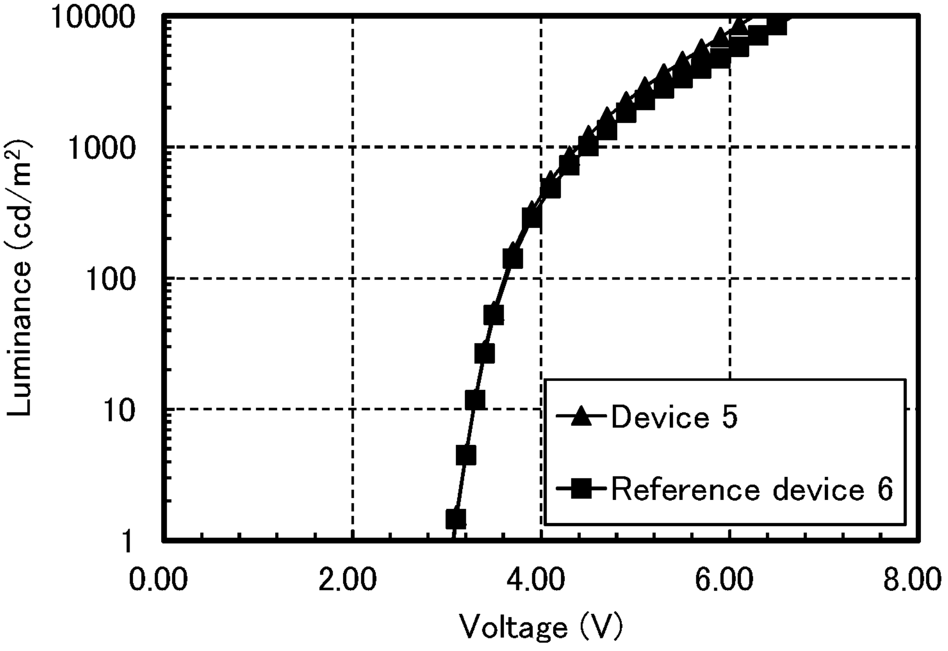
FIG. 32 shows the luminance-voltage characteristics of the light-emitting device 5 and the reference light-emitting device 6.
Figure 33:
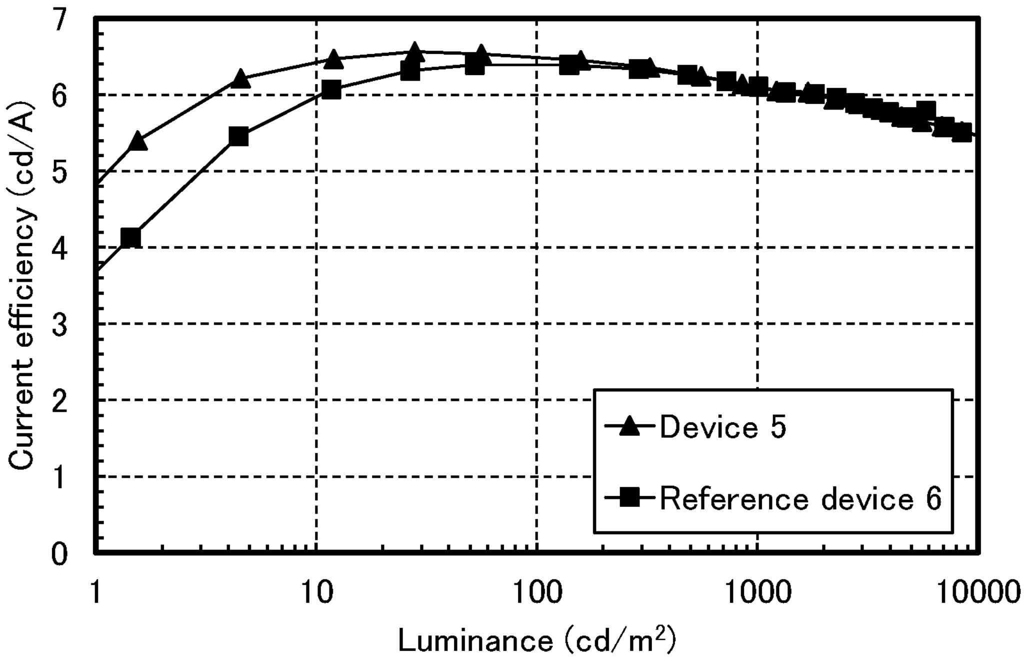
FIG. 33 shows the current efficiency-luminance characteristics of the light-emitting device 5 and the reference light-emitting device 6.
Figure 34:
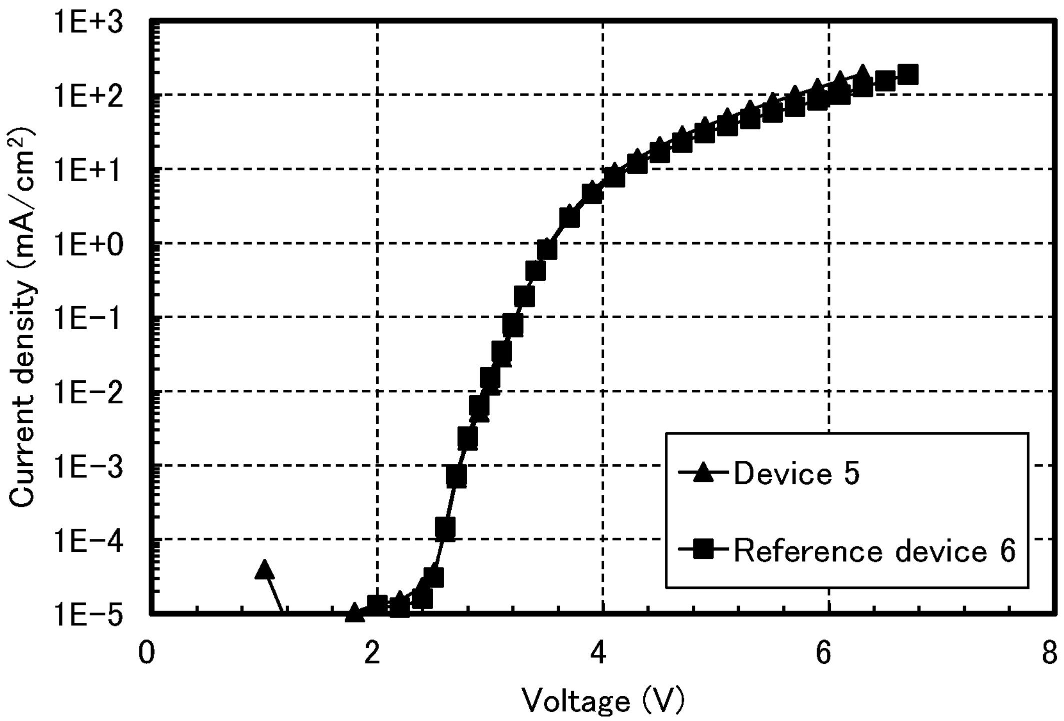
FIG. 34 shows the current density-voltage characteristics of the light-emitting device 5 and the reference light-emitting device 6.
Figure 35:
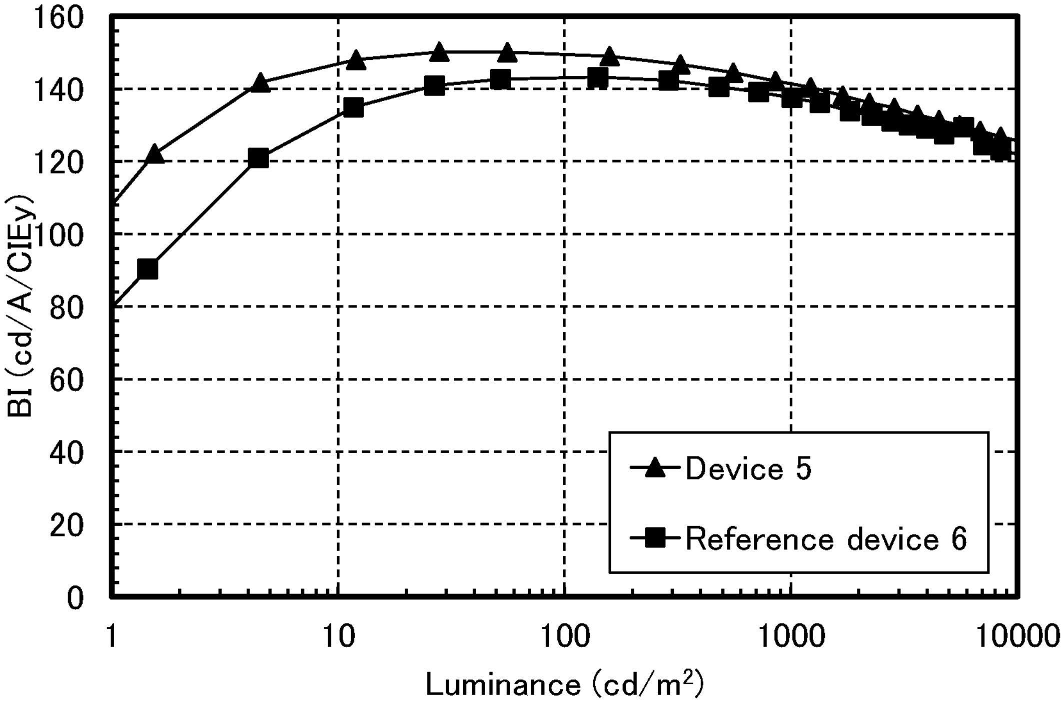
FIG. 35 shows the blue index-luminance characteristics of the light-emitting device 5 and the reference light-emitting device 6.

The operating characteristics of the fabricated light-emitting devices were measured. Note that the measurement was performed at room temperature. As the results of measuring the operating characteristics of the light-emitting devices, FIG. 31 shows luminance-current density characteristics, FIG. 32 shows luminance-voltage characteristics, FIG. 33 shows current efficiency-luminance characteristics, FIG. 34 shows current density-voltage characteristics, and FIG. 35 shows blue index (BI)-luminance characteristics. Luminance, CIE chromaticity, and emission spectra were measured at normal temperature with a spectroradiometer (SR-UL1R manufactured by TOPCON TECHNOHOUSE CORPORATION).

The above results demonstrate that, as for the initial characteristics shown in FIGS. 31 to 35, current efficiency, power efficiency, and the like on the low luminance side of the light-emitting device 5 described in this example are slightly different from those of the reference light-emitting device 6, but its emission efficiency on the high luminance side, which affects light-emitting device characteristics, is substantially as high as that of the reference light-emitting device 6.

Figure 36:
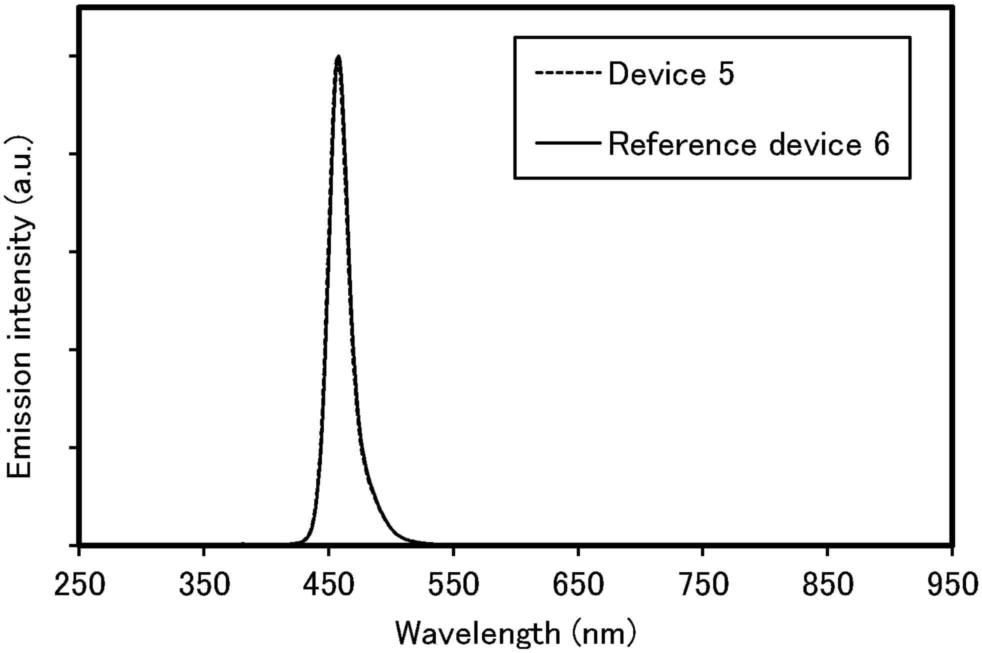
FIG. 36 shows the emission spectra of the light-emitting device 5 and the reference light-emitting device 6.

FIG. 36 shows emission spectra when current flowed at a current density (10 to mA/cm$^2$) with which the light-emitting devices emitted light at a luminance of approximately 1000 cd/m$^2$. As shown in FIG. 36, the emission spectra of these light-emitting devices have a peak at around 457 nm, which is presumably derived from light emission of 3,10PCA2Nbf(IV)-02 contained in the light-emitting layer 913.

Figure 37:
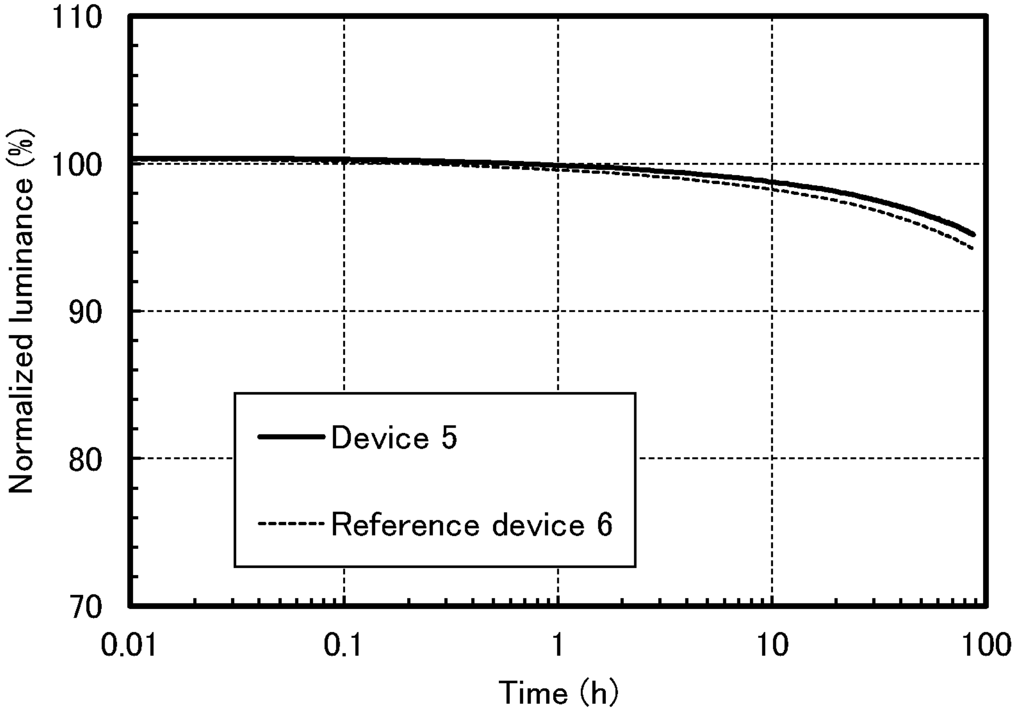
FIG. 37 shows the reliability of the light-emitting device 5 and the reference light-emitting device 6.

Next, reliability tests were performed on the light-emitting device 5 and the reference light-emitting device 6. FIG. 37 shows results of the reliability tests. In FIG. 37, the vertical axis represents normalized luminance (%) with an initial luminance of 100%, and the horizontal axis represents driving time (h) of the devices. As the reliability tests, constant current density driving tests for measuring a luminance change at a constant current density of 50 mA/cm$^2$ were performed at room temperature. As shown in the results in FIG. 37, the light-emitting device 5, in which $N_2$ exposure was performed after the formation of the electron-transport layer 914-2, shows substantially the same high reliability as that of the reference light-emitting device 6, in which exposure to a nitrogen atmosphere ($N_2$ exposure treatment) was never performed in the fabrication process. Thus, it is found that in the formation of the EL layer in the blue fluorescent device, $N_2$ exposure is less likely to affect the reliability of the light-emitting device as long as it is performed after the formation of the functional layer such as the electron-transport layer 914. This means that air exposure, patterning using a photolithography method, and the like can be performed after the formation of the functional layer such as the electron-transport layer 914. In other words, in fabrication of a plurality of light-emitting devices, patterning using a photolithography method or the like can be performed after the formation of the functional layer such as the electron-transport layer 914, and the functional layer formed subsequently can be formed using a layer shared by the plurality of light-emitting devices; thus, the fabrication process can be simplified.

Example 3

This example will describe a device structure, a fabrication method, and characteristics of a light-emitting device 7 that is a red phosphorescent device fabricated as the light-emitting device of one embodiment of the present invention. In the light-emitting device 7, the surface of the electron-transport layer 914-2 was subjected to $N_2$ exposure treatment by being temporarily exposed to a nitrogen atmosphere (dew point: around −80° C., moisture concentration: 0.5 ppm, oxygen concentration: 3 ppm) for one hour, and then the electron-injection layer 915, the second electrode 903, and the cap layer 904 were sequentially formed. Note that for comparison of device characteristics, a reference light-emitting device 8 was fabricated without performing exposure to a nitrogen atmosphere ($N_2$ exposure treatment). FIG. 23 illustrates a device structure of the light-emitting devices used in this example, and Table 3 shows specific structures. The chemical formulae of materials used in this example are shown below. The devices were fabricated in a manner similar to that in Example 1.

[Chemical Formula 5]

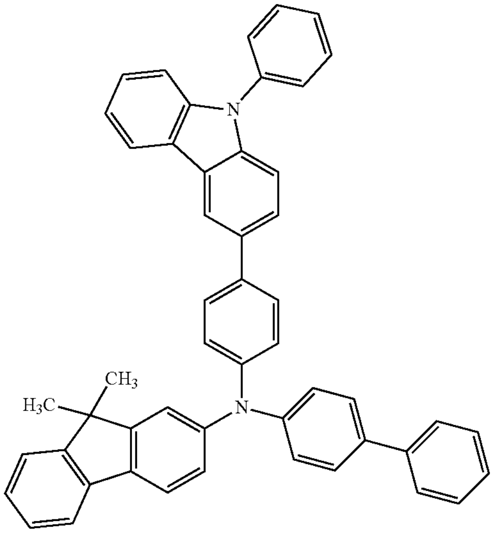

PCBBiF

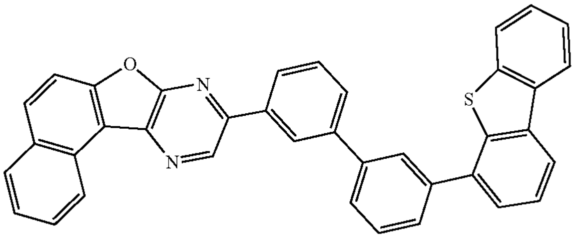

9mDBtBPNfpr

-continued

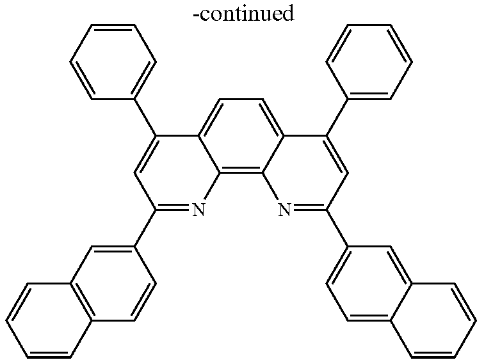

NBphen

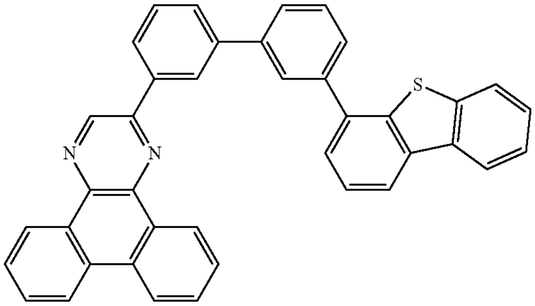

2mDBTBPDBq-II

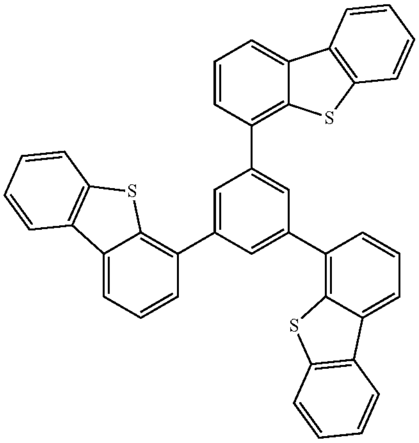

DBT3P-II

In Chemical Formula above, 9-[(3'-dibenzothiophen-4-yl)biphenyl-3-yl]naphtho[1',2':4,5]furo[2,3-b]pyrazine (abbreviation: 9mDBtBPNfpr) is shown.

<<Operating Characteristics of Light-Emitting Devices>>

Figure 38:
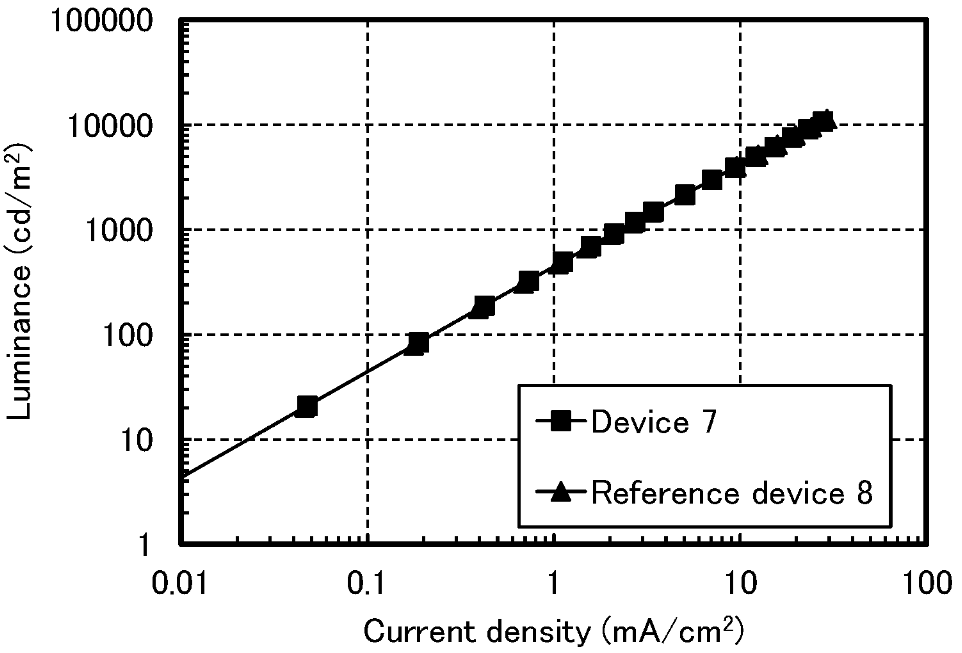
FIG. 38 shows the luminance-current density characteristics of a light-emitting device 7 and a reference light-emitting device 8.
Figure 39:
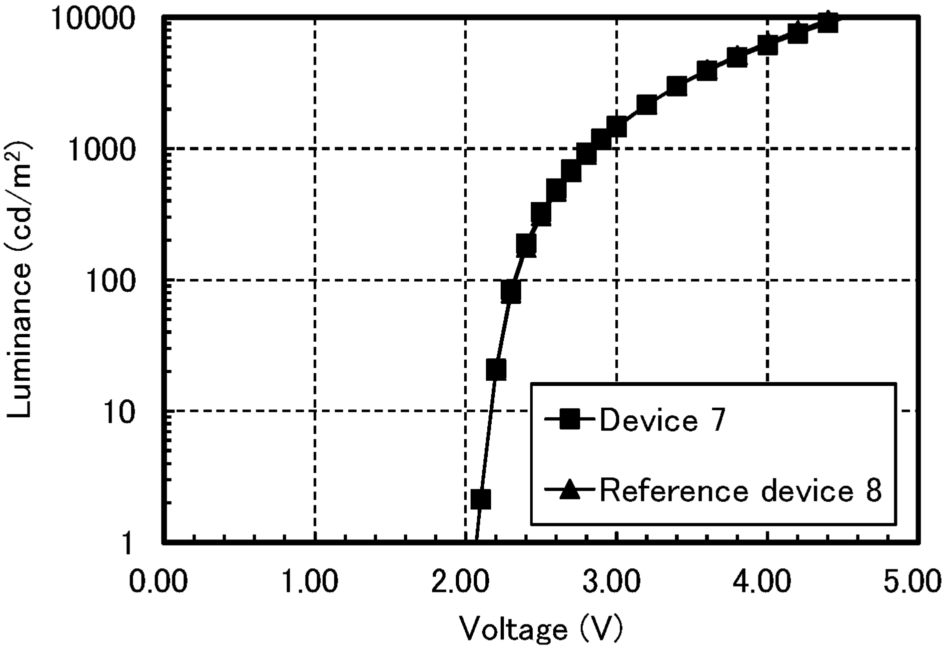
FIG. 39 shows the luminance-voltage characteristics of the light-emitting device 7 and the reference light-emitting device 8.
Figure 40:
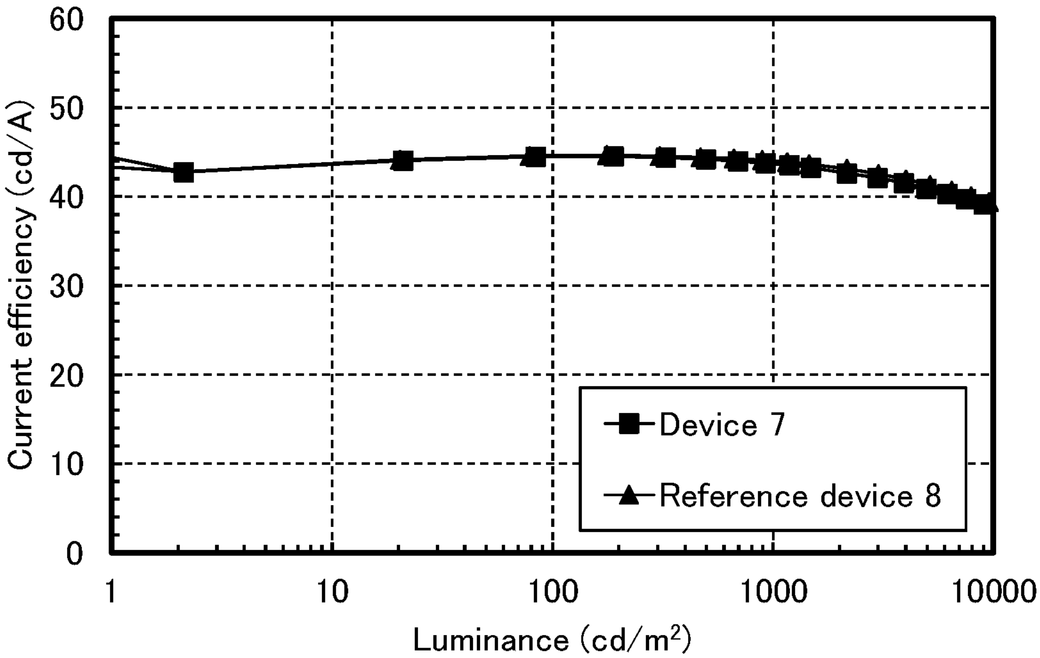
FIG. 40 shows the current efficiency-luminance characteristics of the light-emitting device 7 and the reference light-emitting device 8.
Figure 41:
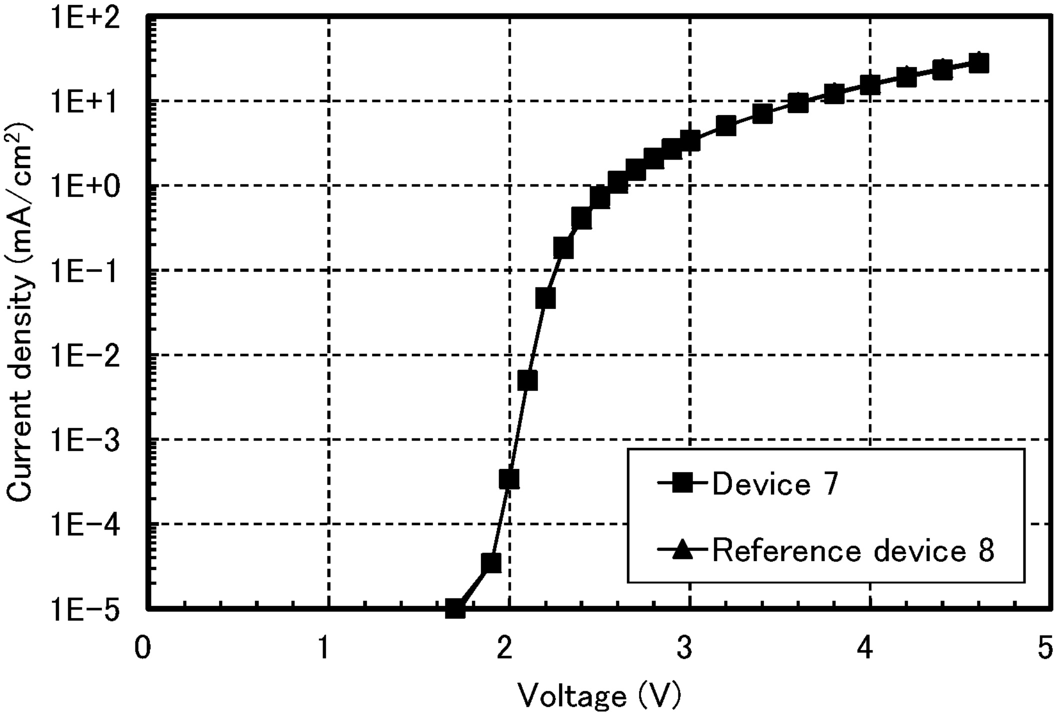
FIG. 41 shows the current density-voltage characteristics of the light-emitting device 7 and the reference light-emitting device 8.

The operating characteristics of the fabricated light-emitting devices were measured. Note that the measurement was performed at room temperature. As the results of measuring the operating characteristics of the light-emitting devices, FIG. 38 shows luminance-current density characteristics, FIG. 39 shows luminance-voltage characteristics, FIG. 40 shows current efficiency-luminance characteristics, and FIG. 41 shows current density-voltage characteristics. Luminance, CIE chromaticity, and emission spectra were measured at normal temperature with a spectroradiometer (SR-UL1R manufactured by TOPCON TECHNOHOUSE CORPORATION).

The above results reveal that the light-emitting device 7 described in this example exhibits substantially the same high emission efficiency as that of the reference light-emitting device 8, as shown in the initial characteristics in FIG. 38 to FIG. 41.

Figure 42:
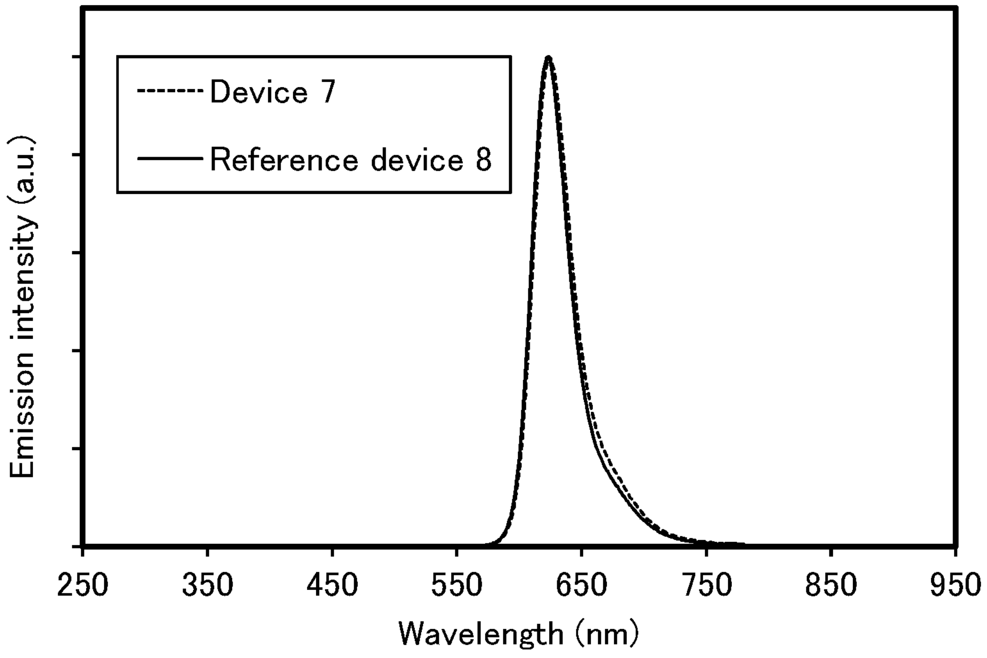
FIG. 42 shows the emission spectra of the light-emitting device 7 and the reference light-emitting device 8.

FIG. 42 shows emission spectra when current flowed at a current density (10 to mA/cm$^2$) with which the light-emitting devices emitted light at a luminance of approximately 1000 cd/m$^2$. As shown in FIG. 42, the emission spectra of these light-emitting devices have a peak at around 624 nm, which is presumably derived from light emission of the red phosphorescent dopant OCPG-006 contained in the light-emitting layer 913.

Figure 43:
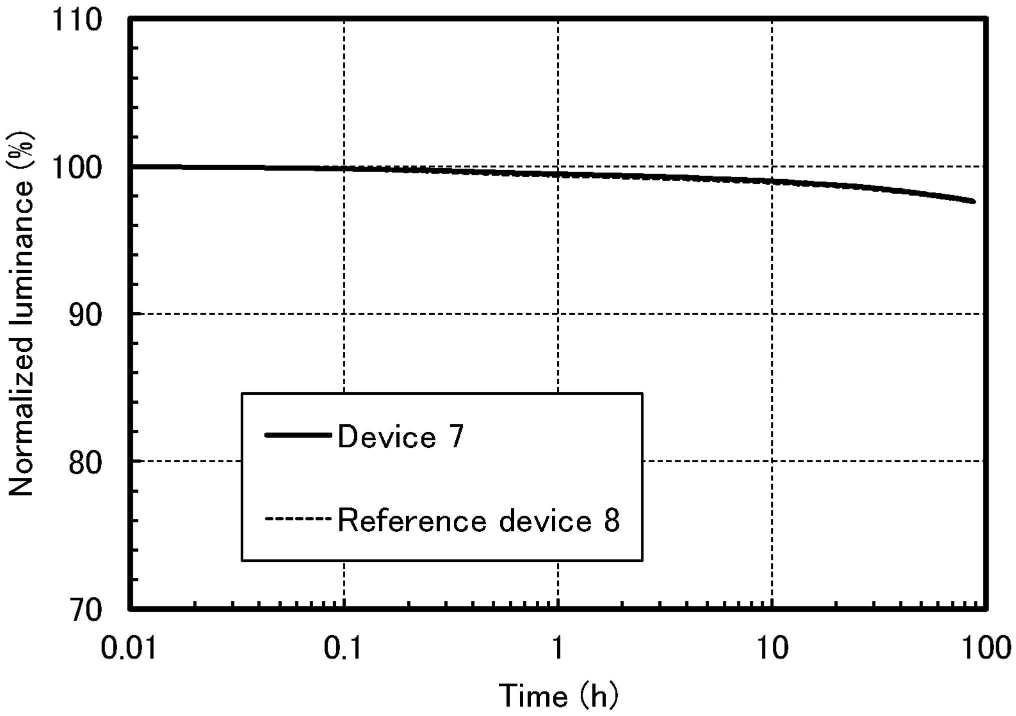
FIG. 43 shows the reliability of the light-emitting device 7 and the reference light-emitting device 8.

Next, reliability tests were performed on the light-emitting device 7 and the reference light-emitting device 8. FIG. 43 shows results of the reliability tests. In FIG. 43, the vertical axis represents normalized luminance (%) with an initial luminance of 100%, and the horizontal axis represents driving time (h) of the devices. As the reliability tests, constant current density driving tests for measuring a luminance change at a constant current density of 50 mA/cm$^2$ were performed at room temperature. As shown in the results in FIG. 43, the light-emitting device 7, in which $N_2$ exposure was performed after the formation of the electron-transport layer 914-2, shows substantially the same high reliability as that of the reference light-emitting device 8, in which exposure to a nitrogen atmosphere ($N_2$ exposure treatment) was never performed in the fabrication process. Thus, it is found that in the formation of the EL layer in the red phosphorescent device, $N_2$ exposure is less likely to affect the reliability of the light-emitting device as long as it is performed after the formation of the functional layer such as the electron-transport layer 914. This result reveals that air exposure, patterning using a photolithography method, and the like can be performed after the formation of the functional layer such as the electron-transport layer 914. In other words, in fabrication of a plurality of light-emitting devices, patterning using a photolithography method or the like can be performed after the formation of the functional layer such as the electron-transport layer 914, and the functional layer formed subsequently can be formed using a layer shared by the plurality of light-emitting devices; hence, the fabrication process can be simplified.

Example 4

This example will describe a device structure, a fabrication method, and characteristics of a light-emitting device 9 that is a green phosphorescent device fabricated as the light-emitting device of one embodiment of the present invention. In the light-emitting device 9, the surface of the electron-transport layer 914-2 was subjected to $N_2$ exposure treatment by being temporarily exposed to a nitrogen atmosphere (dew point: around −80° C., moisture concentration: 0.5 ppm, oxygen concentration: 3 ppm) for one hour, and then the electron-injection layer 915, the second electrode 903, and the cap layer 904 were sequentially formed. Note that for comparison of device characteristics, a reference light-emitting device 10 was fabricated without performing exposure to a nitrogen atmosphere ($N_2$ exposure treatment). FIG. 23 illustrates a device structure of the light-emitting devices used in this example, and Table 4 shows specific structures. The chemical formulae of materials used in this example are shown below. The devices were fabricated in a manner similar to that in Example 1.

[Chemical Formula 6]

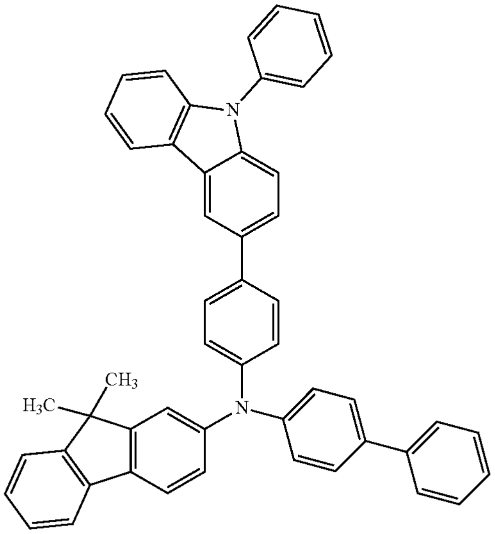

PCBBiF

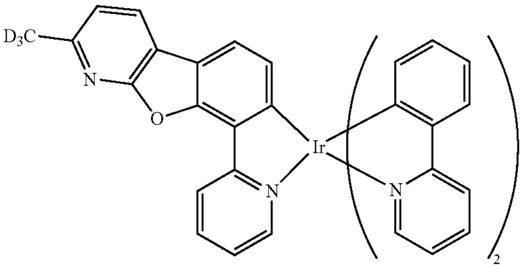

Ir(ppy)$_2$(mbfpypy-d$_3$)

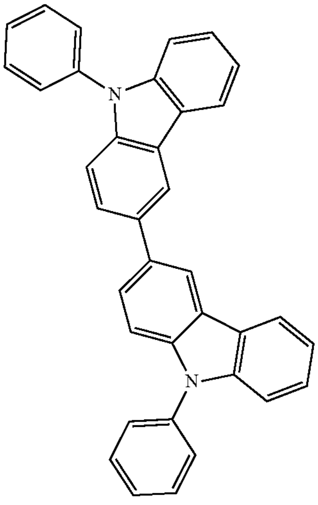

PCCP

-continued

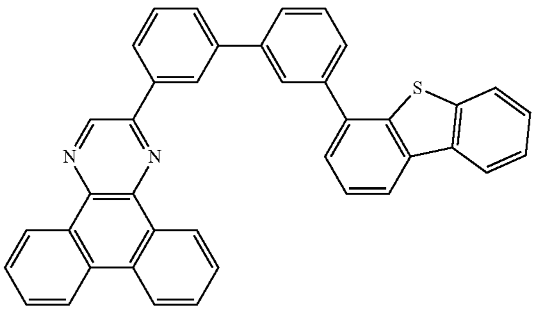

2mDBTBPDBq-II

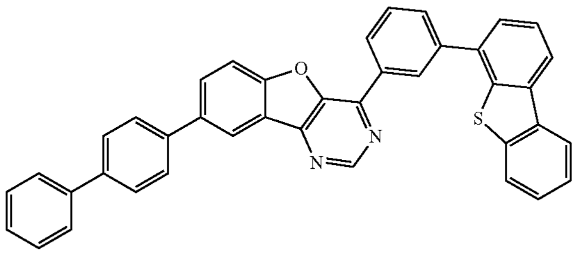

8BP-4mDBtPBfpm

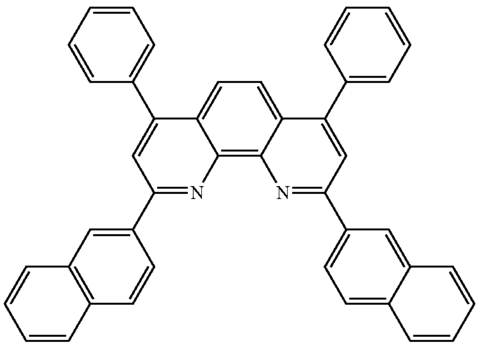

NBphen

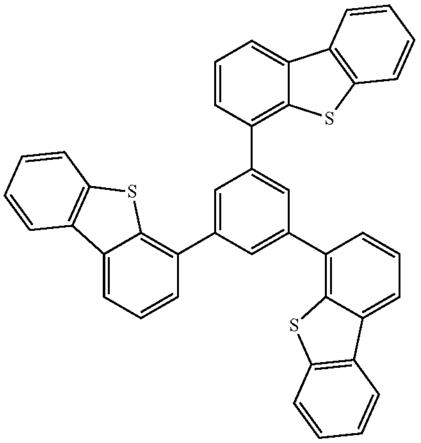

DBT3P-II

In Chemical Formula above, 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), [2-$d_3$-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy-d_3)]$), and 9-phenyl-9H-3-(9-phenyl-9H-carbazol-3-yl)carbazole (abbreviation: PCCP) are shown.

<<Operating Characteristics of Light-Emitting Devices>>

Figure 44:
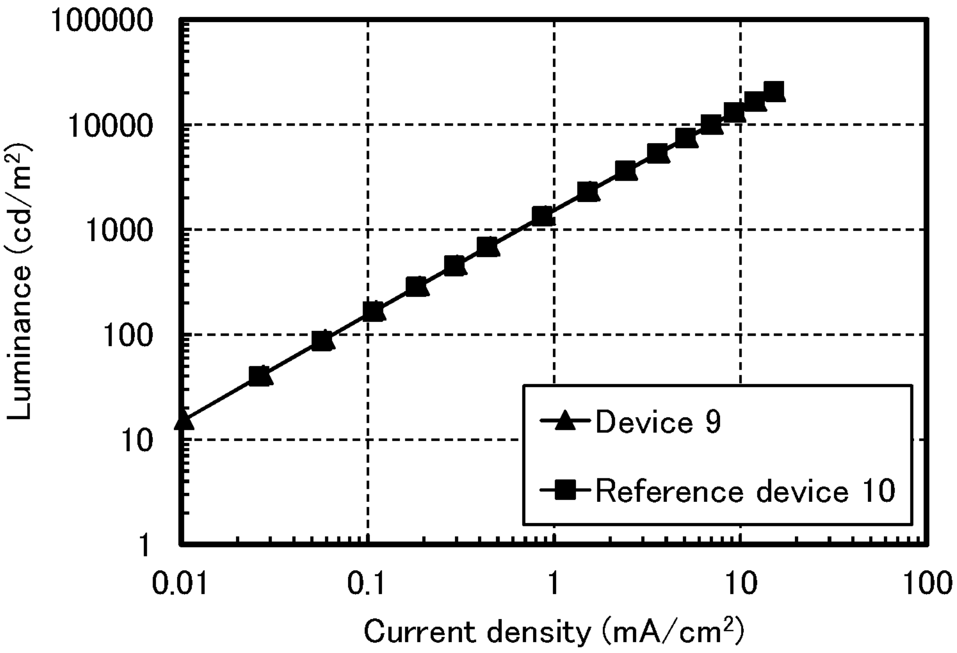
FIG. 44 shows the luminance-current density characteristics of a light-emitting device 9 and a reference light-emitting device 10.
Figure 45:
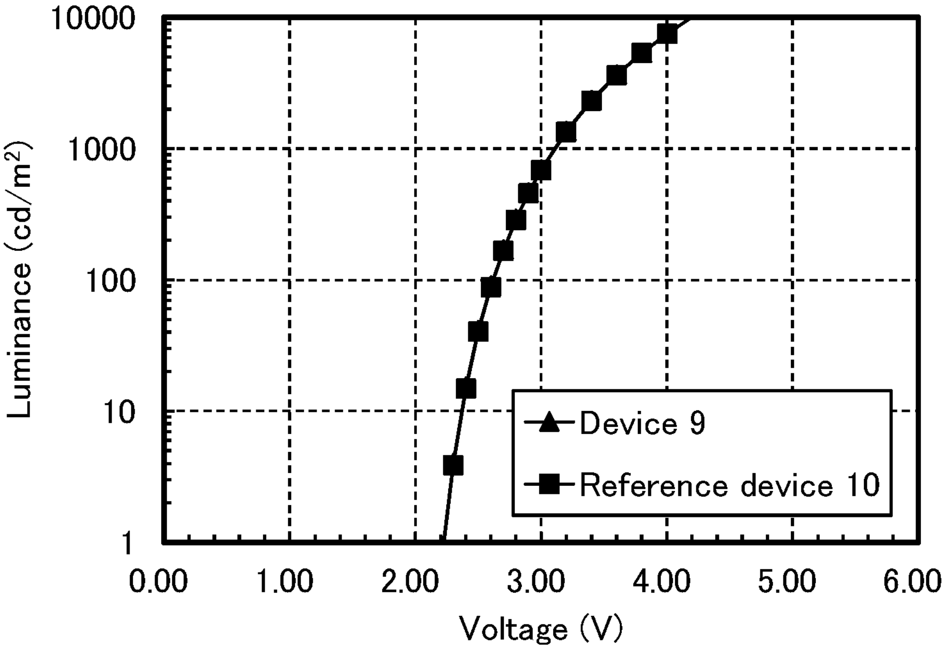
FIG. 45 shows the luminance-voltage characteristics of the light-emitting device 9 and the reference light-emitting device 10.
Figure 46:
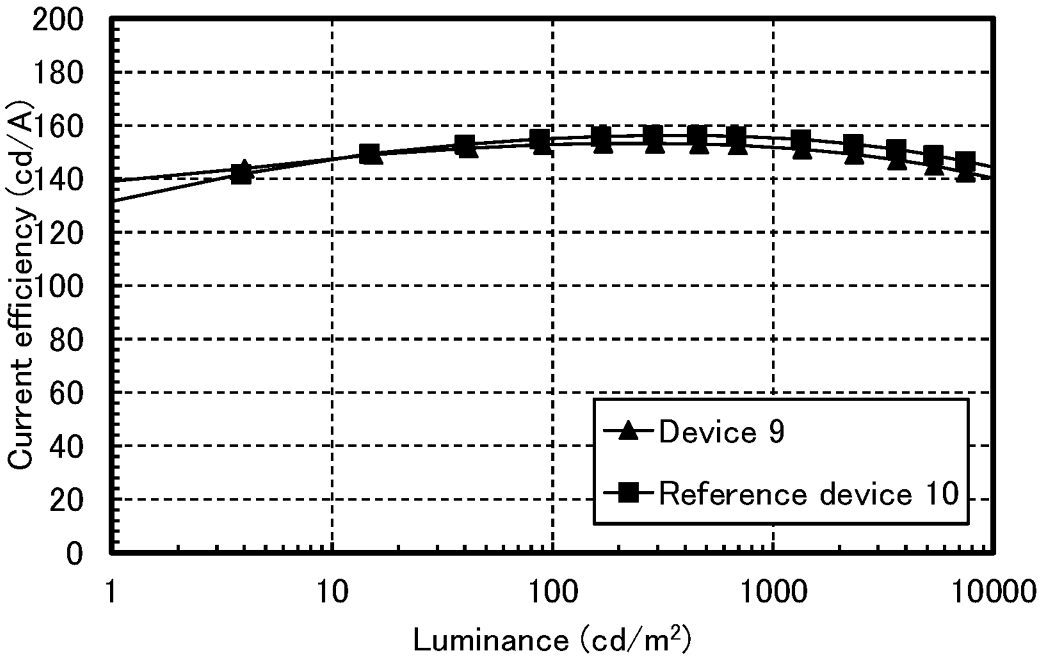
FIG. 46 shows the current efficiency-luminance characteristics of the light-emitting device 9 and the reference light-emitting device 10.
Figure 47:
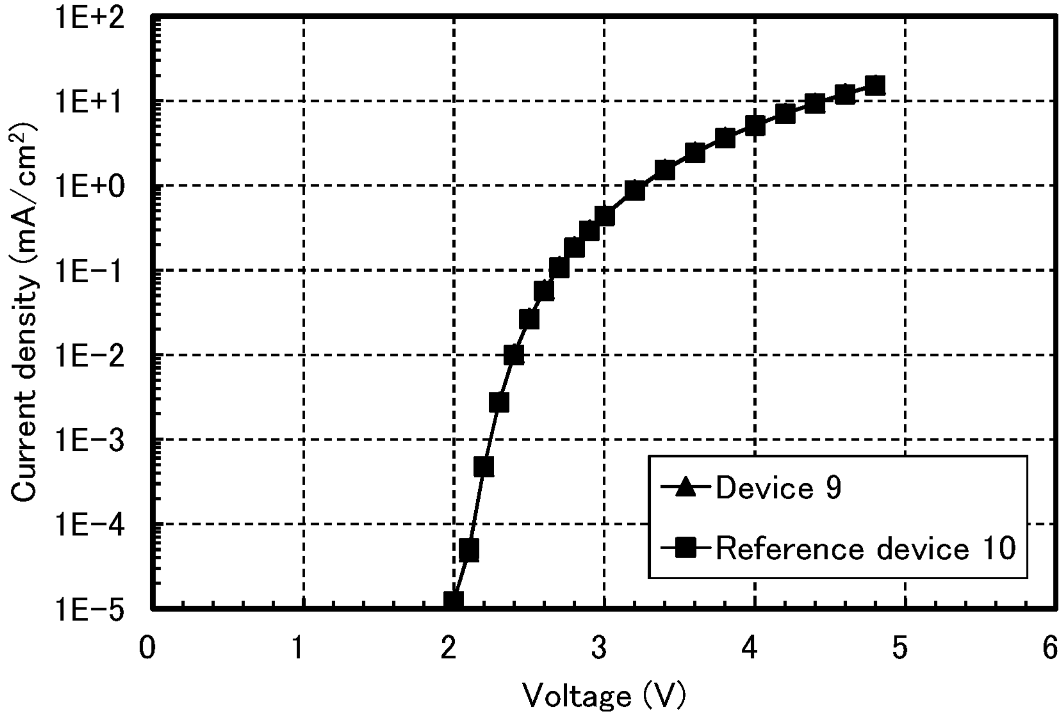
FIG. 47 shows the current density-voltage characteristics of the light-emitting device 9 and the reference light-emitting device 10.

The operating characteristics of the fabricated light-emitting devices were measured. Note that the measurement was performed at room temperature (in an atmosphere kept at 25° C.). As the results of measuring the operating characteristics of the light-emitting devices, FIG. 44 shows luminance-current density characteristics, FIG. shows luminance-voltage characteristics, FIG. 46 shows current efficiency-luminance characteristics, and FIG. 47 shows current density-voltage characteristics. Luminance, CIE chromaticity, and emission spectra were measured at normal temperature with a spectroradiometer (SR-UL1R manufactured by TOPCON TECHNOHOUSE CORPORATION).

The above results reveal that the light-emitting device 9 described in this example exhibits substantially the same high emission efficiency as that of the reference light-emitting device 10, as shown in the initial characteristics in FIG. 44 to FIG. 47.

Figure 48:
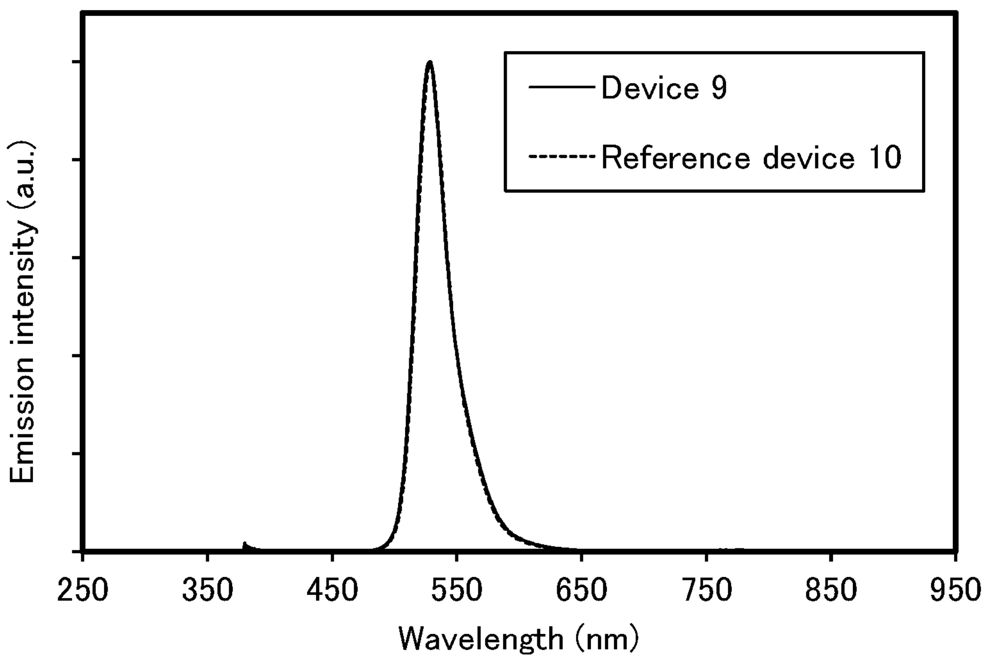
FIG. 48 shows the emission spectra of the light-emitting device 9 and the reference light-emitting device 10.

FIG. 48 shows emission spectra when current flowed at a current density (10 to mA/$cm^2$) with which the light-emitting devices emitted light at a luminance of approximately 1000 cd/$m^2$. As shown in FIG. 48, the emission spectra of these light-emitting devices have a peak at around 528 nm, which is presumably derived from light emission of $[Ir(ppy)_2(mbfpypy-d_3)]$, the green phosphorescent dopant, contained in the light-emitting layer 913.

Figure 49:
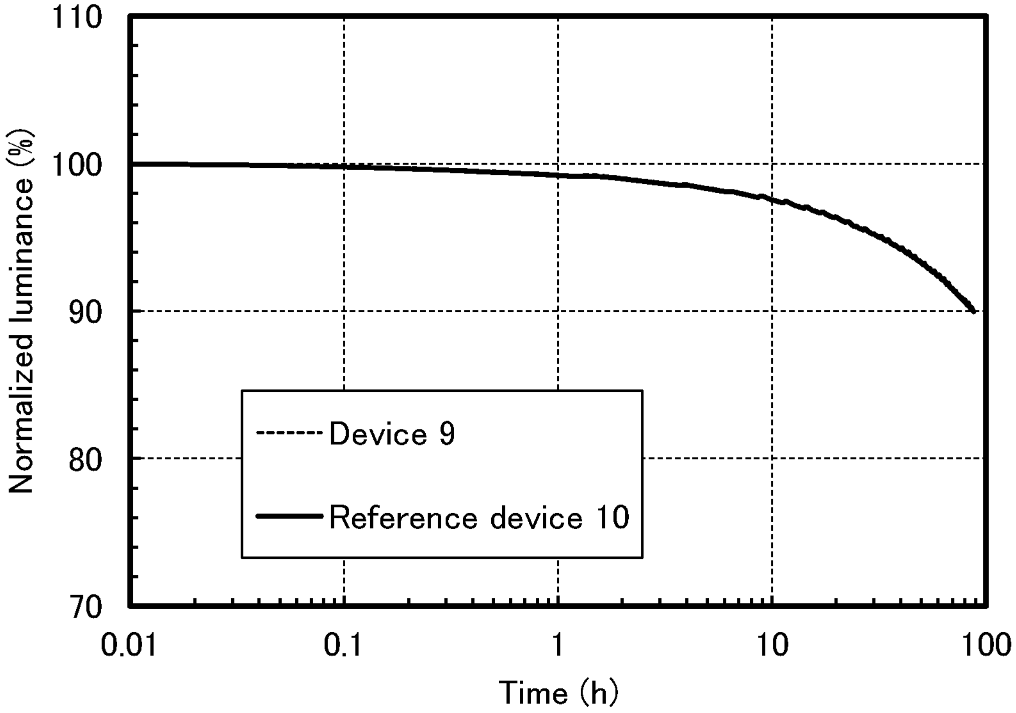
FIG. 49 shows the reliability of the light-emitting device 9 and the reference light-emitting device 10.

Next, reliability tests were performed on the light-emitting device 9 and the reference light-emitting device 10. FIG. 49 shows results of the reliability tests. In FIG. 49, the vertical axis represents normalized luminance (%) with an initial luminance of 100%, and the horizontal axis represents driving time (h) of the devices. As the reliability tests, constant current density driving tests for measuring a luminance change at a constant current density of 50 mA/$cm^2$ were performed at room temperature. As shown in the results in FIG. 49, the light-emitting device 9, in which $N_2$ exposure was performed after the formation of the electron-transport layer 914-2, shows substantially the same high reliability as that of the reference light-emitting device 10, in which exposure to a nitrogen atmosphere ($N_2$ exposure treatment) was never performed in the fabrication process. Thus, it is found that in the formation of the EL layer in the green phosphorescent device, $N_2$ exposure is less likely to affect the reliability of the light-emitting device as long as it is performed after the formation of the functional layer such as the electron-transport layer 914. This result reveals that air exposure, patterning using a photolithography method, and the like can be performed after the formation of the functional layer such as the electron-transport layer 914. In other words, in fabrication of a plurality of light-emitting devices, patterning using a photolithography method or the like can be performed after the formation of the functional layer such as the electron-transport layer 914, and the functional layer formed subsequently can be formed using a layer shared by the plurality of light-emitting devices; hence, the fabrication process can be simplified.

Example 5

This example will describe a device structure, a fabrication method, and characteristics of a light-emitting device 11 and a light-emitting device 12 each of which is a red phosphorescent device fabricated as the light-emitting device of one embodiment of the present invention. In the light-emitting device 11, patterning using a photolithography method was performed after the formation of the electron-transport layer 914-2, and then the electron-injection layer 915, the second electrode 903, and the cap layer 904 were sequentially formed. In the light-emitting device 12, patterning using a photolithography method was performed after the formation of the electron-transport layer 914-2, and then an insulating film that protects the side surfaces (or end portions) of the hole-injection layer 911, the hole-transport layer 912, the light-emitting layer 913, the electron-transport layer 914-1, and the electron-transport layer 914-2 was formed, as in the light-emitting device 100 described with reference to FIG. 1B in Embodiment 1. Note that for comparison of device characteristics, a reference light-emitting device 13 was fabricated without patterning using a photolithography method. FIG. 23 illustrates a device structure of the light-emitting devices used in this example, and Table 5 shows specific structures. The chemical formulae of materials used in this example are shown below.

[Chemical Formula 7]

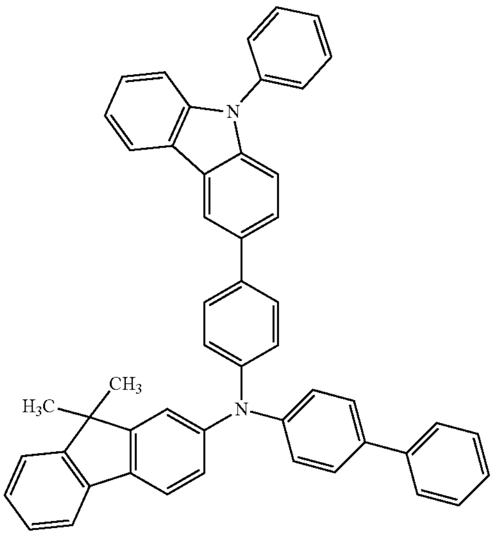

PCBBiF

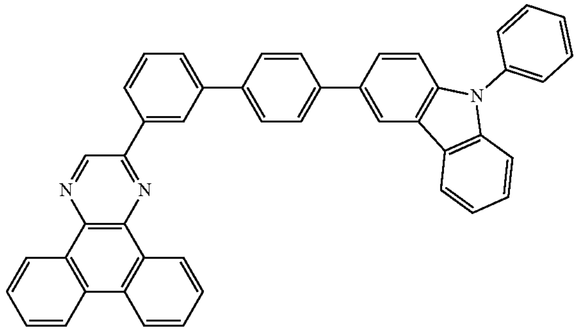

2mpPCBPDBq

-continued

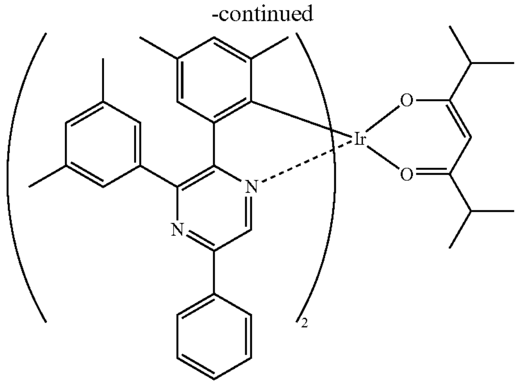

Ir(dmdppr-P)$_2$(dibm)

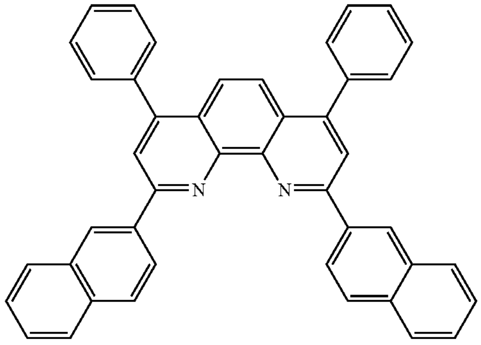

NBphen

In Chemical Formula above, 2-[4'-(9-phenyl-9H-carbazol-3-yl)-3,1'-biphenyl-1-yl]dibenzo[f,h]quinoxaline (abbreviation: 2mpPCBPDBq) and bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: Ir(dmdppr-P)$_2$(dibm)) are shown.

<<Operating Characteristics of Light-Emitting Devices>>

Figure 50:
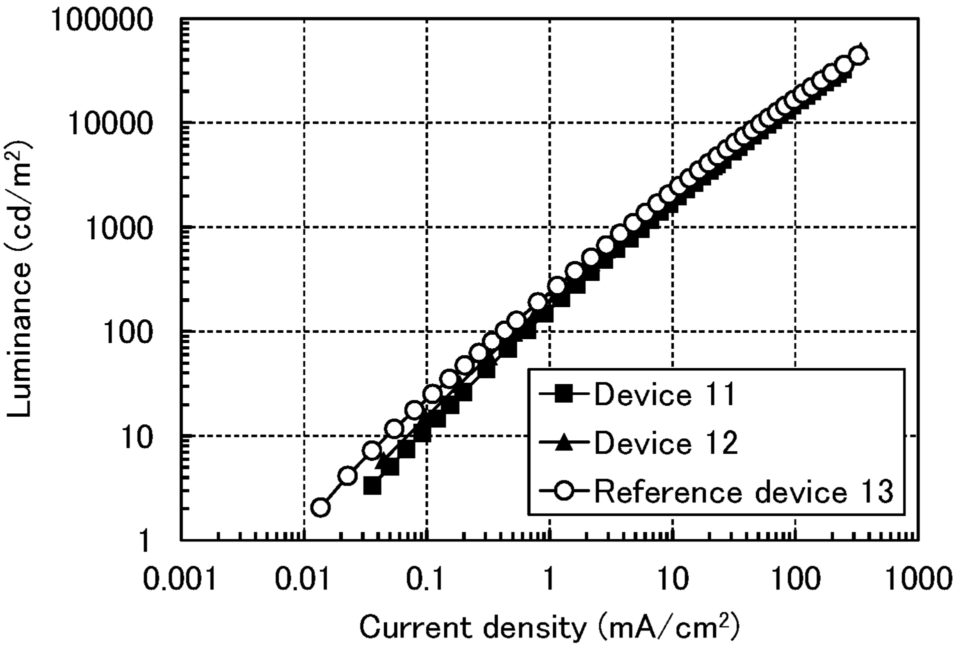
FIG. 50 shows the luminance-current density characteristics of light-emitting devices 11 and 12 and a reference light-emitting device 13.
Figure 51:
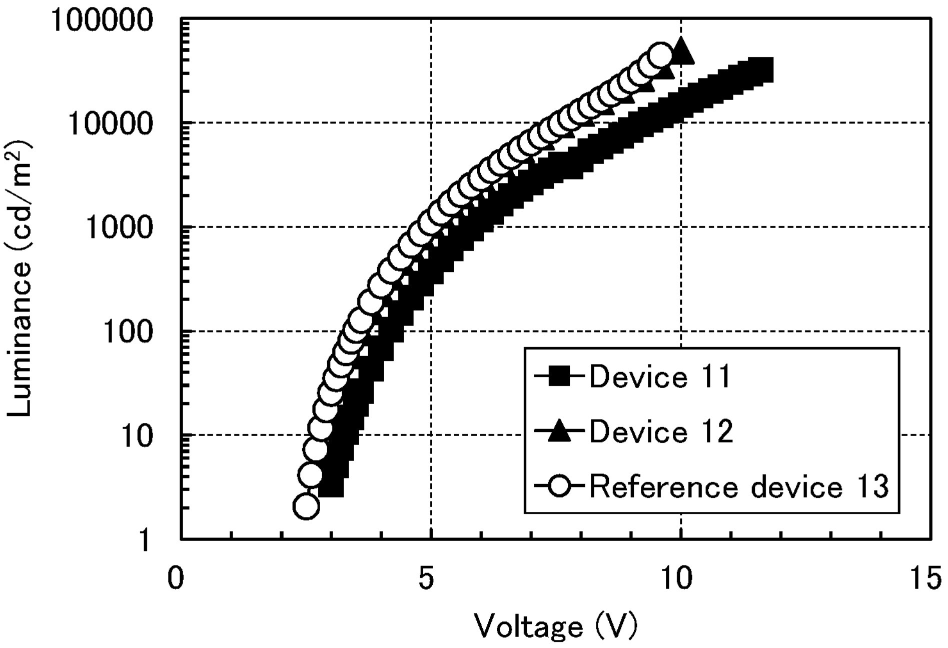
FIG. 51 shows the luminance-voltage characteristics of the light-emitting devices 11 and 12 and the reference light-emitting device 13.
Figure 52:
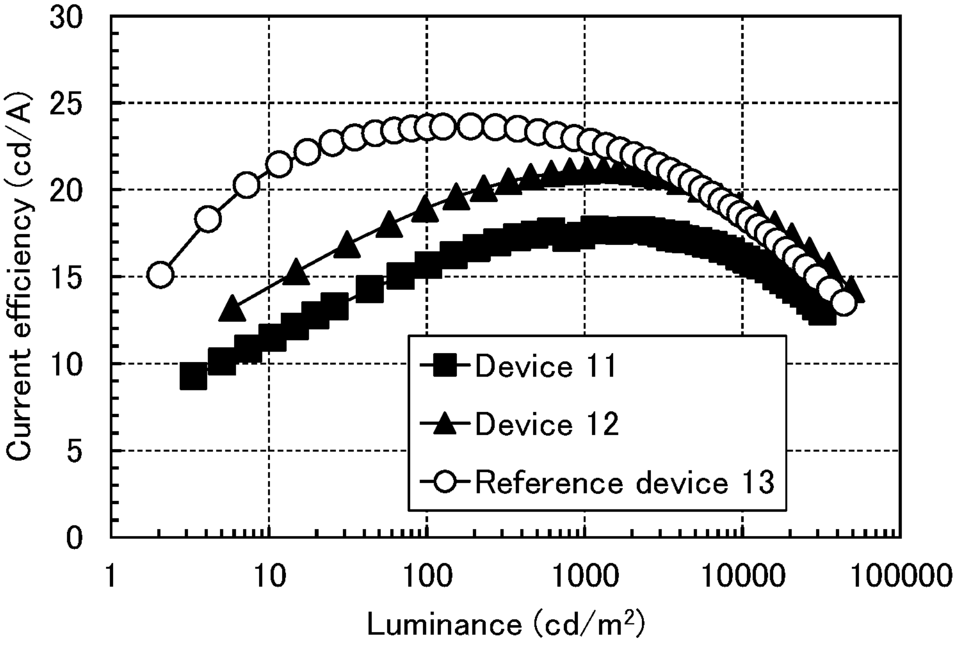
FIG. 52 shows the current efficiency-luminance characteristics of the light-emitting devices 11 and 12 and the reference light-emitting device 13.
Figure 53:
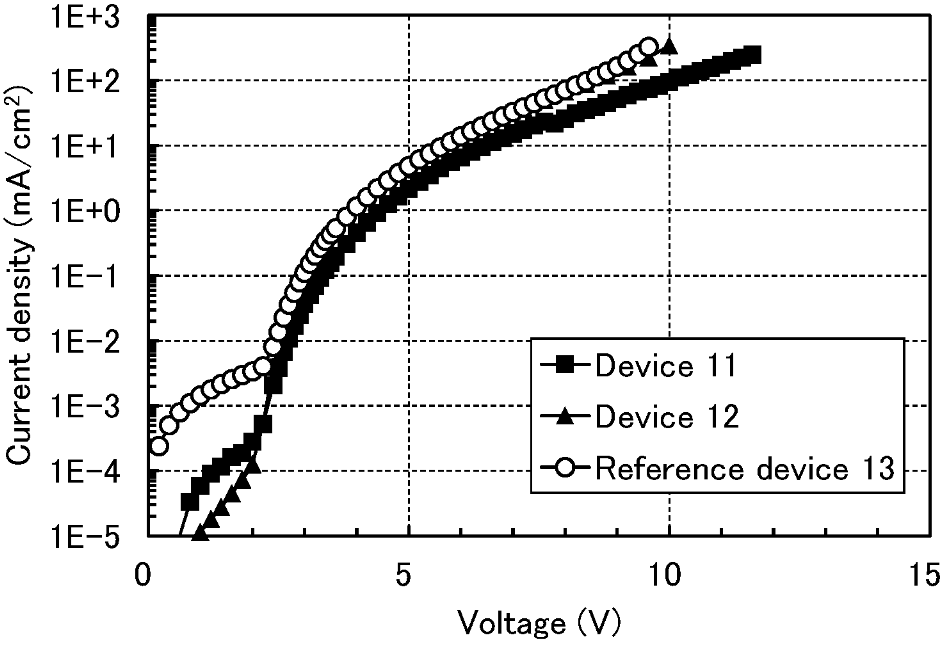
FIG. 53 shows the current density-voltage characteristics of the light-emitting devices 11 and 12 and the reference light-emitting device 13.
Figure 54:
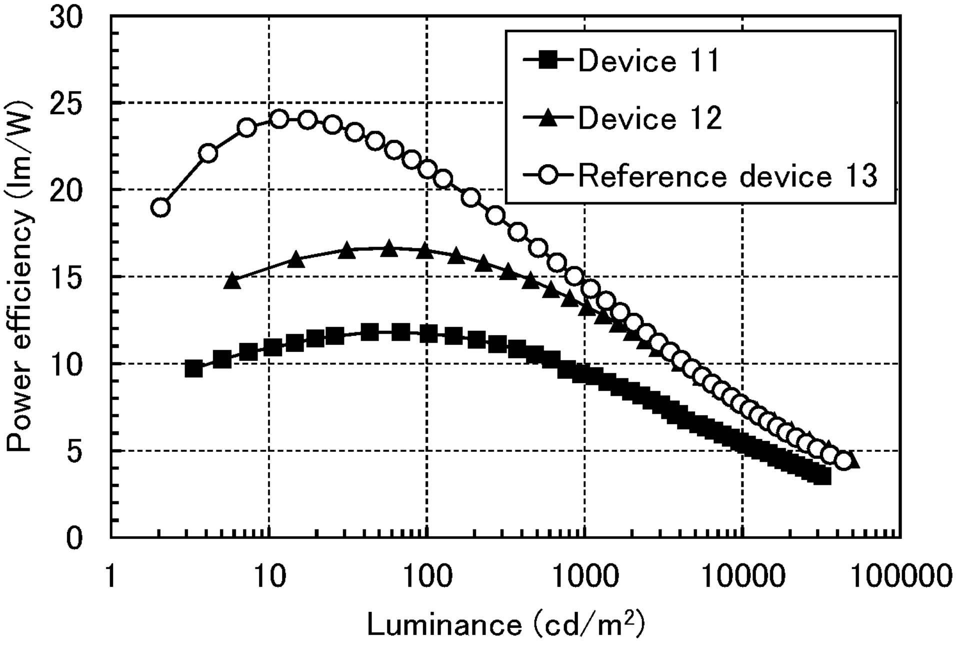
FIG. 54 shows the power efficiency-luminance characteristics of the light-emitting devices 11 and 12 and the reference light-emitting device 13.
Figure 55:
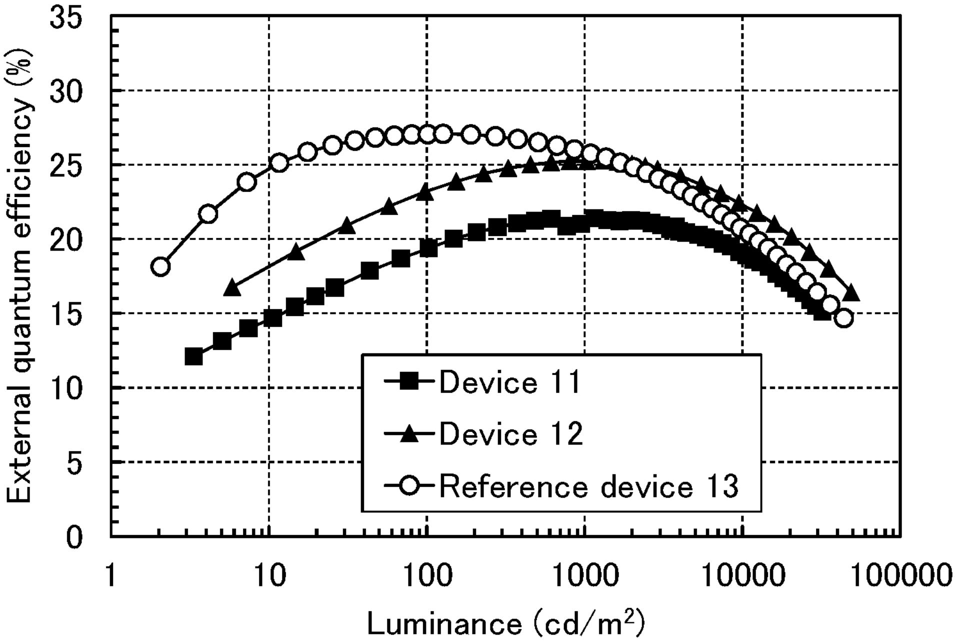
FIG. 55 shows the external quantum efficiency-luminance characteristics of the light-emitting devices 11 and 12 and the reference light-emitting device 13.

The operating characteristics of the fabricated light-emitting devices were measured. Note that the measurement was performed at room temperature. As the results of measuring the operating characteristics of the light-emitting devices, FIG. 50 shows luminance-current density characteristics, FIG. 51 shows luminance-voltage characteristics, FIG. 52 shows current efficiency-luminance characteristics, FIG. 53 shows current density-voltage characteristics, FIG. 54 shows power efficiency-luminance characteristics, and FIG. 55 shows external quantum efficiency-luminance characteristics. Luminance, CIE chromaticity, and emission spectra were measured at normal temperature with a spectroradiometer (SR-UL1R manufactured by TOPCON TECHNOHOUSE CORPORATION).

The above results reveal that the light-emitting device 11 and the light-emitting device 12, in each of which patterning using a photolithography method was performed, have favorable initial characteristics.

In the luminance-voltage characteristics shown in FIG. 51, the voltage of the light-emitting device 11 increases compared to that of the reference light-emitting device 13, whereas the voltage of the light-emitting device 12 is equivalent to that of the reference light-emitting device 13. This demonstrates that an increase in voltage of the light-emitting device can be suppressed by the formation of the insulating film that protects the side surfaces (or end portions) of the hole-injection layer 911, the hole-transport layer 912, the light-emitting layer 913, the electron-transport layer 914-1, and the electron-transport layer 914-2 after patterning using a photolithography method.

Figure 56:
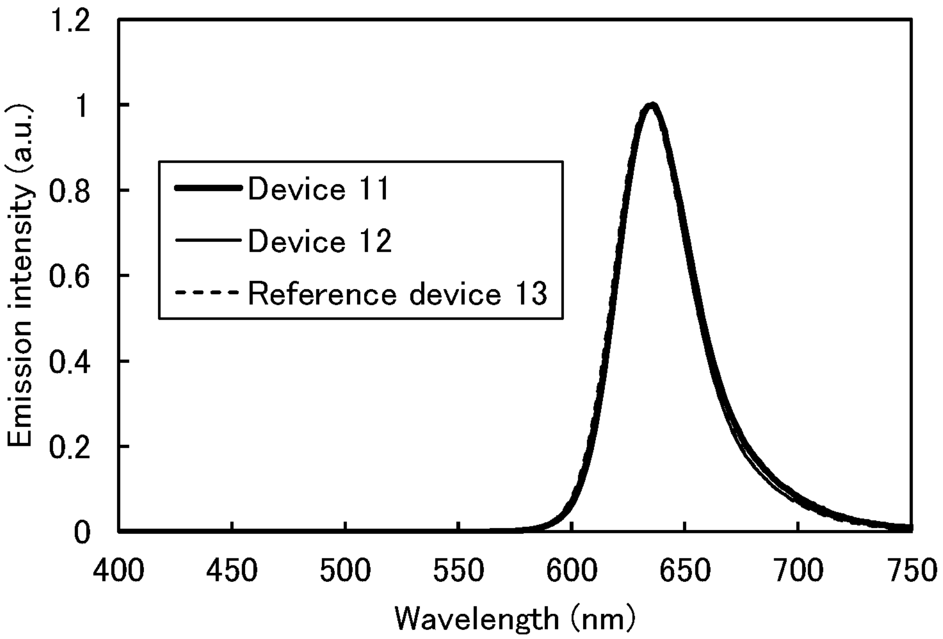
FIG. 56 shows the emission spectra of the light-emitting devices 11 and 12 and the reference light-emitting device 13.

FIG. 56 shows emission spectra when current flowed at a current density (10 to mA/$cm^2$) with which the light-emitting devices emitted light at a luminance of approximately 1000 cd/$m^2$. As shown in FIG. 56, the emission spectra of these light-emitting devices have a peak at around 635 nm, which is presumably derived from light emission of Ir(dmdppr-P)$_2$(dibm), the red phosphorescent dopant, contained in the light-emitting layer 913.

Figure 57:
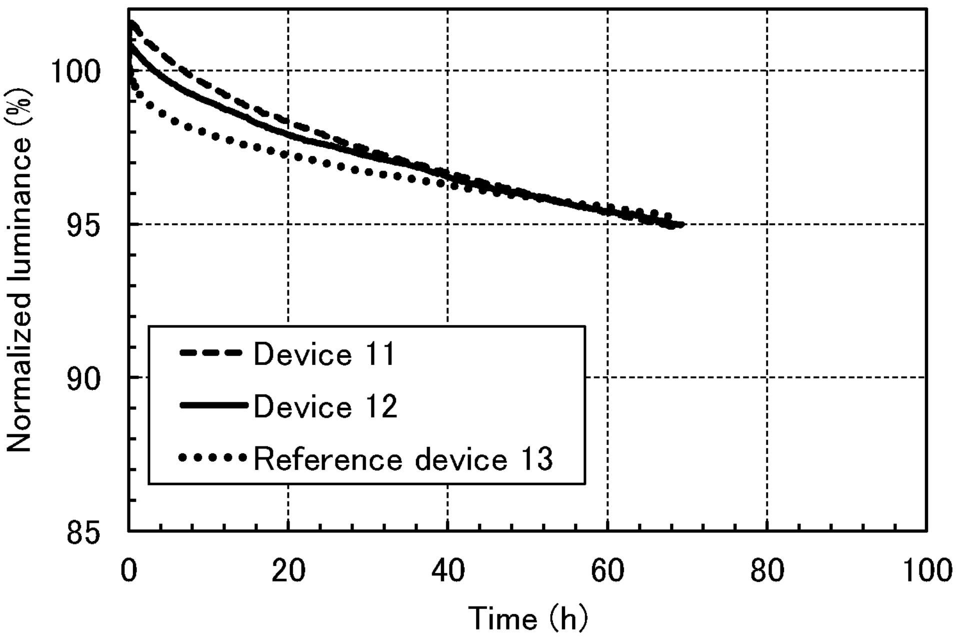
FIG. 57 shows the reliability of the light-emitting devices 11 and 12 and the reference light-emitting device 13.

Next, reliability tests were performed on the light-emitting devices 11 and 12 and the reference light-emitting device 13. FIG. 57 shows results of the reliability tests. In FIG. 57, the vertical axis represents normalized luminance (%) with an initial luminance of 100%, and the horizontal axis represents driving time (h) of the devices. As the reliability tests, constant current density driving tests for measuring a luminance change at a constant current density of 50 mA/$cm^2$ were performed at room temperature.

From the results shown in FIG. 57, the reliability of the light-emitting device 11 and the light-emitting device 12 is not much different from that of the reference light-emitting device 13. Thus, it is found that in the formation of the EL layer in the light-emitting device, patterning using a photolithography method is less likely to affect the reliability of the light-emitting device as long as it is performed after the formation of the functional layer such as the electron-transport layer 914. In other words, in fabrication of a plurality of light-emitting devices, patterning using a photolithography method or the like can be performed after the formation of the functional layer such as the electron-transport layer 914, and the functional layer formed subsequently can be formed using a layer shared by the plurality of light-emitting devices; thus, the fabrication process can be simplified.

This application is based on Japanese Patent Application Serial No. 2020-219886 filed with Japan Patent Office on Dec. 29, 2020, and Japanese Patent Application Serial No. 2021-188595 filed with Japan Patent Office on Nov. 19, 2021, the entire contents of which are hereby incorporated by reference.

What is claimed is:

1. A light-emitting device comprising:

a second electrode over a first electrode with an EL layer therebetween, wherein the EL layer comprises a light-emitting layer, an electron-transport layer, and an electron-injection layer, wherein the electron-transport layer is over the light-emitting layer, wherein a side surface of an insulating layer is in contact with the light-emitting layer and the electron-transport layer, wherein the electron-injection layer is over the electron-transport layer and the insulating layer, and wherein the electron-injection layer is in contact with the electron-transport layer and the insulating layer.

2. The light-emitting device according to claim 1, wherein the electron-injection layer comprises a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

3. A light-emitting apparatus comprising:

the light-emitting device according to claim 1; and at least one of a transistor and a substrate.

4. An electronic device comprising:

the light-emitting apparatus according to claim 3; and at least one of a sensor, an operation button, a speaker, and a microphone.

5. A lighting device comprising:

the light-emitting apparatus according to claim 3; and a housing.

6. A light-emitting device according to claim 1, wherein the insulating layer comprises at least one of aluminum oxide, magnesium oxide, hafnium oxide, gallium oxide, indium gallium zinc oxide, silicon nitride, and silicon nitride oxide.

7. A light-emitting device comprising:

a second electrode over a first electrode with an EL layer therebetween, wherein the EL layer comprises a hole-injection layer, a light-emitting layer, an electron-transport layer, and an electron-injection layer, wherein the hole-injection layer is over the first electrode, wherein the light-emitting layer is over the hole-injection layer, wherein the electron-transport layer is over the light-emitting layer, wherein a side surface of an insulating layer is in contact with the hole-injection layer, the light-emitting layer, and the electron-transport layer, wherein the electron-injection layer is over the electron-transport layer and the insulating layer, and wherein the electron-injection layer is in contact with the electron-transport layer and the insulating layer.

8. The light-emitting device according to claim 7, wherein the electron-injection layer comprises a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

9. A light-emitting apparatus comprising:

the light-emitting device according to claim 7; and at least one of a transistor and a substrate.

10. An electronic device comprising:

the light-emitting apparatus according to claim 9; and at least one of a sensor, an operation button, a speaker, and a microphone.

11. A lighting device comprising:

the light-emitting apparatus according to claim 9; and a housing.

12. A light-emitting device according to claim 7, wherein the insulating layer comprises at least one of aluminum oxide, magnesium oxide, hafnium oxide, gallium oxide, indium gallium zinc oxide, silicon nitride, and silicon nitride oxide.

13. A light-emitting apparatus comprising a first light-emitting device and a second light-emitting device adjacent to each other, wherein the first light-emitting device comprises a second electrode over a first electrode with a first EL layer therebetween, wherein the first EL layer comprises a first light-emitting layer, a first electron-transport layer, and an electron-injection layer, wherein the first electron-transport layer is over the first light-emitting layer, wherein a first insulating layer is in contact with side surfaces of the first light-emitting layer and the first electron-transport layer, wherein the electron-injection layer is over the first electron-transport layer, wherein the second light-emitting device comprises the second electrode over a third electrode with a second EL layer therebetween, wherein the second EL layer comprises a second light-emitting layer, a second electron-transport layer, and the electron-injection layer, wherein the second electron-transport layer is over the second light-emitting layer, wherein a second insulating layer is in contact with side surfaces of the second light-emitting layer and the second electron-transport layer, wherein the electron-injection layer is over the first electron-transport layer and the second electron-transport layer, and wherein the electron-injection layer is in contact with the first electron-transport layer, the second electron-transport layer, the first insulating layer, and the second insulating layer.

14. The light-emitting apparatus according to claim 13, wherein the second electrode is positioned on the side surfaces of the first light-emitting layer and the second light-emitting layer with the electron-injection layer therebetween.

15. The light-emitting apparatus according to claim 13, wherein the second electrode is positioned on the side surfaces of the first electron-transport layer, the second electron-transport layer, the first light-emitting layer, and the second light-emitting layer with the electron-injection layer therebetween.

16. The light-emitting apparatus according to claim 13, wherein the electron-injection layer comprises a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

17. An electronic device comprising:

the light-emitting apparatus according to claim 13; and at least one of a sensor, an operation button, a speaker, and a microphone.

18. A lighting device comprising:

the light-emitting apparatus according to claim 13; and a housing.

19. A light-emitting apparatus comprising a first light-emitting device and a second light-emitting device adjacent to each other, wherein the first light-emitting device comprises a second electrode over a first electrode with a first EL layer therebetween, wherein the first EL layer comprises a first hole-injection layer, a first light-emitting layer, a first electron-transport layer, and an electron-injection layer, wherein the first hole-injection layer is over the first electrode, wherein the first light-emitting layer is over the first hole-injection layer, wherein the first electron-transport layer is over the first light-emitting layer, wherein a first insulating layer is in contact with side surfaces of the first hole-injection layer, the first light-emitting layer, and the first electron-transport layer, wherein the electron-injection layer is over the first electron-transport layer, wherein the second light-emitting device comprises the second electrode over a third electrode with a second EL layer therebetween, wherein the second EL layer comprises a second hole-injection layer, a second light-emitting layer, a second electron-transport layer, and the electron-injection layer, wherein the second hole-injection layer is over the third electrode, wherein the second light-emitting layer is over the second hole-injection layer, wherein the second electron-transport layer is over the second light-emitting layer, wherein a second insulating layer is in contact with side surfaces of the second hole-injection layer, the second light-emitting layer, and the second electron-transport layer, wherein the electron-injection layer is over the first electron-transport layer and the second electron-transport layer, and wherein the electron-injection layer is in contact with the first electron-transport layer, the second electron-transport layer, the first insulating layer, and the second insulating layer.

20. The light-emitting apparatus according to claim 19, wherein the second electrode is positioned on the side surfaces of the first light-emitting layer and the second light-emitting layer with the electron-injection layer therebetween.

21. The light-emitting apparatus according to claim 19, wherein the second electrode is positioned on the side surfaces of the first electron-transport layer, the second electron-transport layer, the first light-emitting layer, and the second light-emitting layer with the electron-injection layer therebetween.

22. The light-emitting apparatus according to claim 19, wherein the electron-injection layer comprises a composite material in which an organic compound and an electron donor are mixed, or a composite material in which an organic compound and any of an alkali metal, an alkaline earth metal, a rare earth metal, and a metal that belongs to Group 5, Group 7, Group 9, Group 11, or Group 13 in the periodic table are mixed.

23. An electronic device comprising:

the light-emitting apparatus according to claim 19; and at least one of a sensor, an operation button, a speaker, and a microphone.

24. A lighting device comprising:

the light-emitting apparatus according to claim 19; and a housing.

* * * * *